United States Patent
Shih et al.

(10) Patent No.: US 11,930,628 B2
(45) Date of Patent: Mar. 12, 2024

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Yu-I Shih, Taichung (TW); Ren-Hua Guo, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/295,249

(22) Filed: Apr. 3, 2023

(65) Prior Publication Data

US 2023/0247818 A1    Aug. 3, 2023

Related U.S. Application Data

(63) Continuation of application No. 17/394,914, filed on Aug. 5, 2021, now Pat. No. 11,621,268, which is a continuation of application No. 16/259,824, filed on Jan. 28, 2019, now Pat. No. 11,088,150.

(51) Int. Cl.
| | | |
|---|---|---|
| *H10B 10/00* | (2023.01) | |
| *H01L 21/02* | (2006.01) | |
| *H01L 21/3065* | (2006.01) | |
| *H01L 21/8238* | (2006.01) | |
| *H01L 29/04* | (2006.01) | |
| *H01L 29/165* | (2006.01) | |
| *H01L 29/66* | (2006.01) | |
| *H01L 29/78* | (2006.01) | |

(52) U.S. Cl.
CPC ....... *H10B 10/12* (2023.02); *H01L 21/02293* (2013.01); *H01L 21/3065* (2013.01); *H01L 21/823821* (2013.01); *H01L 29/045* (2013.01); *H01L 29/165* (2013.01); *H01L 29/66795* (2013.01); *H01L 29/7853* (2013.01); *H01L 29/7854* (2013.01)

(58) Field of Classification Search
CPC .............. H10B 10/12; H01L 21/02293; H01L 21/3065; H01L 21/823821; H01L 29/045; H01L 29/165; H01L 29/66795; H01L 29/7854
See application file for complete search history.

(56) References Cited

U.S. PATENT DOCUMENTS

| | | |
|---|---|---|
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,418,897 B1 | 8/2016 | Ching et al. |

(Continued)

*Primary Examiner* — David Vu
*Assistant Examiner* — Brandon C Fox
(74) *Attorney, Agent, or Firm* — Maschoff Brennan

(57) ABSTRACT

A device includes a substrate, a pull-down transistor over the substrate, a pass-gate transistor over the substrate, and a pull-up transistor over the substrate. The pull-up transistor includes a first gate structure and first source/drain epitaxy structures on opposite sides of the first gate structure, in which each of the first source/drain epitaxy structures comprises a first epitaxy layer and a second epitaxy layer over the first epitaxy layer, wherein a germanium concentration of the first epitaxy layer is higher than a germanium concentration of the second epitaxy layer.

20 Claims, 76 Drawing Sheets

(56) References Cited

U.S. PATENT DOCUMENTS

| | | |
|---|---|---|
| 9,520,482 B1 | 12/2016 | Chang et al. |
| 9,576,814 B2 | 2/2017 | Wu et al. |
| 9,608,116 B2 | 3/2017 | Ching et al. |
| 9,793,404 B2 | 10/2017 | Sung et al. |
| 9,812,363 B1 | 11/2017 | Liao et al. |
| 9,859,380 B2 | 1/2018 | Lee et al. |
| 10,700,203 B2 | 6/2020 | Kim et al. |
| 2011/0210404 A1 | 9/2011 | Su et al. |
| 2011/0287600 A1 | 11/2011 | Cheng et al. |
| 2014/0252489 A1 | 9/2014 | Yu et al. |
| 2015/0333145 A1 | 11/2015 | Chudzik et al. |
| 2016/0013316 A1 | 1/2016 | Kuang et al. |
| 2016/0027918 A1 | 1/2016 | Kim et al. |
| 2017/0179275 A1 | 6/2017 | Li |
| 2017/0221892 A1 | 8/2017 | Li |
| 2018/0006039 A1 | 1/2018 | Lee et al. |
| 2019/0131434 A1* | 5/2019 | Lee .................. H01L 29/66636 |
| 2019/0148528 A1* | 5/2019 | Yu ....................... H01L 27/1211 |
| | | 257/288 |
| 2020/0027895 A1 | 1/2020 | Cho et al. |
| 2020/0176560 A1 | 6/2020 | Yu et al. |

\* cited by examiner

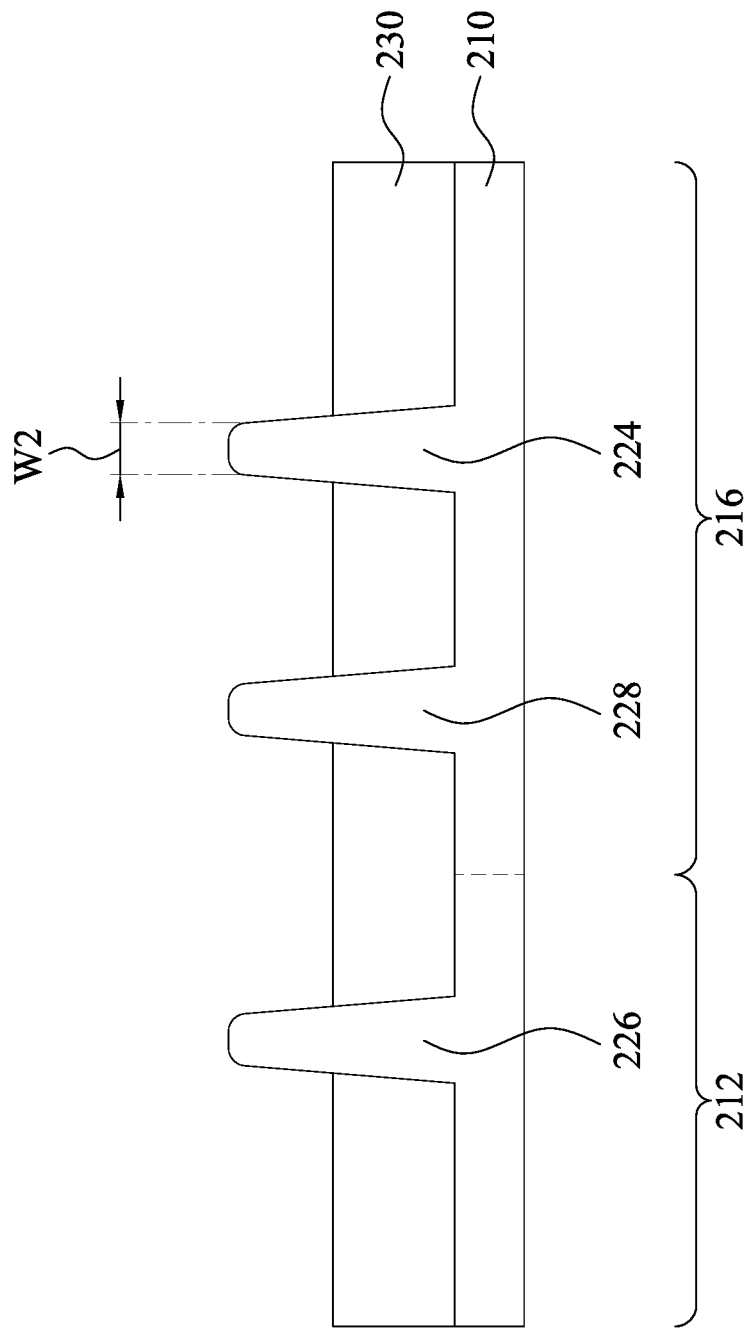

SEMICONDUCTOR DEVICE AND MANUFACTURING METHOD THEREOF

PRIORITY CLAIM AND CROSS-REFERENCE

This application is a Continuation application of U.S. patent application Ser. No. 17/394,914, filed Aug. 5, 2021, now U.S. Pat. No. 11,621,268, issued on Apr. 4, 2023, which is a Continuation application of U.S. patent application Ser. No. 16/259,824, filed Jan. 28, 2019, now U.S. Pat. No. 11,088,150, issued on Aug. 10, 2021, which are herein incorporated by references.

BACKGROUND

Static Random Access Memory (Static RAM or SRAM) is a semiconductor memory that retains data in a static form as long as the memory has power. SRAM is faster and more reliable than the more common dynamic RAM (DRAM). The term static is derived from the fact that it doesn't need to be refreshed like DRAM. SRAM is used for a computer's cache memory and as part of the random access memory digital-to-analog converter on a video card.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
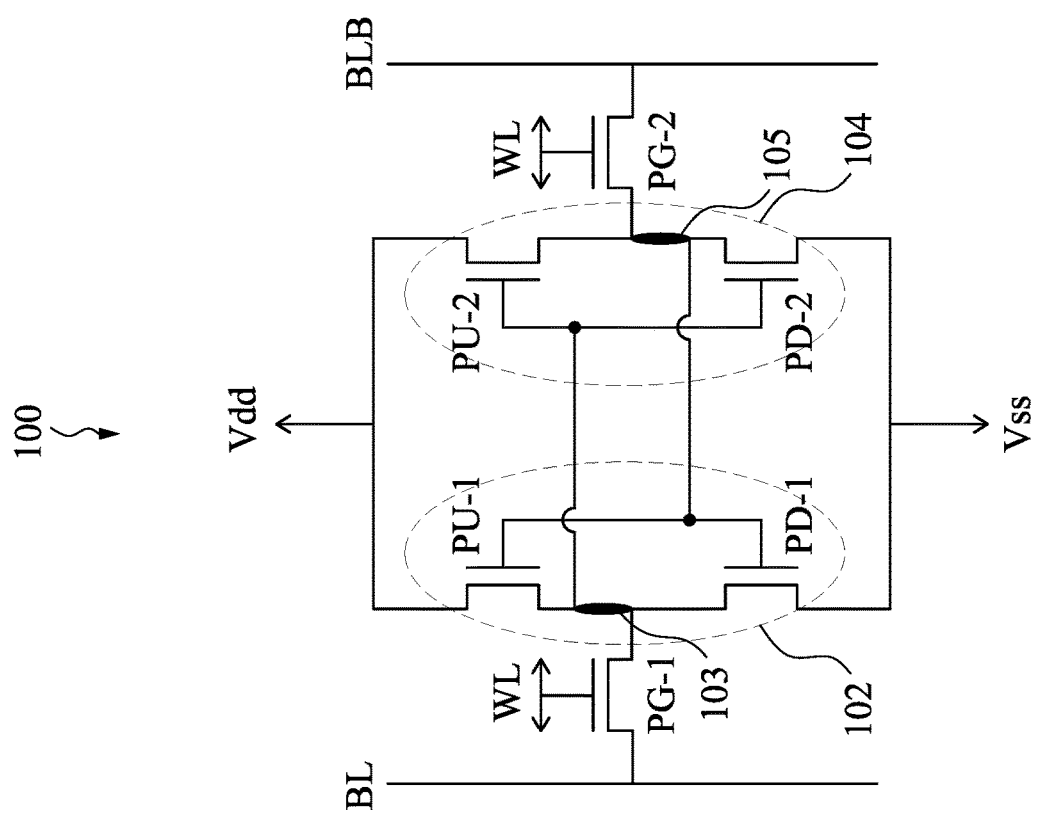
FIG. 1 is a circuit diagram of a six transistor (6T) SRAM cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, a static random-access memory (SRAM) formed of fin field effect transistors (Fin-FETs). The embodiments of the disclosure may also be applied, however, to a variety of semiconductor devices. Various embodiments will be explained in detail with reference to the accompanying drawings.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Static random-access memory (SRAM) is a type of volatile semiconductor memory that uses bistable latching circuitry to store each bit. Each bit in an SRAM is stored on four transistors (PU-1, PU-2, PD-1, and PD-2) that form two cross-coupled inverters. This memory cell has two stable states which are used to denote 0 and 1. Two additional access transistors (PG-1 and PG-2) are electrically connected to the two cross-coupled inventers and serve to control the access to a storage cell during read and write operations.

FIG. 1 is a circuit diagram of a six transistor (6T) SRAM cell. The SRAM cell 100 includes a first inverter 102 formed by a pull-up transistor PU-1 and a pull-down transistor PD-1. The SRAM cell 100 further includes a second inverter 104 formed by a pull-up transistor PU-2 and a pull-down transistor PD-2. Furthermore, both the first inverter 102 and second inverter 104 are coupled between a voltage bus Vdd and a ground potential Vss. In some embodiment, the pull-up transistor PU-1 and PU-2 can be p-type transistors while the pull-down transistors PD-1 and PD-2 can be n-type transistors, and the claimed scope of the present disclosure is not limited in this respect.

In FIG. 1, the first inverter 102 and the second inverter 104 are cross-coupled. That is, the first inverter 102 has an input connected to the output of the second inverter 104. Likewise, the second inverter 104 has an input connected to the output of the first inverter 102. The output of the first inverter 102 is referred to as a storage node 103. Likewise, the output of the second inverter 104 is referred to as a storage node 105. In a normal operating mode, the storage node 103 is in the opposite logic state as the storage node 105. By employing the two cross-coupled inverters, the SRAM cell 100 can hold the data using a latched structure so that the stored data will not be lost without applying a refresh cycle as long as power is supplied through Vdd.

In an SRAM device using the 6T SRAM cells, the cells are arranged in rows and columns. The columns of the SRAM array are formed by a bit line pairs, namely a first bit line BL and a second bit line BLB. The cells of the SRAM device are disposed between the respective bit line pairs. As shown in FIG. 1, the SRAM cell 100 is placed between the bit line BL and the bit line BLB.

In FIG. 1, the SRAM cell 100 further includes a first pass-gate transistor PG-1 connected between the bit line BL and the output 103 of the first inverter 102. The SRAM cell 100 further includes a second pass-gate transistor PG-2 connected between the bit line BLB and the output 105 of the second inverter 104. The gates of the first pass-gate transistor PG-1 and the second pass-gate transistor PG-2 are connected to a word line WL, which connects SRAM cells in a row of the SRAM array.

In operation, if the pass-gate transistors PG-1 and PG-2 are inactive, the SRAM cell 100 will maintain the complementary values at storage nodes 103 and 105 indefinitely as long as power is provided through Vdd. This is so because each inverter of the pair of cross coupled inverters drives the input of the other, thereby maintaining the voltages at the storage nodes. This situation will remain stable until the power is removed from the SRAM, or, a write cycle is performed changing the stored data at the storage nodes.

In the circuit diagram of FIG. 1, the pull-up transistors PU-1, PU-2 are p-type transistors. The pull-down transistors PD-1, PD-2, and the pass-gate transistors PG-1, PG-2 are n-type transistors. According to various embodiments, the pull-up transistors PU-1, PU-2, the pull-down transistors PD-1, PD-2, and the pass-gate transistors PG-1, PG-2 are implemented by FinFETs.

The structure of the SRAM cell 100 in FIG. 1 is described in the context of the 6T-SRAM. Features of the various embodiments described herein may be used for forming other types of devices, such as an 8T-SRAM memory device, or memory devices other than SRAMs, such as standard cell, gated diode or ESD (Electrostatic Discharge) devices. Furthermore, embodiments of the present disclosure may be used as stand-alone memory devices, memory devices integrated with other integrated circuitry, or the like.

FIGS. 2 to 27D illustrate a method for manufacturing a semiconductor device at various stages in accordance with some embodiments of the present disclosure.

Figure 2:
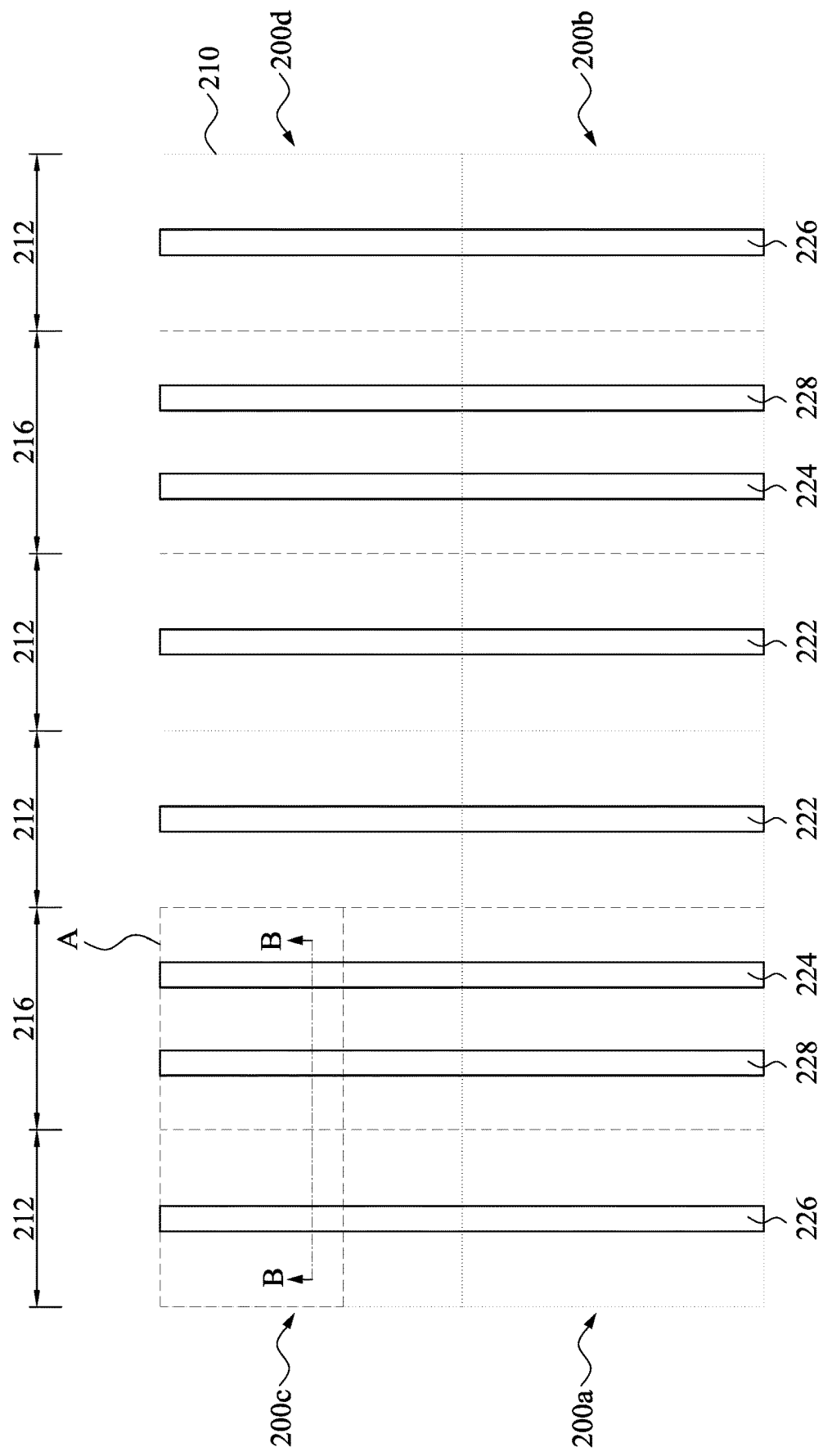
FIGS. 2 to 27D illustrate a method for manufacturing a semiconductor device at various stages in accordance with some embodiments of the present disclosure.
Figure 3A:
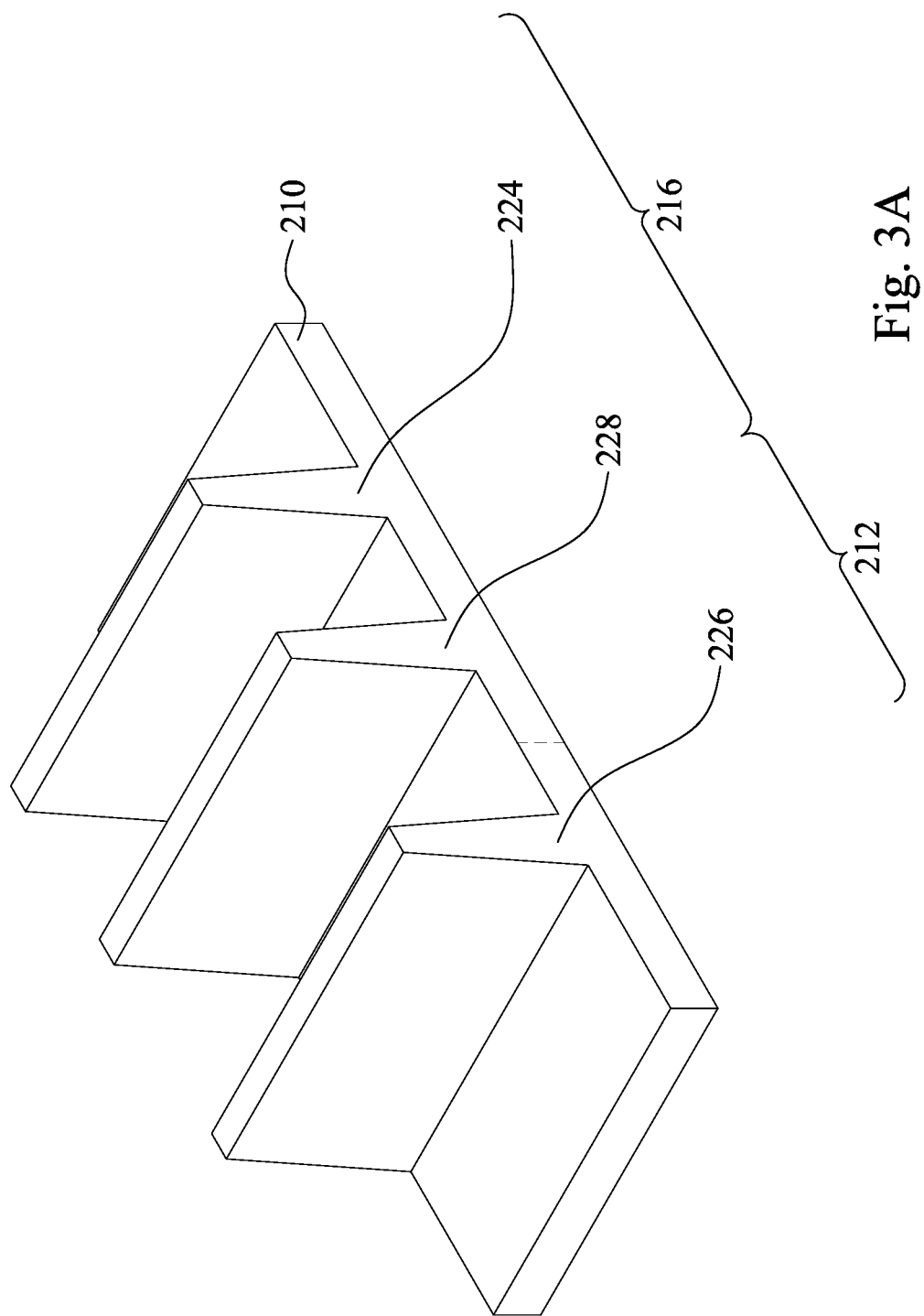
Figure 3B:
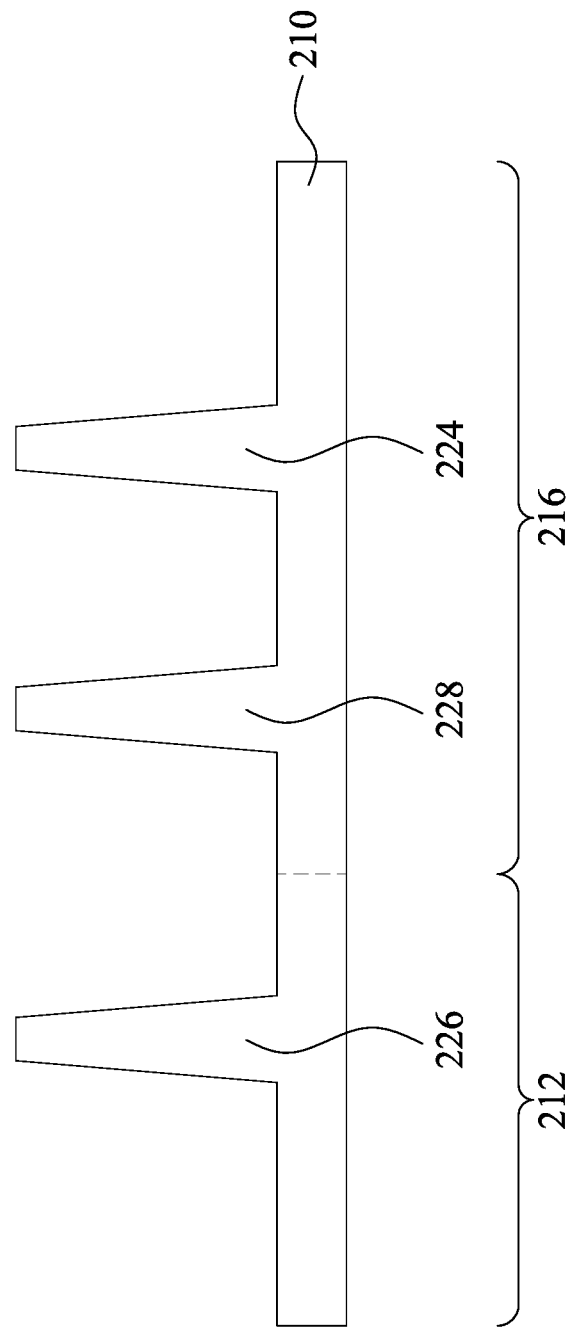

Reference is made to FIGS. 2, 3A, and 3B, in which FIG. 2 is a top view of an SRAM device, FIG. 3A is a perspective view of area A of FIG. 2, and FIG. 3B is a cross-sectional view along line B-B of FIG. 2. In FIG. 2, a SRAM device including four SRAM cells 200a, 200b, 200c, and 200d are illustrated. In some other embodiments, however, the number of the SRAM cells 200a, 200b, 200c, and 200d in the SRAM device is not limited in this respect. A substrate 210 is provided. In some embodiments, the substrate 210 may be a semiconductor substrate and may include a graded layer or a buried oxide, for example. In some embodiments, the substrate 210 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 210. Alternatively, the silicon substrate 210 may be an active layer of a semiconductor-on-insulator (SOI) substrate or a multi-layered structure such as a silicon-germanium layer formed on a bulk silicon layer. In some embodiments, the semiconductor material of the substrate 210 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A plurality of p-well regions 212 and a plurality of n-well regions 216 are formed in the substrate 210. One of the n-well regions 216 is formed between two of the p-well regions 212. The p-well regions 212 are implanted with P dopant material, such as boron ions, and the n-well regions 216 are implanted with N dopant material such as arsenic ions. During the implantation of the p-well regions 212, the n-well regions 216 are covered with masks (such as photoresist), and during implantation of the n-well regions 216, the p-well regions 212 are covered with masks (such as photoresist).

In FIG. 2, a plurality of semiconductor fins 222, 224, 226, and 228 are formed on the substrate 210. In greater detail, the semiconductor fins 222 and 226 are formed on the p-well regions 212, and the semiconductor fins 224 and 228 are formed on the n-well regions 216. The semiconductor fin 222 is adjacent to the semiconductor fin 224, and the semiconductor fin 226 is adjacent to the semiconductor fin 228. It is note that the number of the semiconductor fins 222, 224, 226, and 228 in FIG. 2 is illustrative, and should not limit the claimed scope of the present disclosure. A person having ordinary skill in the art may select suitable number for the semiconductor fins 222, 224, 226, and 228 according to actual situations. In some embodiments, the distance between the semiconductor fins 224 and 228 is shorter than the distance between the semiconductor fins 224 and 222 and the distance between the semiconductor fins 226 and 228. That is, the semiconductor fins 224 and 228 are formed in a pattern-dense region within the substrate 210, and the semiconductor fins 222 are formed in a pattern-sparse region within the substrate 210.

The semiconductor fins 222, 224, 226, and 228 may be formed, for example, by patterning and etching the substrate 210 using photolithography techniques. In some embodiments, a layer of photoresist material (not shown) is deposited over the substrate 210. The layer of photoresist material is irradiated (exposed) in accordance with a desired pattern (the semiconductor fins 222, 224, 226, and 228 in this case) and developed to remove a portion of the photoresist material. The remaining photoresist material protects the underlying material from subsequent processing steps, such as etching. It is noted that other masks, such as an oxide or silicon nitride mask, may also be used in the etching process. It is noted that FIGS. 3A and 3B only illustrate the semiconductor fins 224, 226, and 228.

Figure 4:
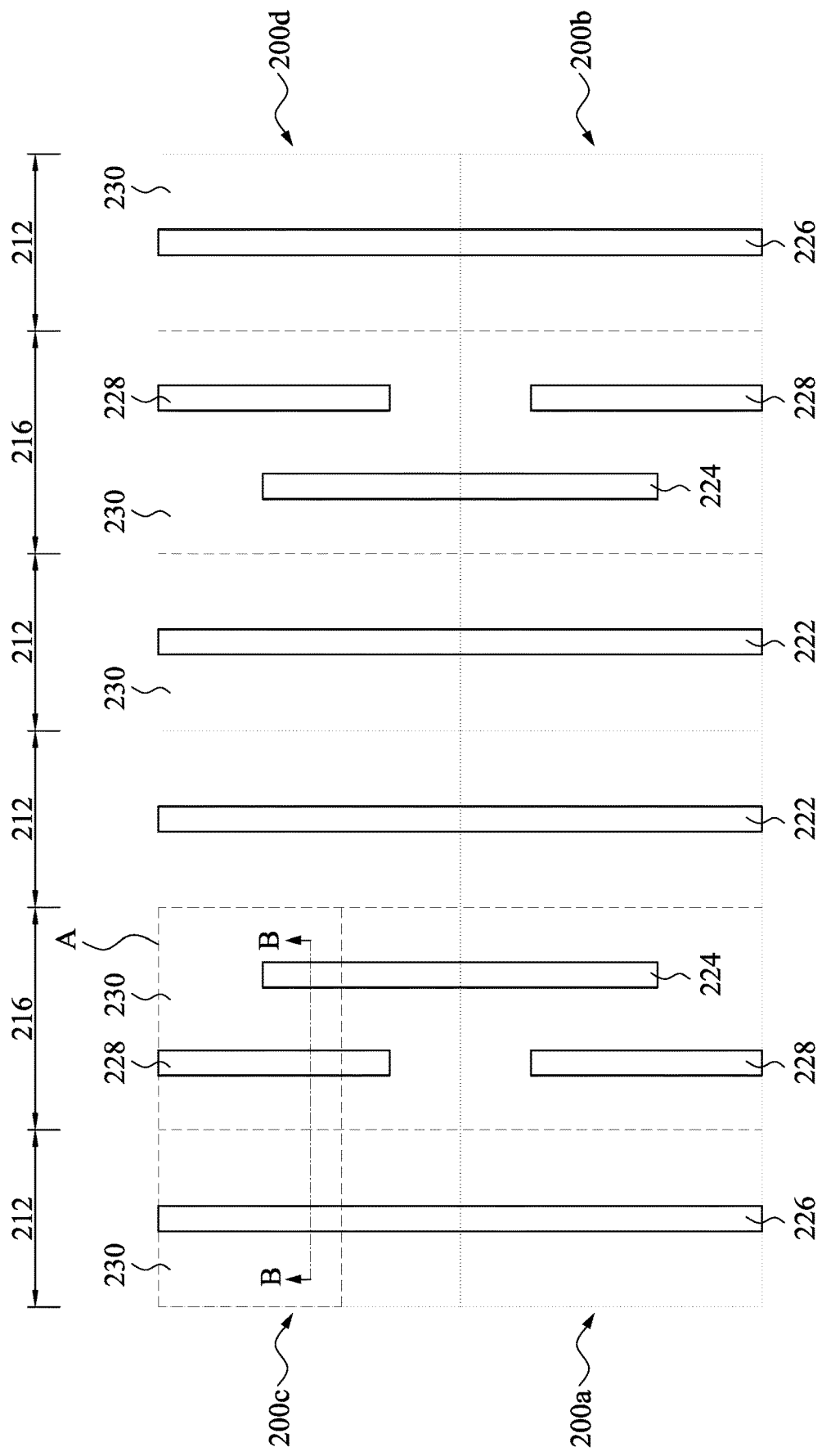
Figure 5A:
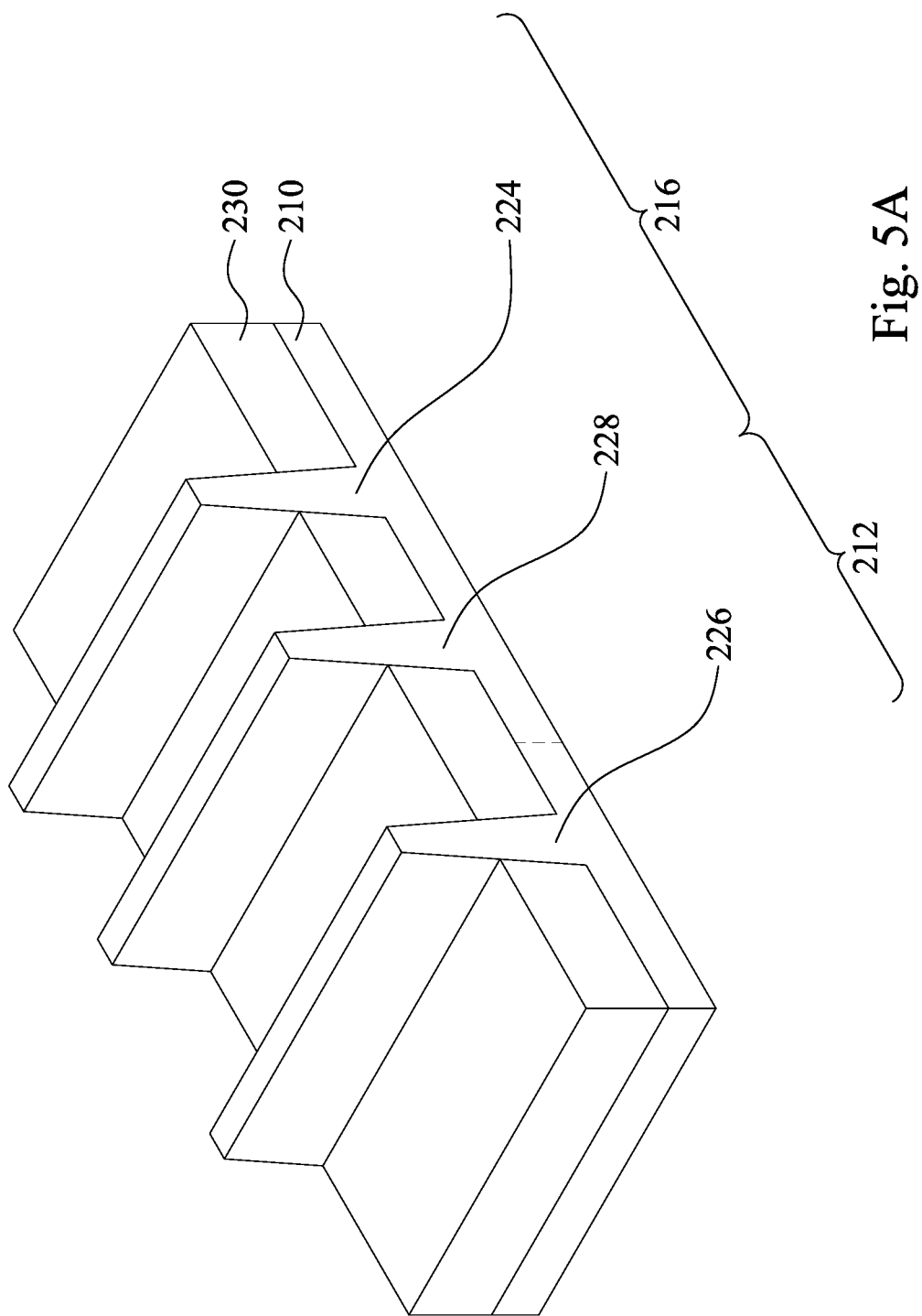
Figure 5B:
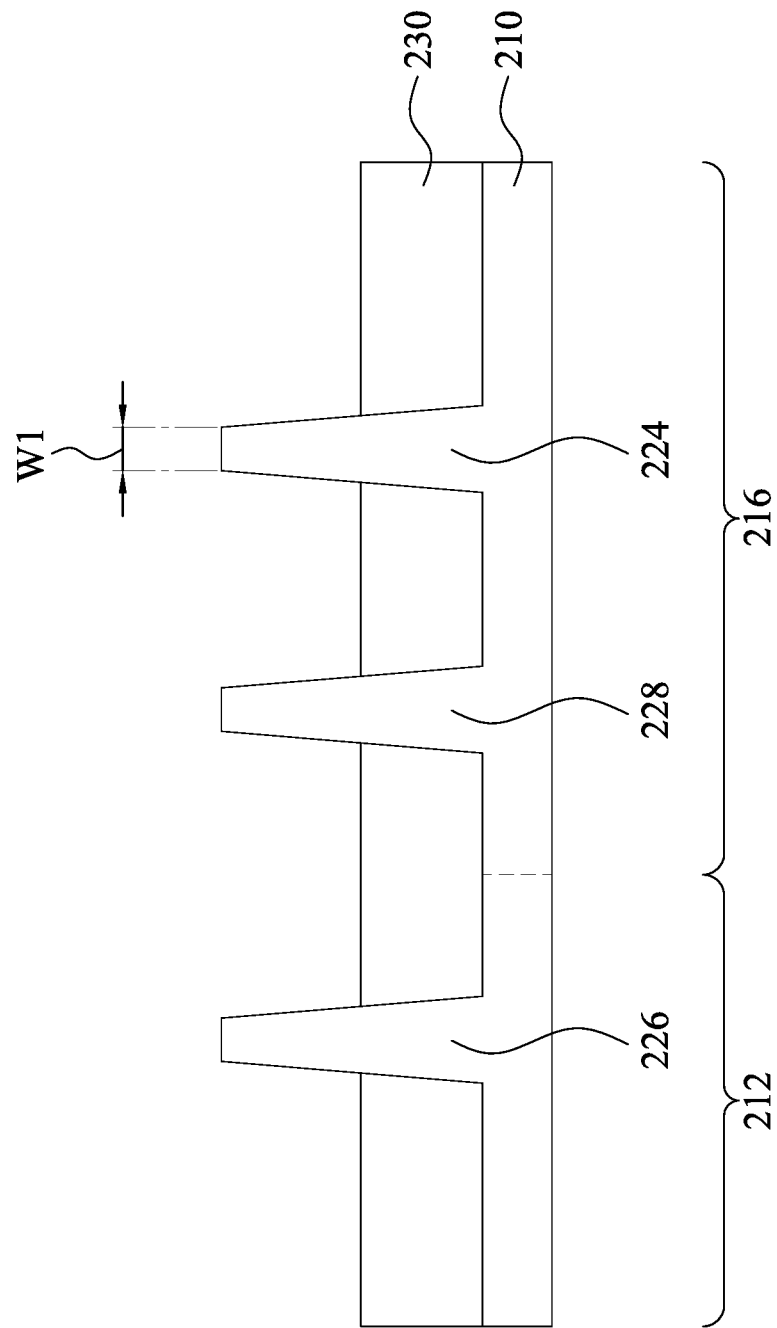

Reference is made to FIGS. 4, 5A and 5B, in which FIG. 4 is a top view of a SRAM device, FIG. 5A is a perspective view of area A of FIG. 4, and FIG. 5B is a cross-sectional view along line B-B of FIG. 4. As shown in FIG. 4, a portion of the semiconductor fins 224 and 228 are removed. For example, a photomask (not shown) containing patterns for both the semiconductor fins 224 and 228 are used to protect portions of the semiconductor fins 224 and 228 to be kept. Exposed portions of both the semiconductor fins 224 and 228 are then etched at the same time.

Subsequently, a plurality of isolation structures 230 are formed on the substrate 210. The isolation structures 230, which act as a shallow trench isolation (STI) around the semiconductor fins 222, 224, 226, and 228, may be formed. In some embodiments, the isolation structures 230 are made of silicon oxide, silicon nitride, silicon oxynitride, fluoride-doped silicate glass (FSG), or other low-K dielectric materials. In some embodiments, the isolation structures 230 may be formed using a high-density-plasma (HDP) chemical vapor deposition (CVD) process, using silane ($SiH_4$) and oxygen ($O_2$) as reacting precursors. In some other embodiments, the isolation structures 230 may be formed using a sub-atmospheric CVD (SACVD) process or high aspect-ratio process (HARP), wherein process gases may comprise tetraethylorthosilicate (TEOS) and ozone ($O_3$). In yet other embodiments, the isolation structures 230 may be formed using a spin-on-dielectric (SOD) process, such as hydrogen silsesquioxane (HSQ) or methyl silsesquioxane (MSQ). Other processes and materials may be used. In some embodiments, the isolation structures 230 can have a multi-layer structure, for example, a thermal oxide liner layer with silicon nitride formed over the liner. Thereafter, a thermal annealing may be optionally performed to the isolation structures 230.

Figure 6A:
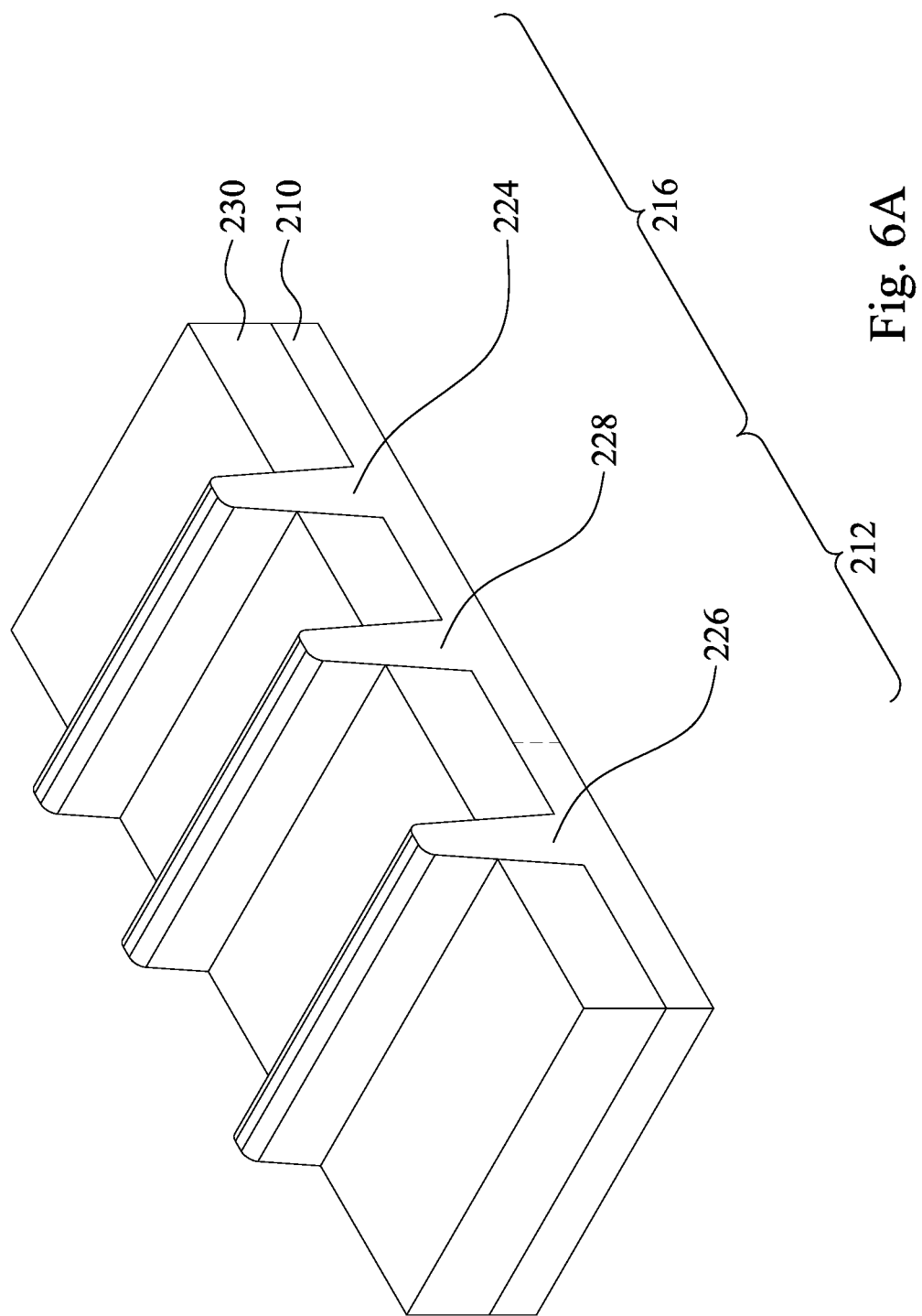

Reference is made to FIGS. 6A and 6B, in which FIG. 6A is a perspective view of the semiconductor device, and FIG. 6A is a cross-sectional view of the semiconductor device. Top corners of the semiconductor fins 224, 226, and 228 are rounded. In some embodiments, the semiconductor fins 224, 226, and 228 are reshaped from a first fin profile (e.g., square upper edges shown in FIGS. 5A and 5B) to a second fin profile (e.g., substantially round upper edges shown in FIGS. 6A and 6B) via a thermal hydrogen treatment. In some embodiments, the thermal hydrogen treatment is applied with a hydrogen content ambient such as a hydrogen gas ($H_2$). In some embodiments, the process of FIGS. 6A and 6B can be referred to as a top corner rounding process.

Referring back to FIG. 5B, before rounding top surfaces of the semiconductor fins 224, 226, and 228, each of them has a top surface having a width W1. Because the semiconductor fins 224, 226, and 228 have substantially an upwards tapered profile, and the thermal hydrogen treatment removes tips of the semiconductor fins 224-228, the widths of the semiconductor fins 224-228 after the thermal hydrogen treatment are larger than the respective widths of the semiconductor fins 224-228 before the thermal hydrogen treatment. For example, the top surfaces of the squared fins shown in FIG. 5B have a width W1, and the top surfaces of the rounded fins shown in FIG. 6B have a width W2, in which W2 is larger than W1. Stated another way, the top surfaces of the semiconductor fins 224, 226, and 228 after the thermal hydrogen treatment are enlarged as compared to the top surfaces of the semiconductor fins 224, 226, and 228 before the thermal hydrogen treatment.

Figure 7:
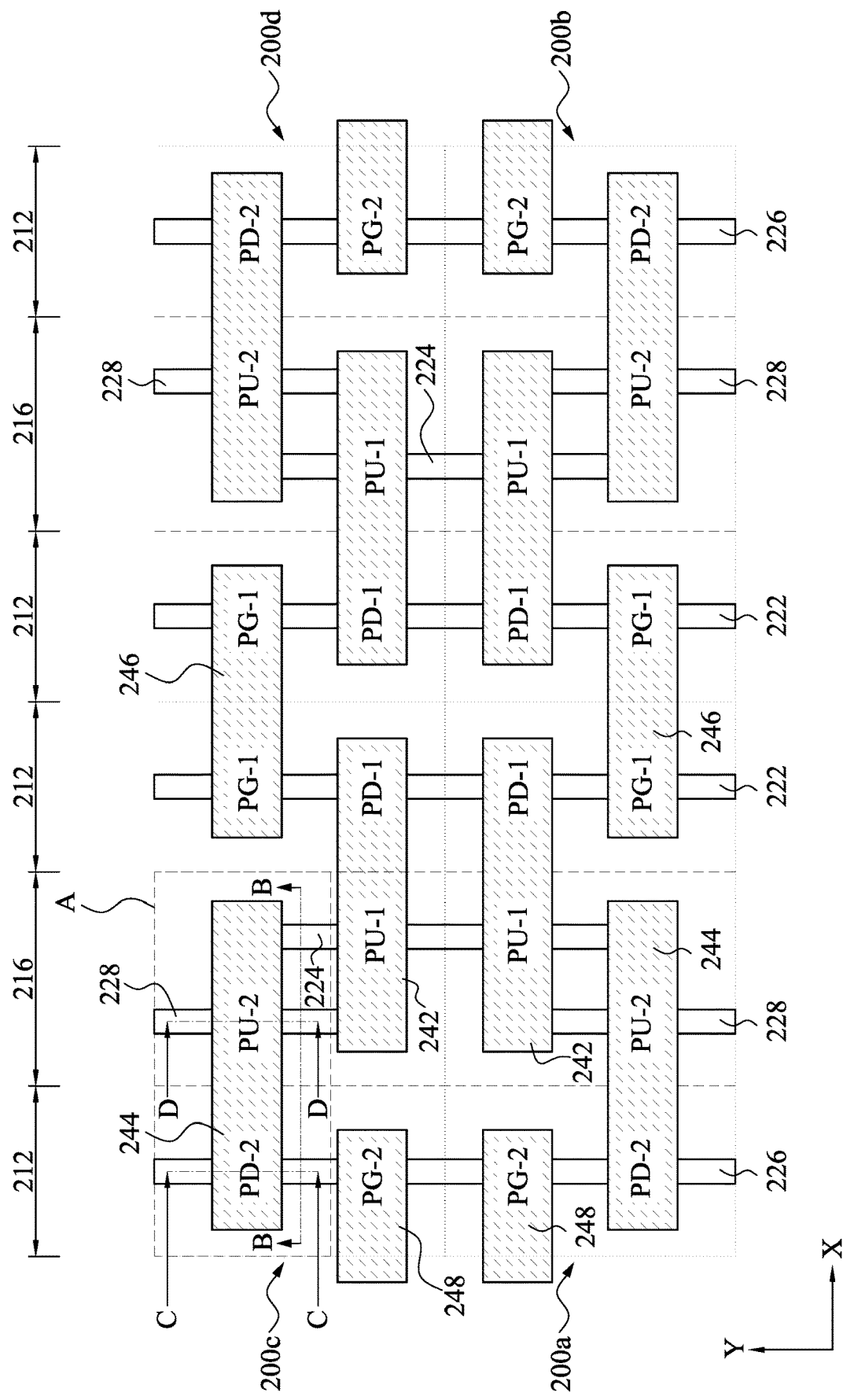
Figure 8A:
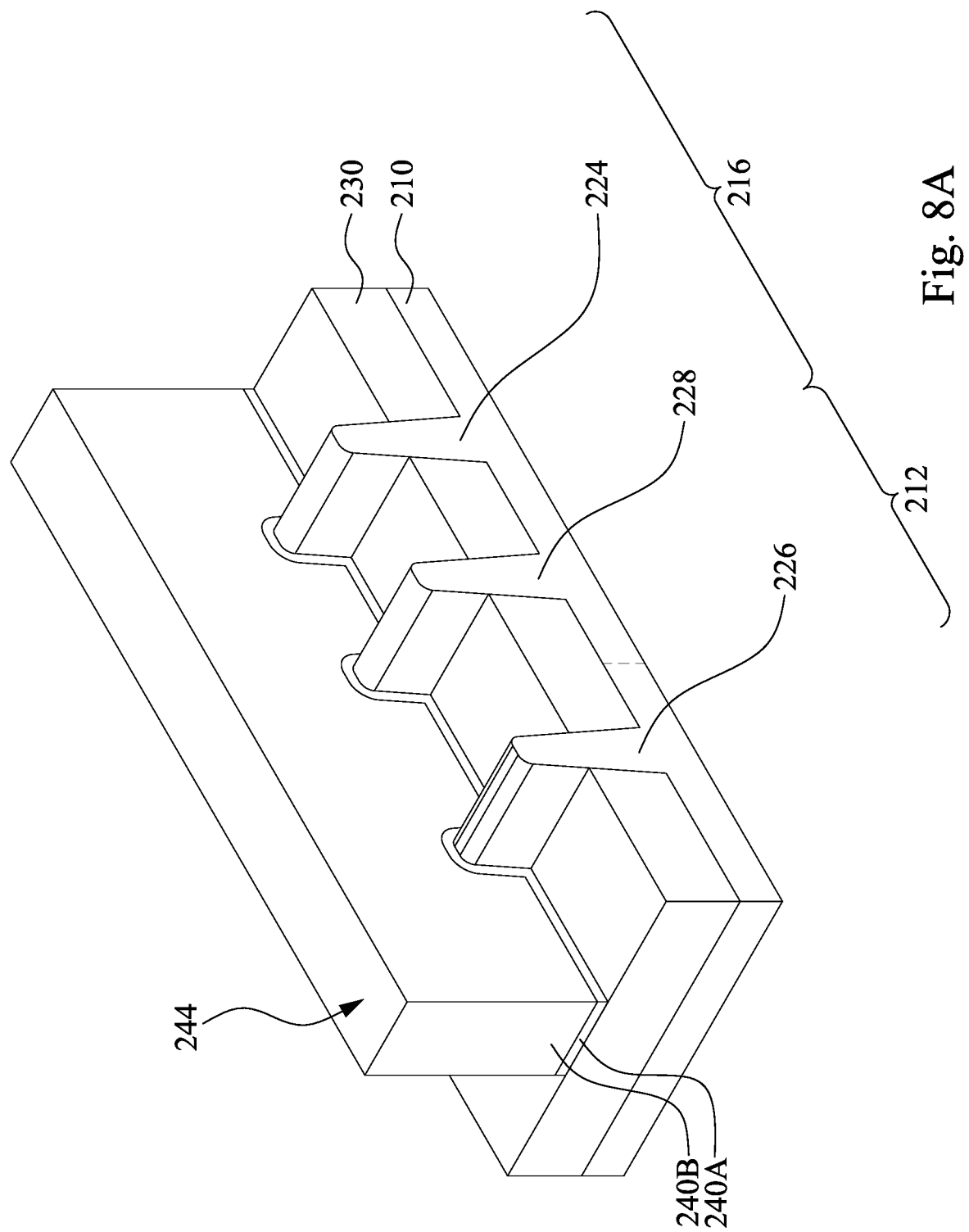
Figure 8B:
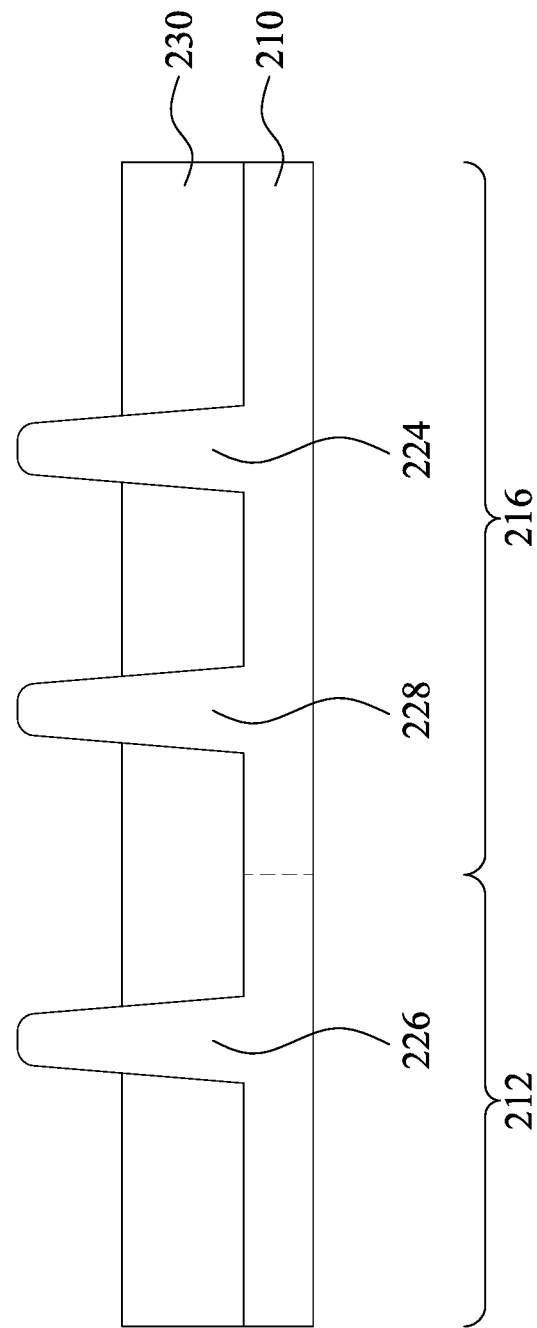
Figure 8D:
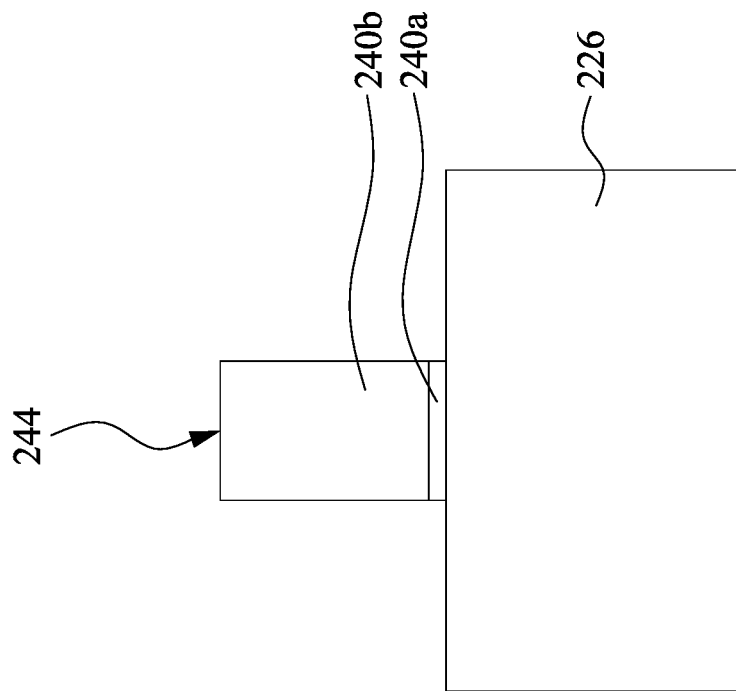
Figure 8C:
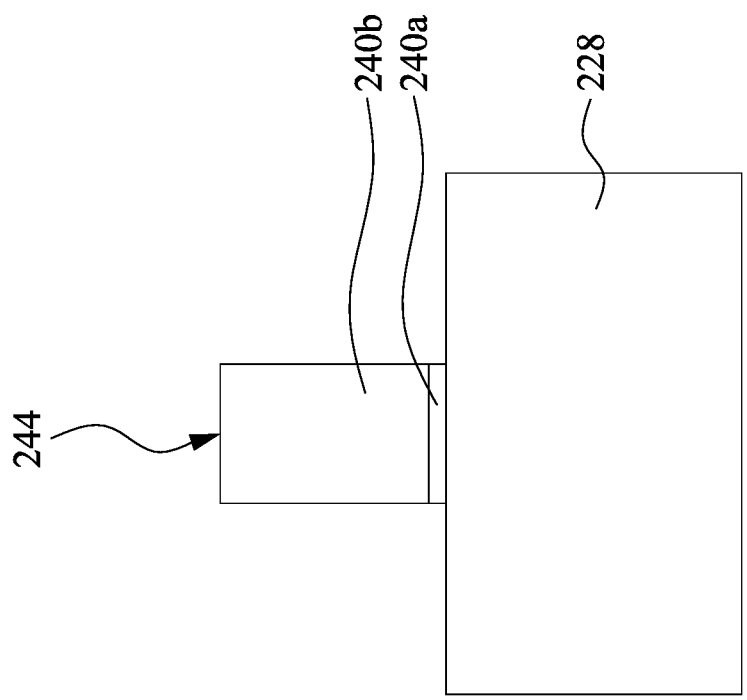
Figure 9A:
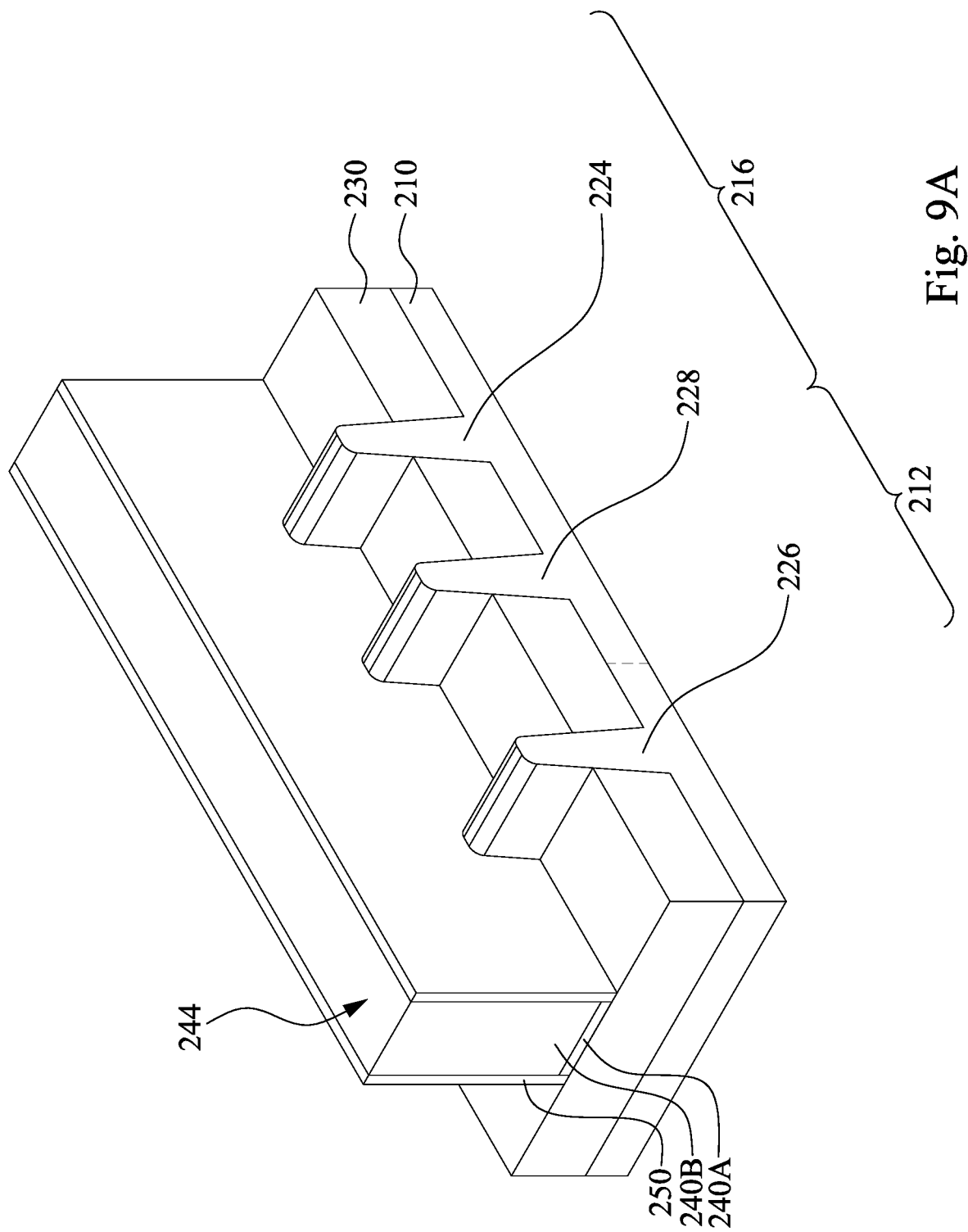
Figure 9B:
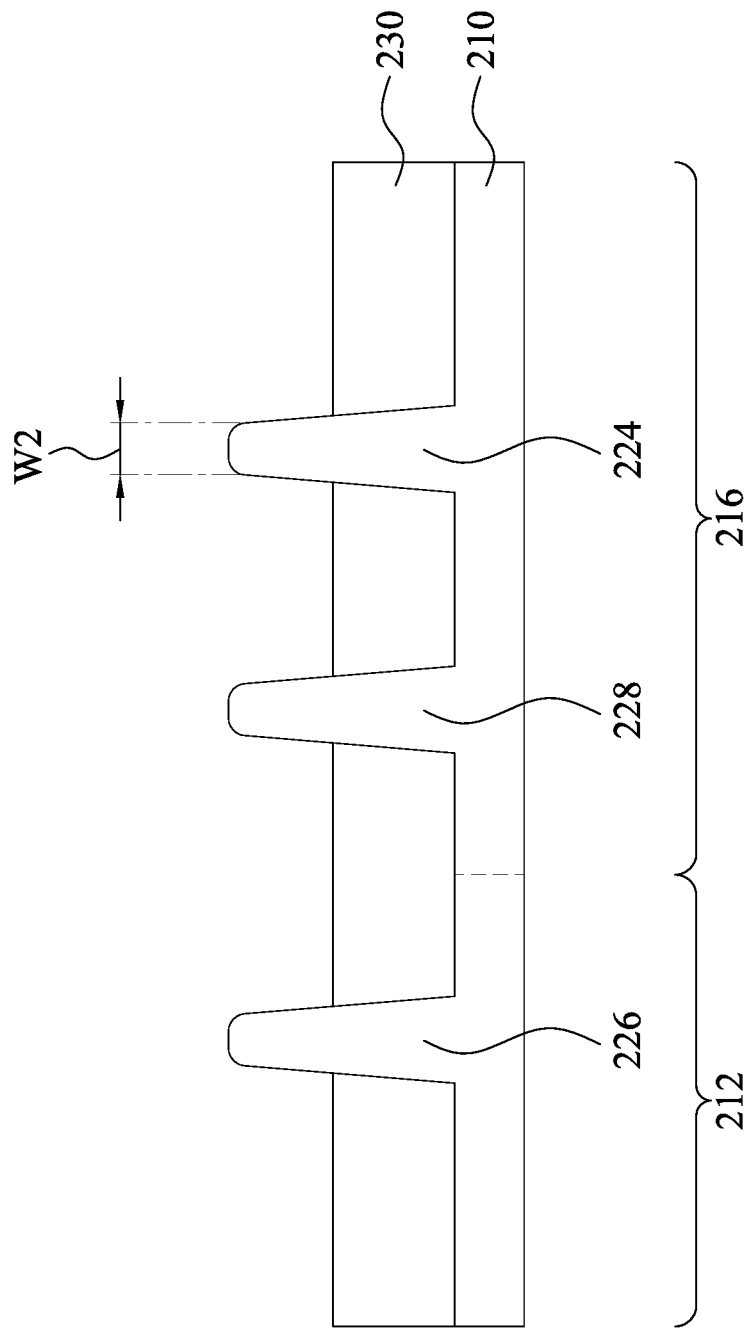
Figure 9D:
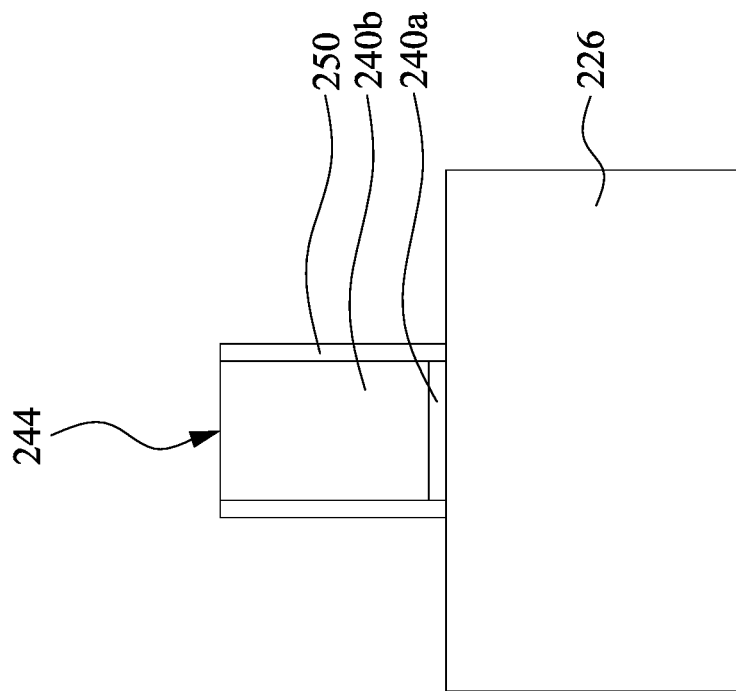
Figure 9C:
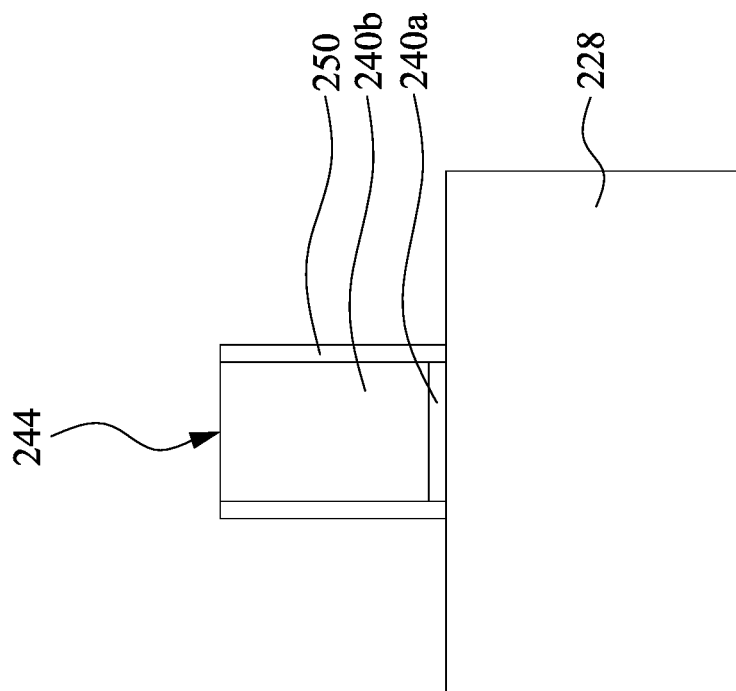
Figure 10A:
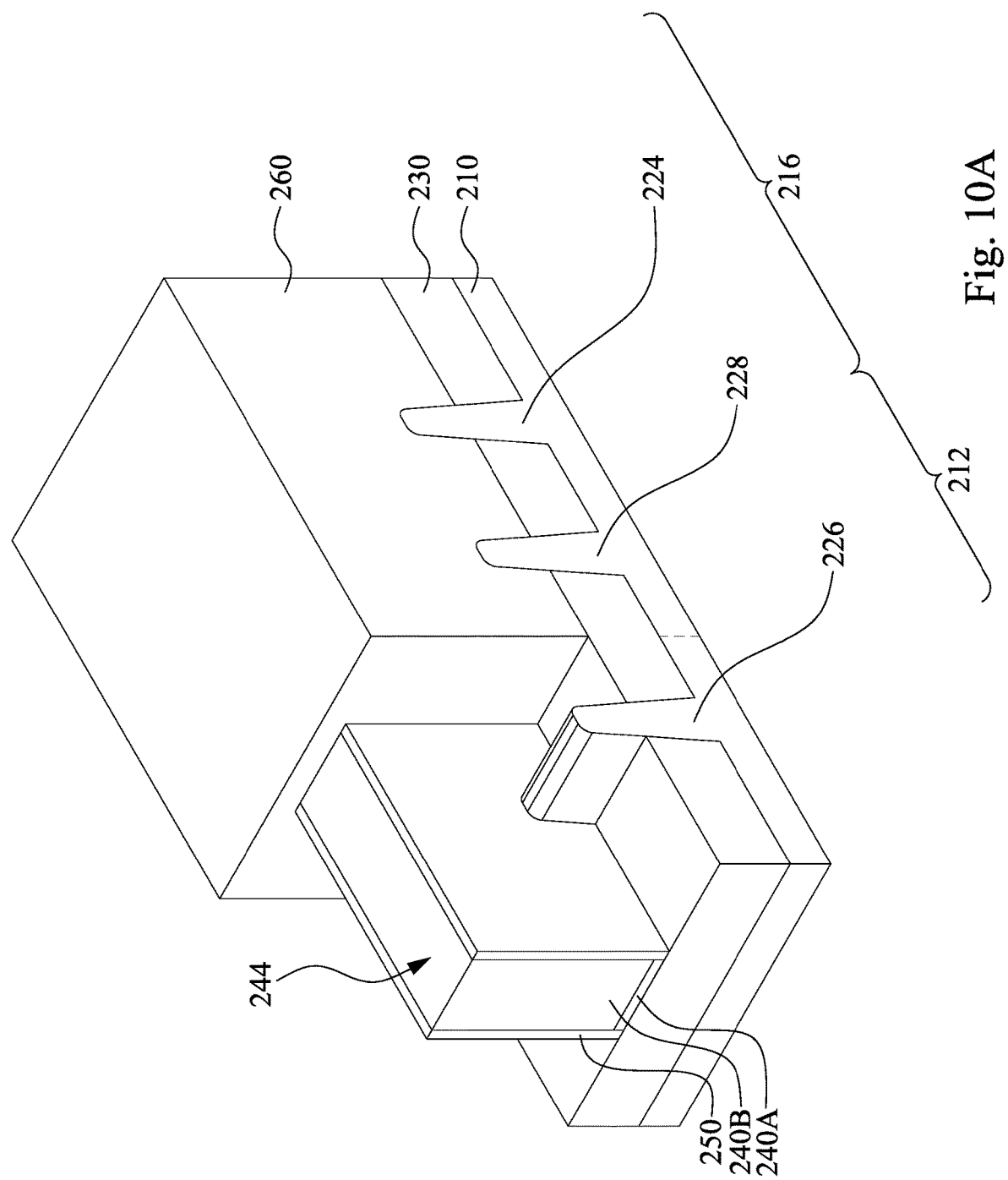
Figure 10B:
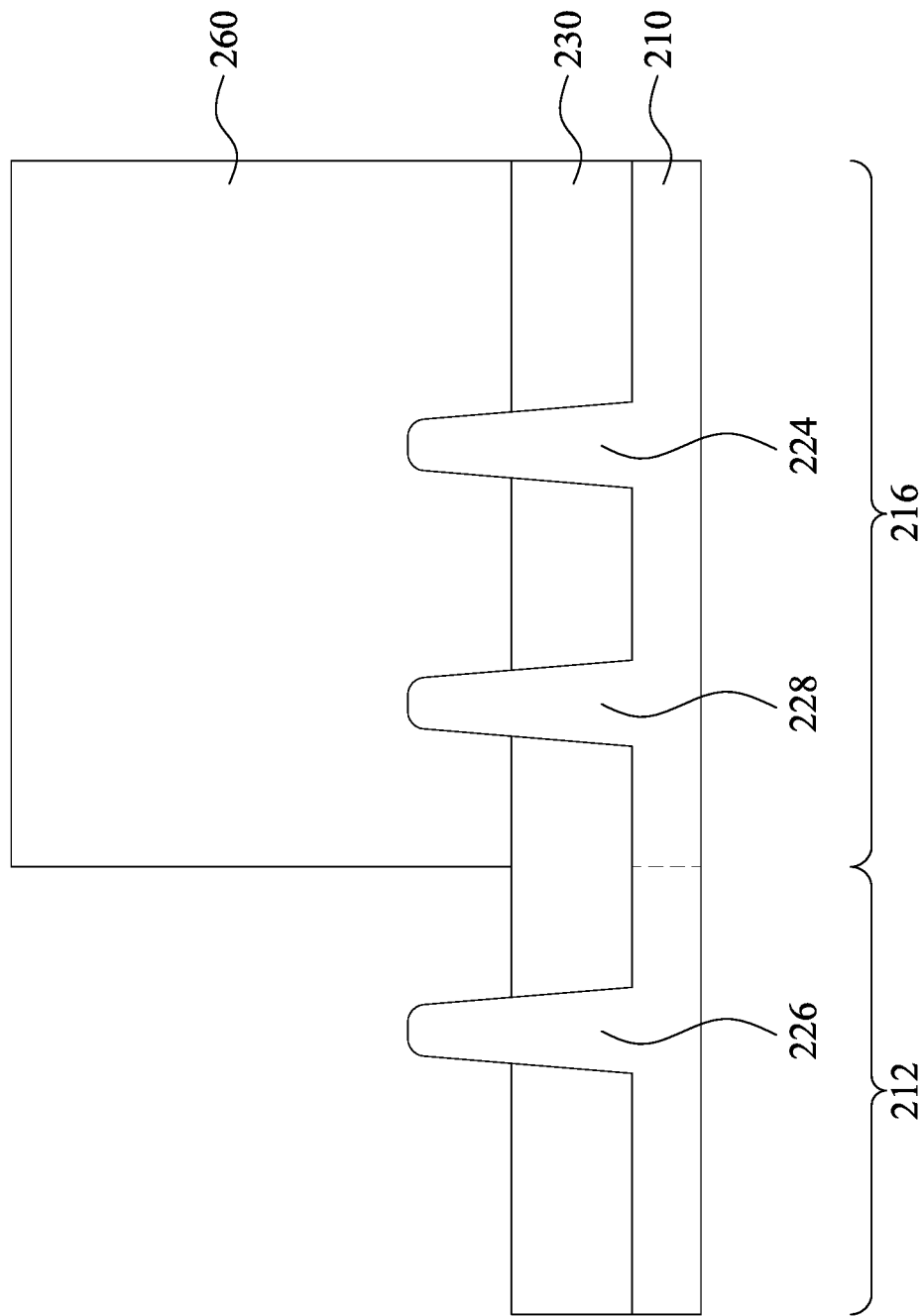
Figure 10D:
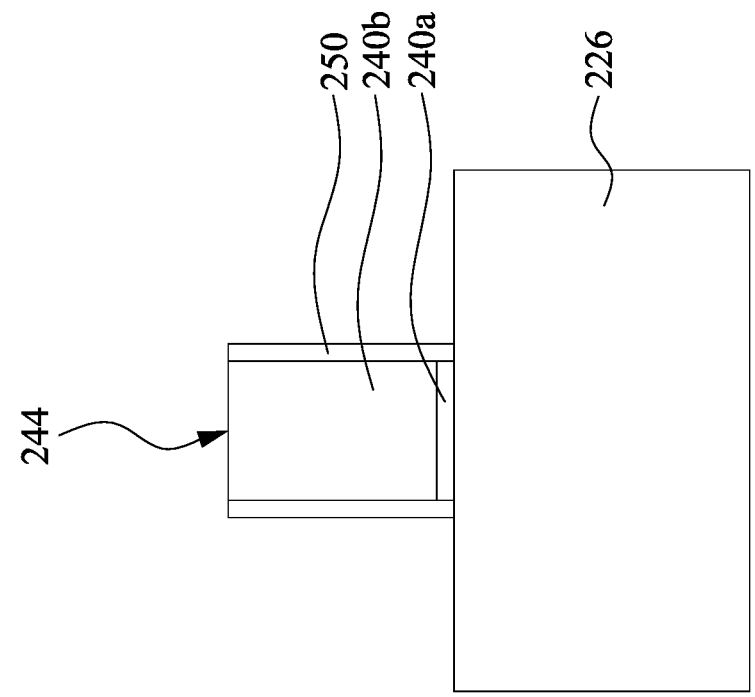
Figure 10C:
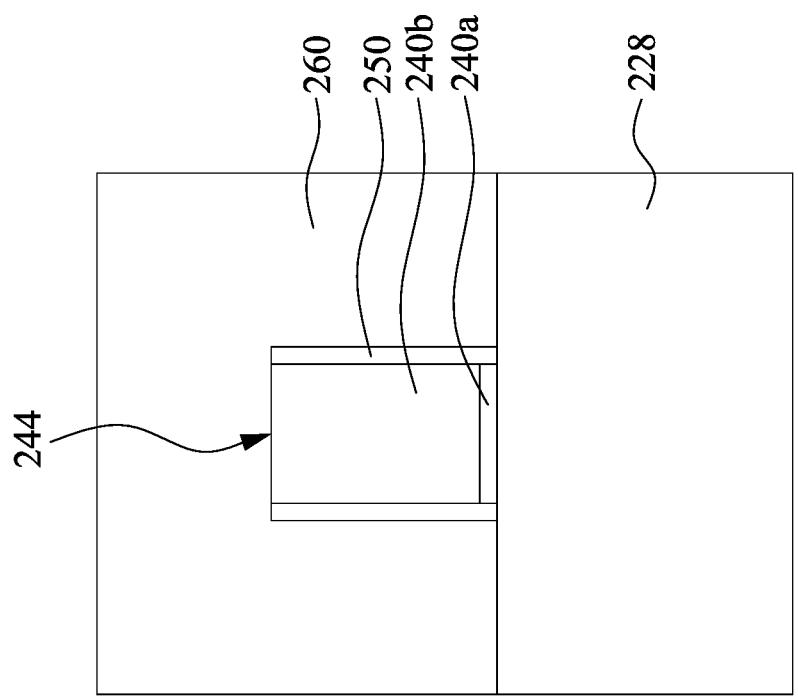
Figure 11A:
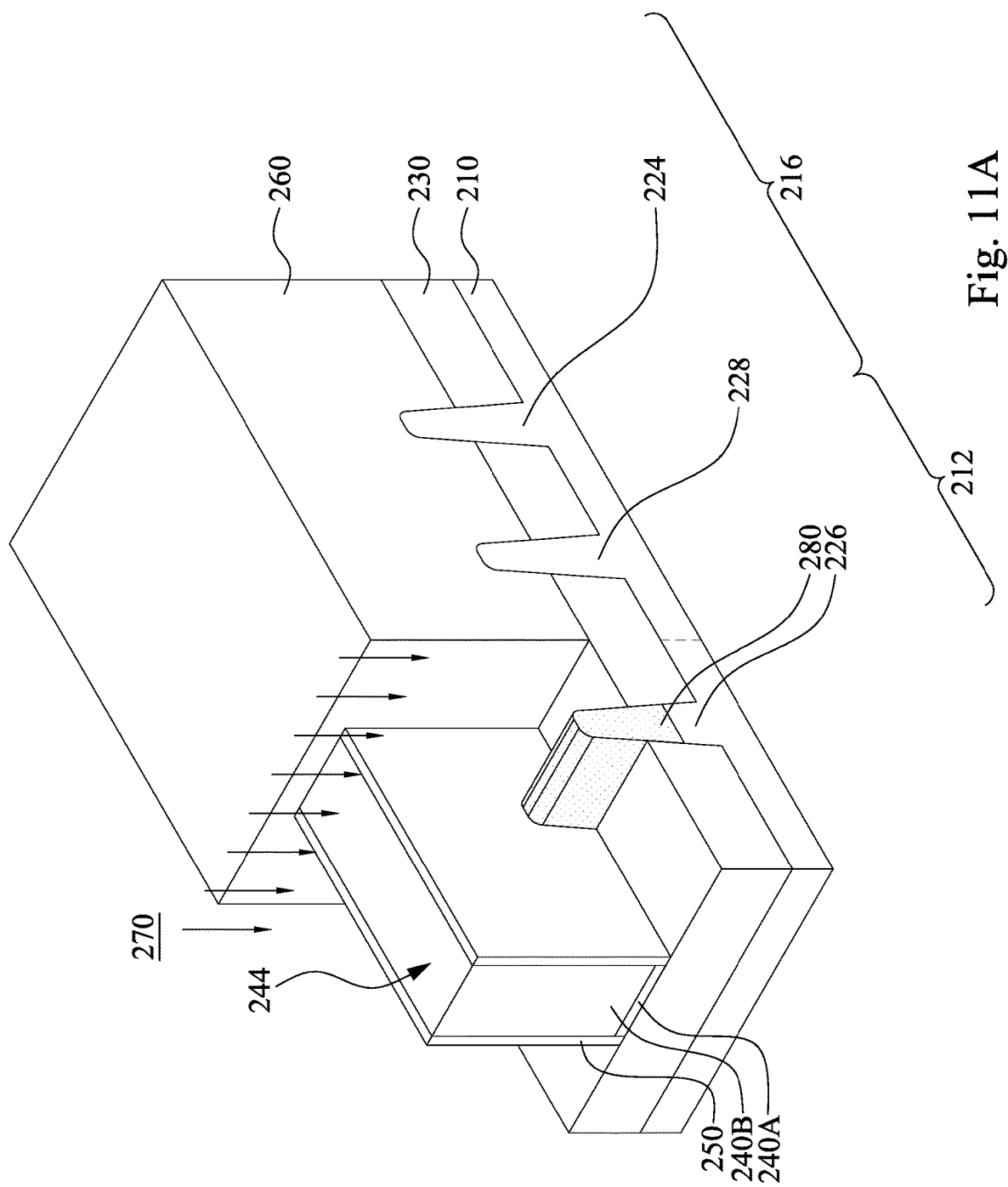
Figure 11B:
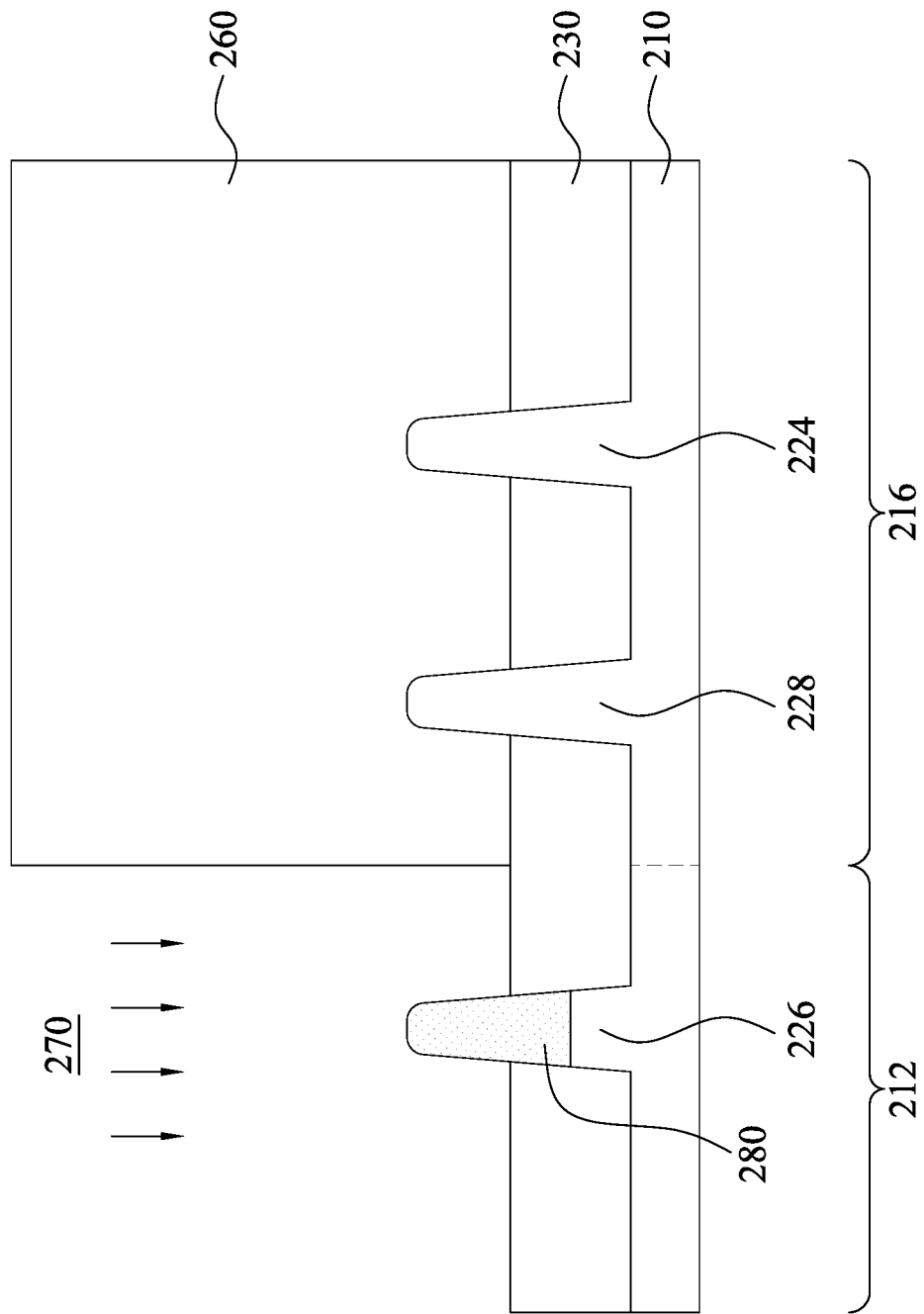
Figure 11D:
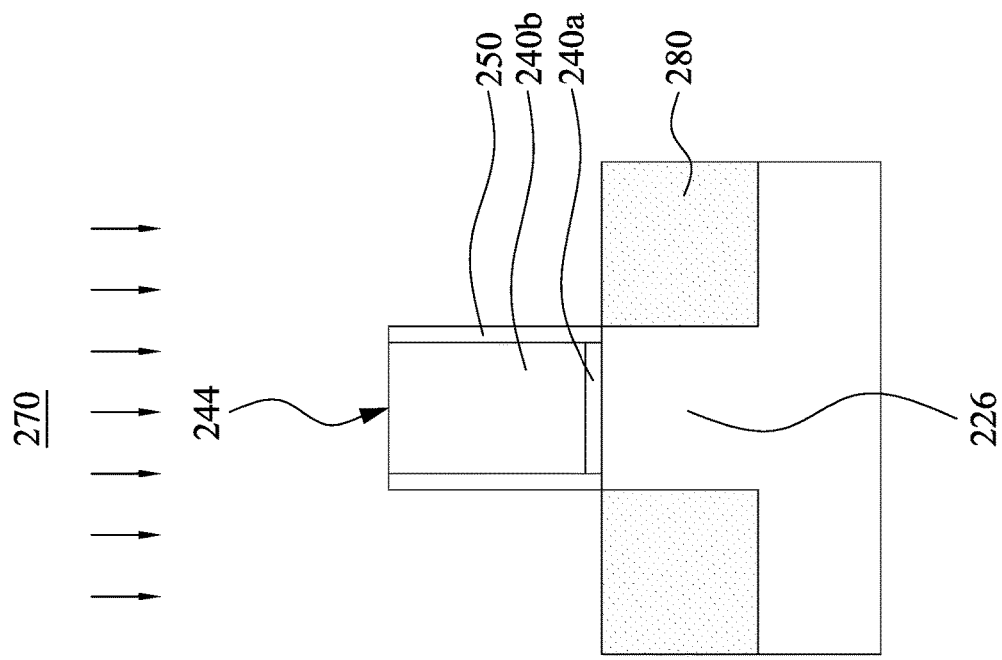
Figure 11C:
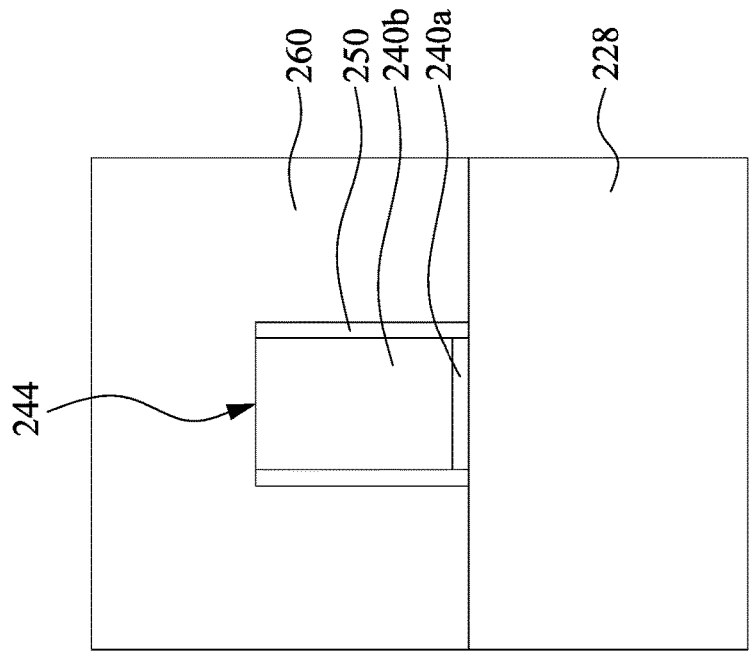
Figure 12A:
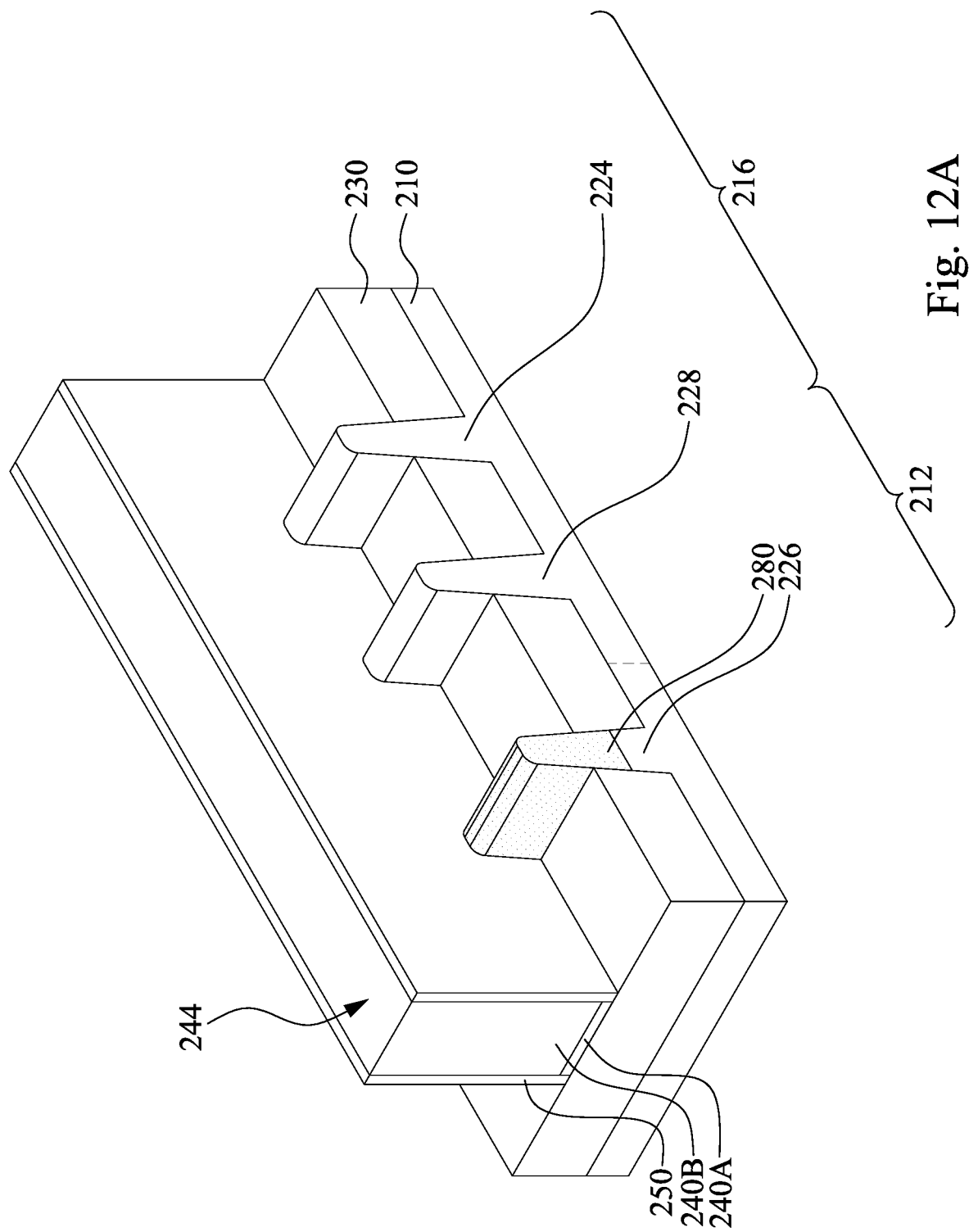
Figure 12B:
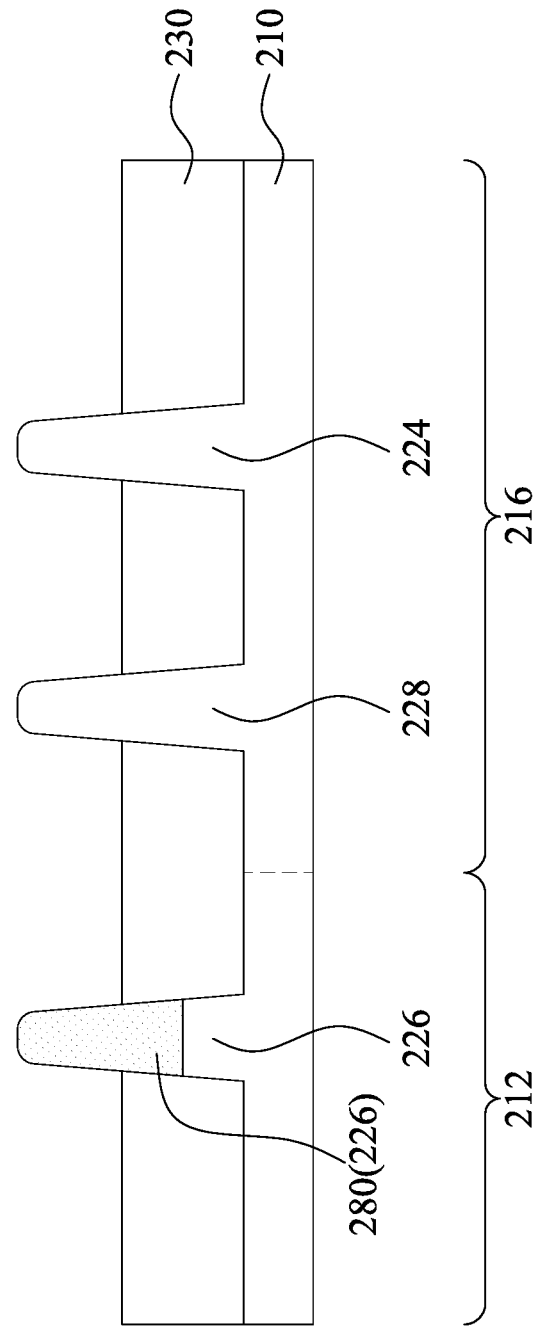
Figure 12D:
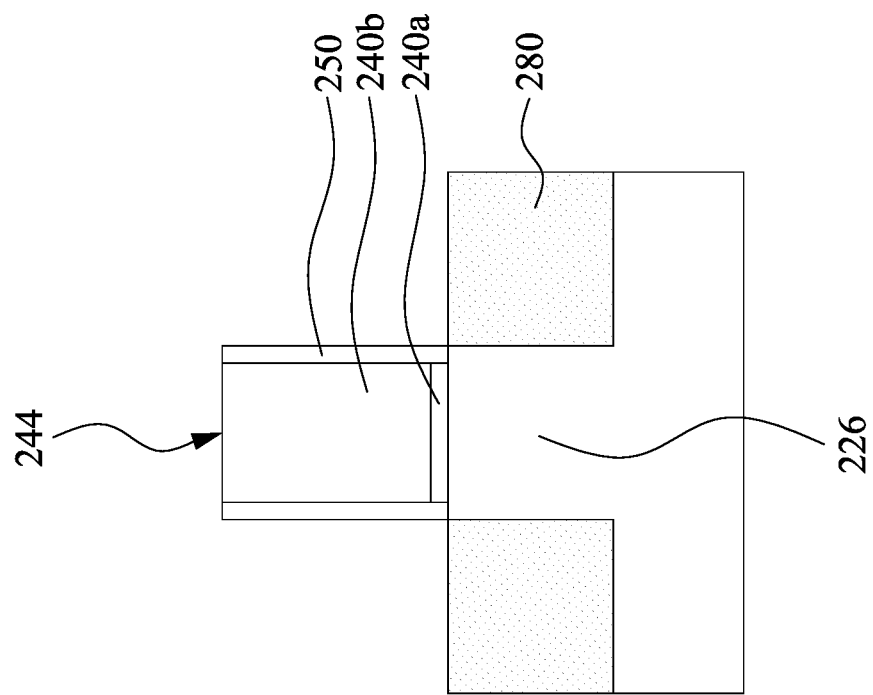
Figure 12C:
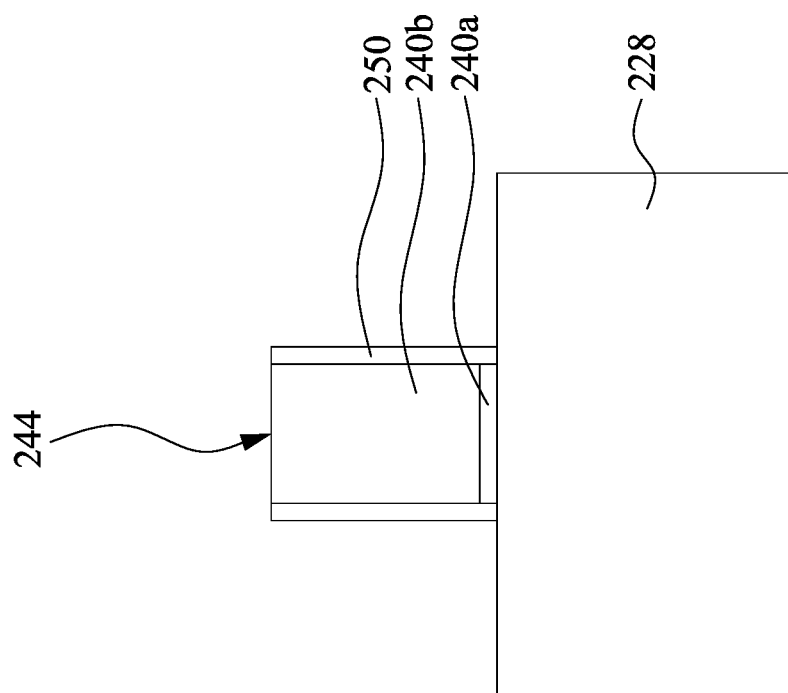
Figure 13A:
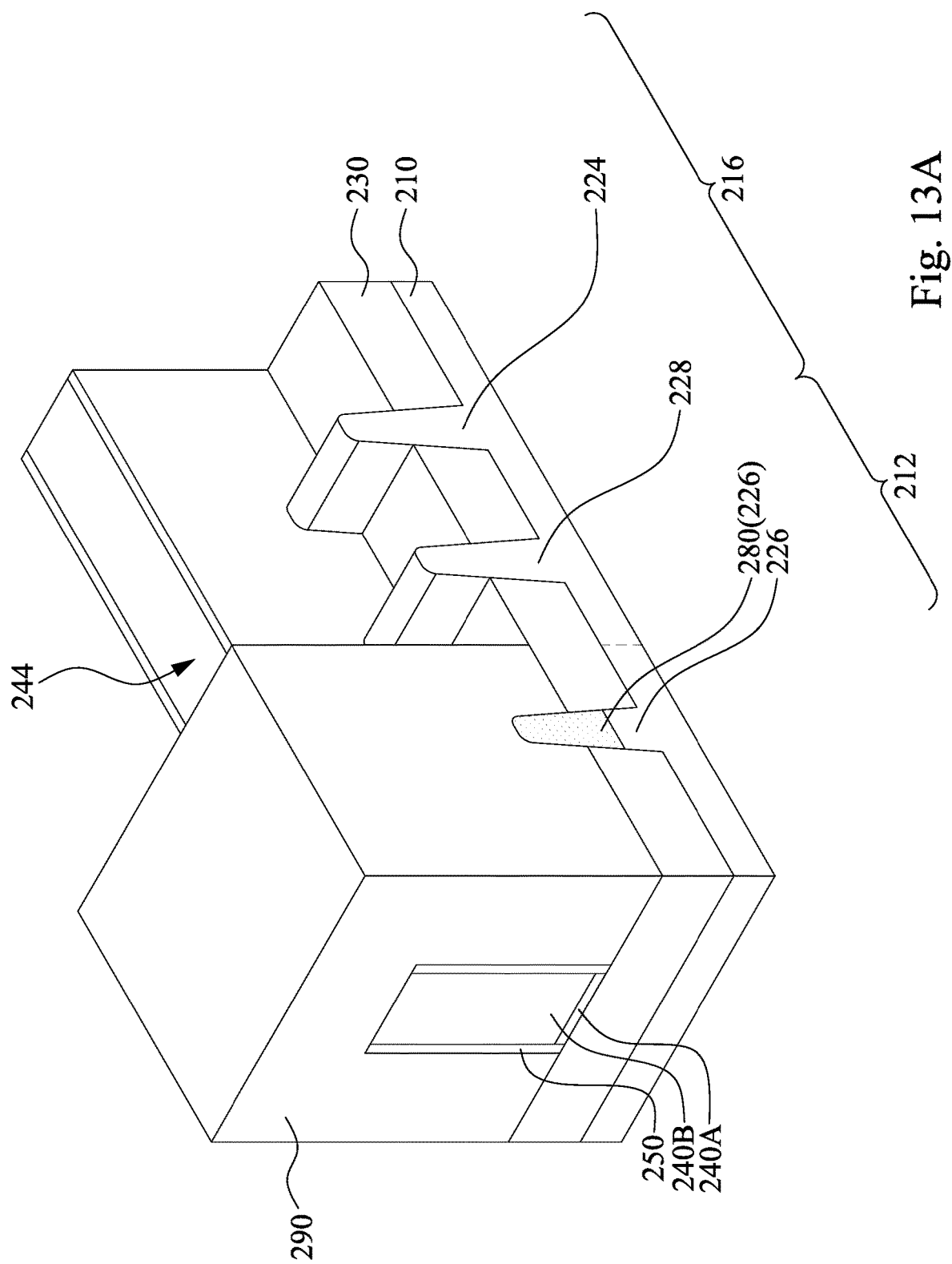
Figure 13B:
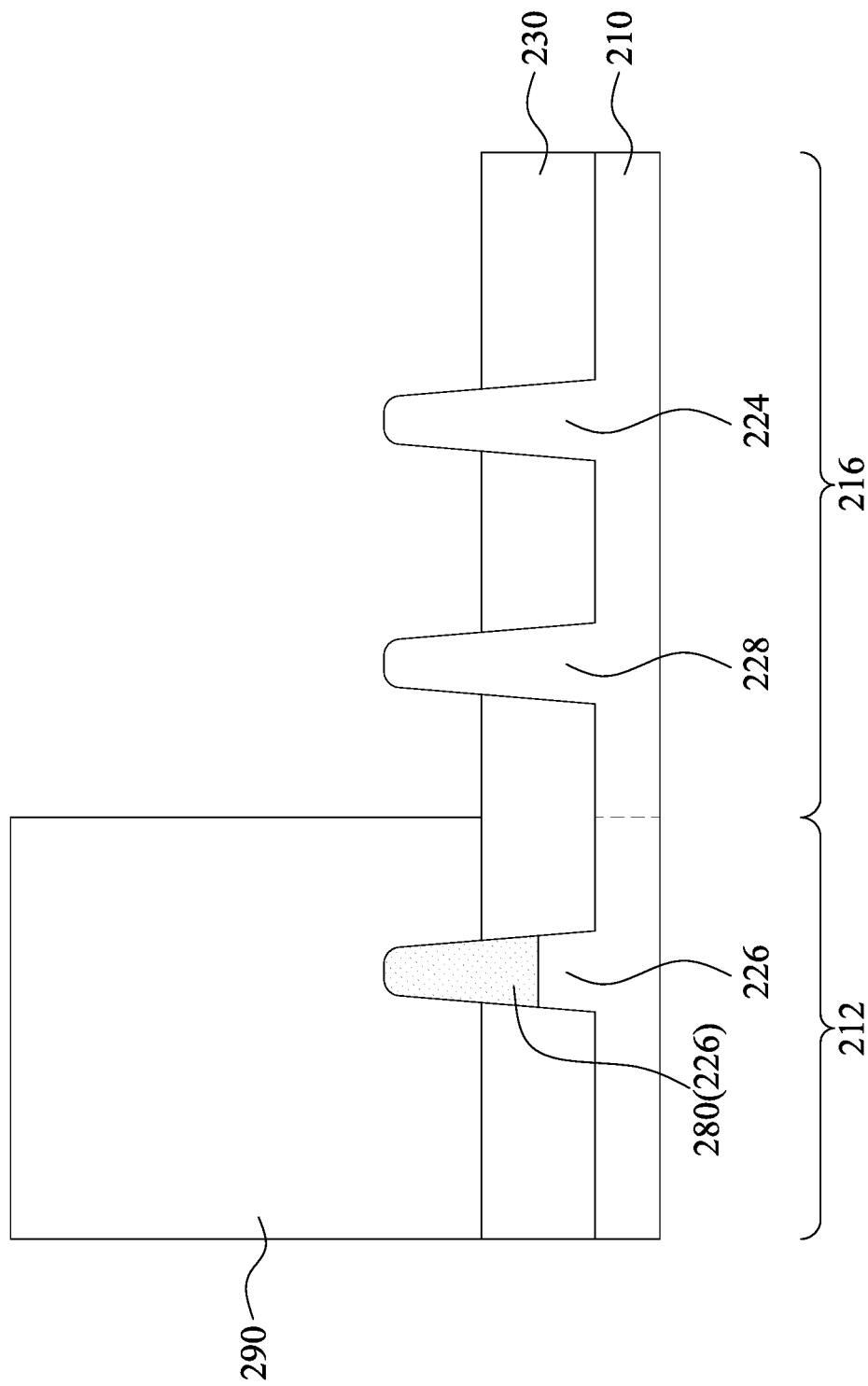
Figure 13D:
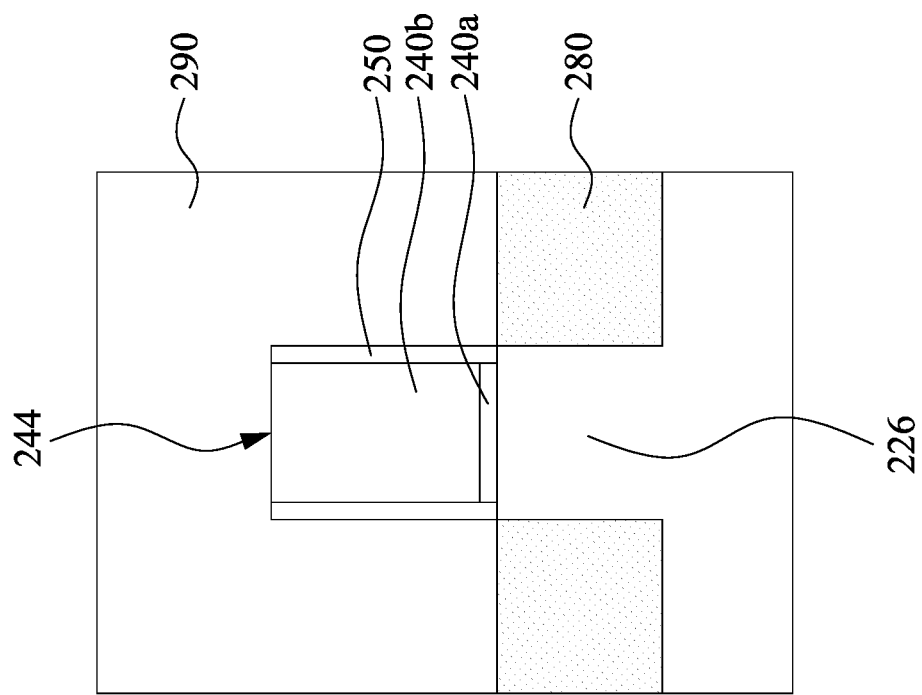
Figure 13C:
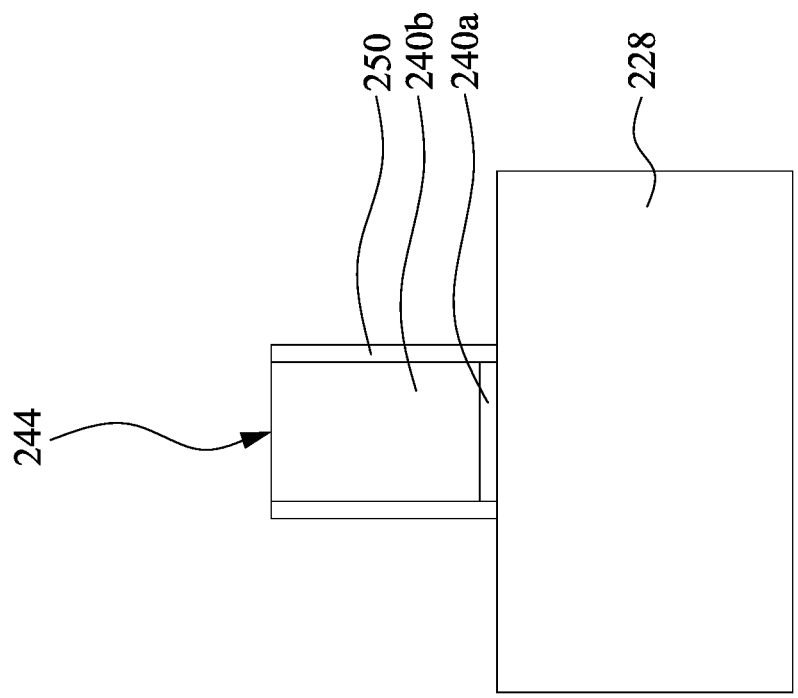

Reference is made to FIGS. 7, 8A, 8B, 8C and 8D, in which FIG. 7 is a top view of a SRAM device, FIG. 8A is a perspective view of area A of FIG. 7, FIG. 8B is a cross-sectional view along line B-B of FIG. 7, FIG. 8C is a cross-sectional view along line C-C of FIG. 7, and FIG. 8D is a cross-sectional view along line D-D of FIG. 7. A plurality of gate stacks 242, 244, 246, and 248 are formed on portions of the semiconductor fins 222, 224, 226, and 228 and expose another portions of the semiconductor fins 222, 224, 226, and 228. In greater detail, the gate stack 242 is formed on portions of the semiconductor fins 222, 224, and further on a portion of the semiconductor fin 228 in some embodiments; the gate stack 244 is formed on portions of the semiconductor fins 226 and 228, and further on a portion of the semiconductor fin 224 in some embodiments; the gate stack 246 is formed on portions of the semiconductor fins 222, and the gate stack 248 is formed on portions of the semiconductor fins 226. In some embodiments where a replacement gate (RPG) process is employed in later process, the gate stacks 242, 244, 246, and 248 can also be referred to as dummy gate stacks 242, 244, 246, and 248. In FIG. 8A, because the semiconductor fin 224, 226, and 228 have rounded top corners, the interfaces between the semiconductor fin 224, 226, 228 and the gate stack 244 have rounded profile.

As shown in FIGS. 8A to 8D, at least one of the gate stacks 242, 244, 246, and 248 includes a gate insulator layer 240a and a gate electrode layer 240b. The gate insulator layer 240a is disposed between the gate electrode layer 240b and the substrate 210, and is formed on the semiconductor fins 222, 224, 226, and 228. The gate insulator layer 240a, which prevents electron depletion, may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. The gate insulator layer 240a may have a multilayer structure such as one layer of silicon oxide (e.g., interfacial layer) and another layer of high-k material. The gate insulator layer 240a may be formed using chemical vapor deposition (CVD), physical vapor deposition (PVD), atomic layer deposition (ALD), thermal oxide, ozone oxidation, other suitable processes, or combinations thereof.

The gate electrode layers 240b are formed over the substrate 210 to cover the gate insulator layers 240a and the portions of the semiconductor fins 222, 224, 226, and 228. In some embodiments, the gate electrode layer 240b includes a semiconductor material such as polysilicon, amorphous silicon, or the like. The gate electrode layer 240b may be deposited doped or undoped. For example, in some embodiments, the gate electrode layer 240b includes polysilicon deposited undoped by low-pressure chemical vapor deposition (LPCVD). The polysilicon may also be deposited, for example, by furnace deposition of an in-situ doped polysilicon. Alternatively, the gate electrode layer 240b may include a polysilicon metal alloy or a metal gate including metals such as tungsten (W), nickel (Ni), aluminum (Al), tantalum (Ta), titanium (Ti), or combinations thereof.

In FIG. 7, the semiconductor fin 222 and the gate stack 242 form a pull-down transistor PD-1, and the semiconductor fin 224 and the gate stack 242 form a pull-up transistor PU-1. In other words, the pull-down transistor PD-1 and the pull-up transistor PU-1 share the gate stack 242. The semiconductor fin 226 and the gate stack 244 form another pull-down transistor PD-2, and the semiconductor fin 228 and the gate stack 244 form another pull-up transistor PU-2. In other words, the pull-down transistor PD-2 and the pull-up transistor PU-2 share the gate stack 244. Moreover, the semiconductor fin 222 and the gate stack 246 form a pass-gate transistor PG-1. In other words, the pass-gate transistor PG-1 and the pull-down transistor PD-1 share the semiconductor fin 222. The semiconductor fin 226 and the gate stack 248 form another pass-gate transistor PG-2. In other words, the pass-gate transistor PG-2 and the pull-down transistor PD-2 share the semiconductor fin 226. Therefore, the SRAM cell 200a is a six-transistor (6T) SRAM. One of ordinary skill in the art, however, can understand that features of the various embodiments described herein may be used for forming other types of devices, such as an 8T-SRAM memory device. It is noted that the semiconductor fins 226 shared by the pull-down transistor PD-2 and the pass-gate transistor PG-2 is illustrated in FIGS. 8A to 8D, and the semiconductor fins 224 and 228 shared by the pull-up transistor PU-1 and pull-up transistor PU-2 are illustrated in FIGS. 8A to 8D.

In some embodiments, the number of the semiconductor fins 222 can be plural, and/or the number of the semiconductor fins 226 can be plural. Therefore, the pull-down transistors PD-1, PD-2, and the pass-gate transistors PG-1, PG-2 have a plurality of semiconductor fins per transistor, and the pull-up transistors PU-1 and PU-2 have one semiconductor fin per transistor, and the claimed scope is not limited in this respect.

In FIG. 7, when the SRAM cells 200*a*-200*d* are arranged together to form an array (the SRAM device herein), the cell layouts may be flipped or rotated to enable higher packing densities. Often by flipping the cell over a cell boundary or axis and placing the flipped cell adjacent the original cell, common nodes and connections can be combined to increase packing density. For example, the SRAM cells 200*a*-200*d* are mirror images and in rotated images of each other. Specifically, the SRAM cells 200*a* and 200*b* are mirror images across a Y-axis, as is SRAM cells 200*c* and 200*d*. The SRAM cells 200*a* and 200*c* are mirror images across an X-axis, as is SRAM cells 200*b* and 200*d*. Further, the diagonal SRAM cells (the SRAM cells 200*a* and 200*d*; the SRAM cells 200*b* and 200*c*) are rotated images of each other at 180 degrees.

Reference is made to FIGS. 9A, 9B, 9C and 9D. A plurality of gate spacers 250 are formed over the substrate 210 and alongside the gate stacks 244, 246, and 248. In some embodiments, the gate spacers 250 may include silicon oxide, silicon nitride, silicon oxy-nitride, or other suitable material. The gate spacers 250 may include a single layer or multilayer structure. A blanket layer of the gate spacers 250 may be formed by CVD, PVD, ALD, or other suitable technique. Then, an anisotropic etching is performed on the blanket layer to form a pair of the gate spacers 250 on two sides of the gate stacks 244, 246, and 248. In some embodiments, the gate spacers 250 are used to offset subsequently formed doped regions, such as source/drain regions. The gate spacers 250 may further be used for designing or modifying the source/drain region (junction) profile.

Reference is made to FIGS. 10A, 10B, 10C and 10D. A patterned mask 260 is formed over the substrate 210 and covers the n-well region 216. In greater detail, the patterned mask 260 is formed to cover the semiconductor fins 224 and 228 to protect them from the following processes. Stated another way, the p-well region 212 and the semiconductor fin 226 therein are exposed from the patterned mask 260. In some embodiments, the patterned mask 260 may be a photoresist layer.

Reference is made to FIGS. 11A, 11B, 11C and 11D. An implantation process 270 is performed to the p-well region 212 of the substrate 210, so as to form a doped region 280 in the semiconductor fin 226. In some embodiments, the doped region 280 if formed by implanting an n-type impurity such as Arsenic (As), Phosphorus (P), other group V element, or the combinations thereof. In some embodiments, the doped region 280 can also be referred to as source/drain region 280. Since the doped region 280 is formed by the implantation process 270, the shape of the doped region 280 will inherit the original shape of the semiconductor fin 226. On the other hand, during the implantation process 270, the n-well region 216 is protected by the patterned mask 260.

Reference is made to FIGS. 12A, 12B, 12C and 12D. The patterned mask 260 is removed from the substrate 210 to expose the n-well region 216. In greater detail, once the patterned mask 260 is removed, the semiconductor fins 224 and 228 are exposed. In some embodiments where the patterned mask 260 is photoresist, the patterned mask 260 may be removed by ashing or striping.

Reference is made to FIGS. 13A, 13B, 13C and 13D. A patterned mask 290 is formed over the substrate 210 and covers the p-well region 212. In greater detail, the patterned mask 290 is formed to cover the semiconductor fin 226 to protect it from following processes. Stated another way, the n-well region 216 and the semiconductor fins 224 and 228 therein are exposed from the patterned mask 290. In some embodiments, the patterned mask 290 may be a photoresist layer.

Figure 14A:
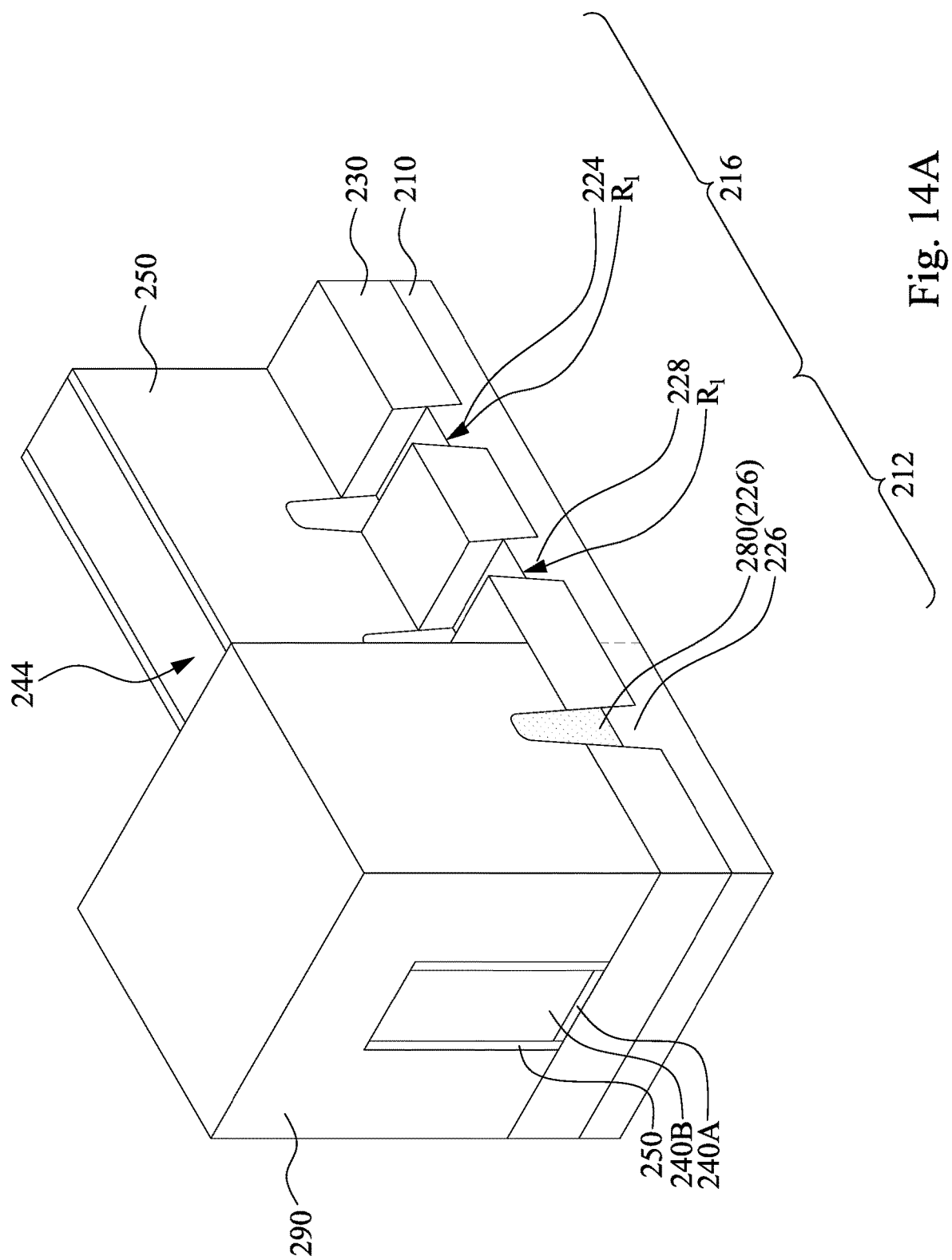
Figure 14B:
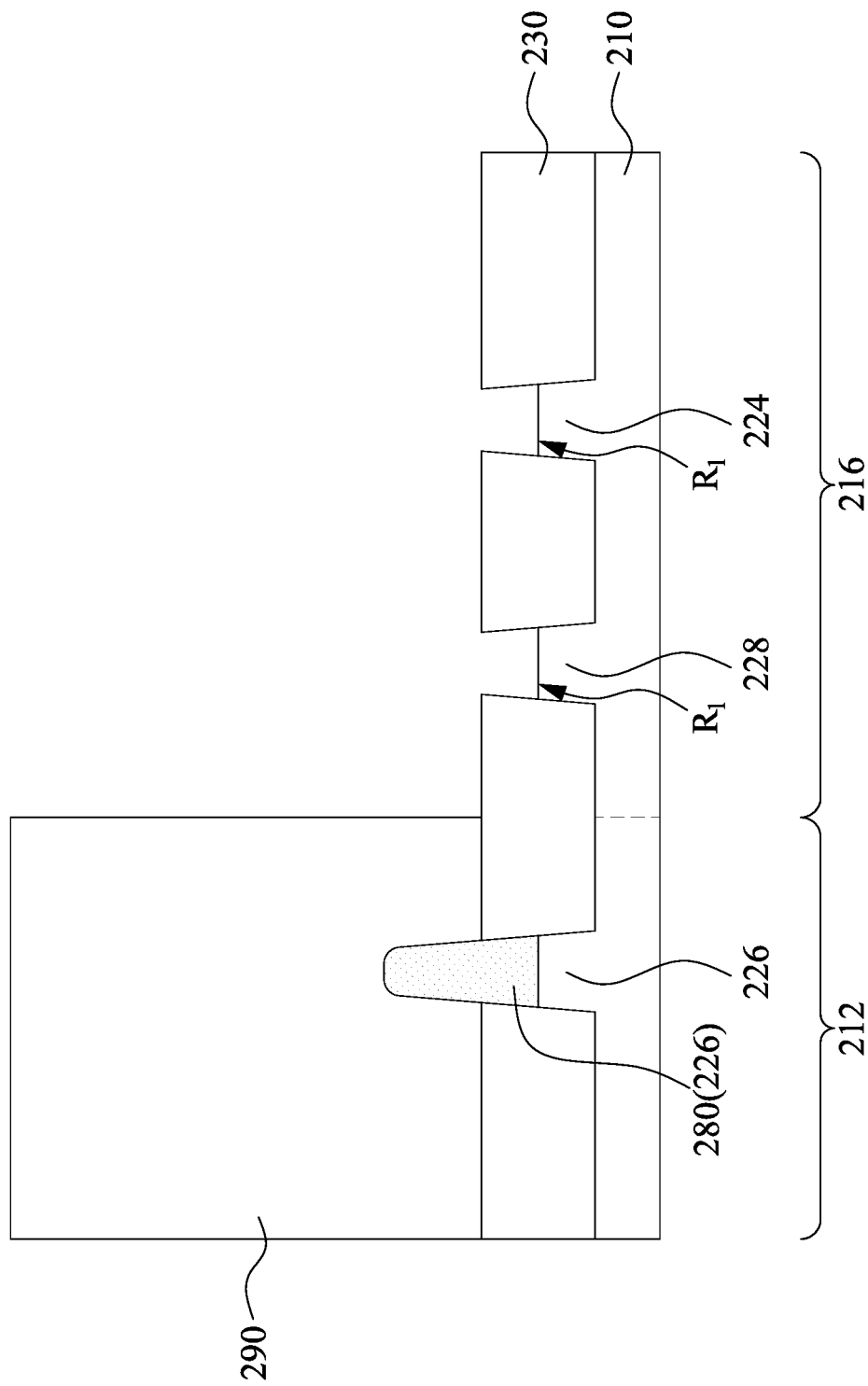
Figure 14D:
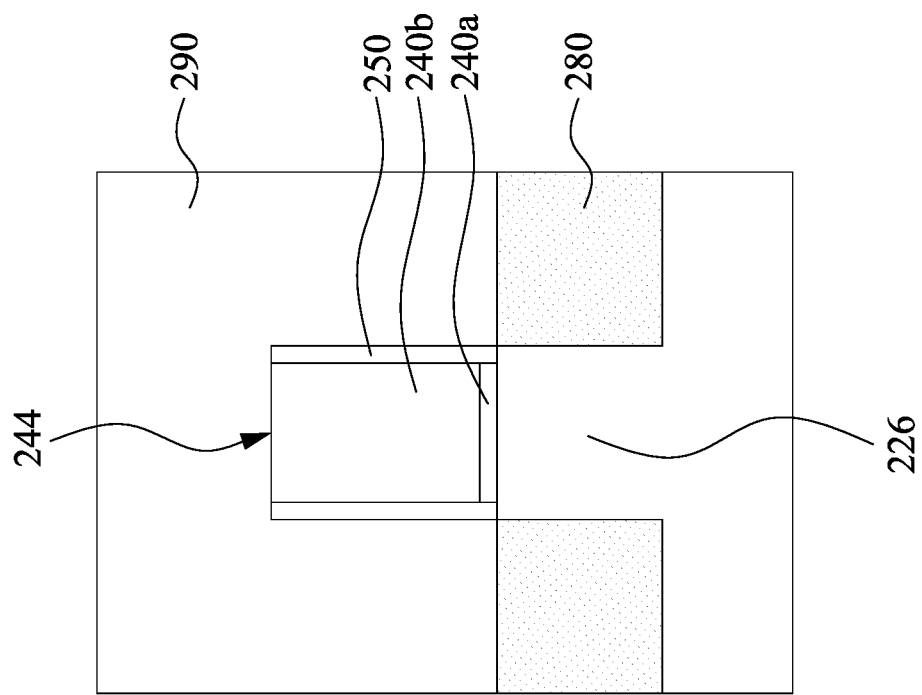
Figure 14C:
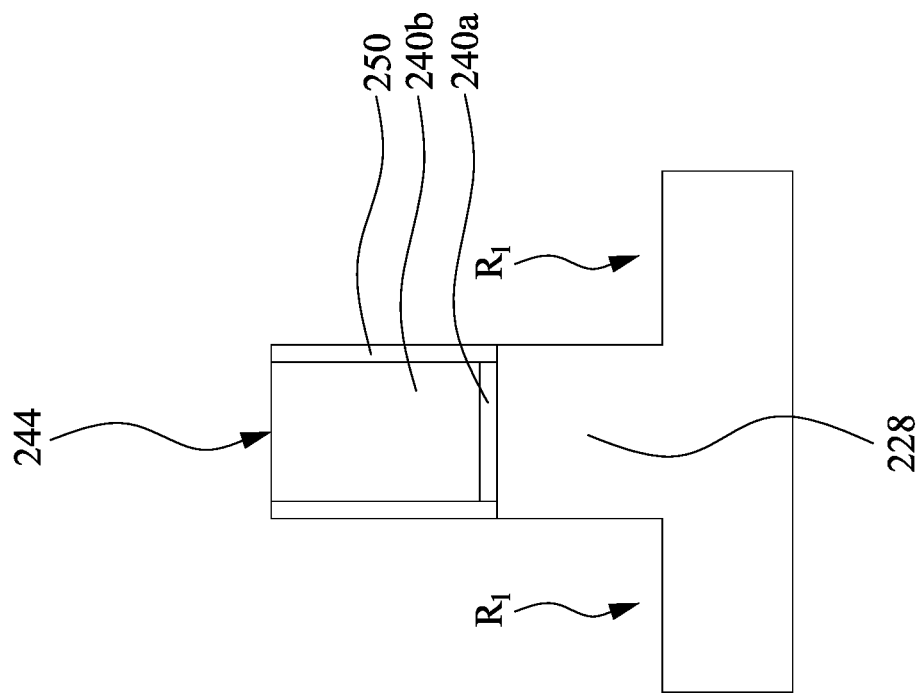
Figure 15A:
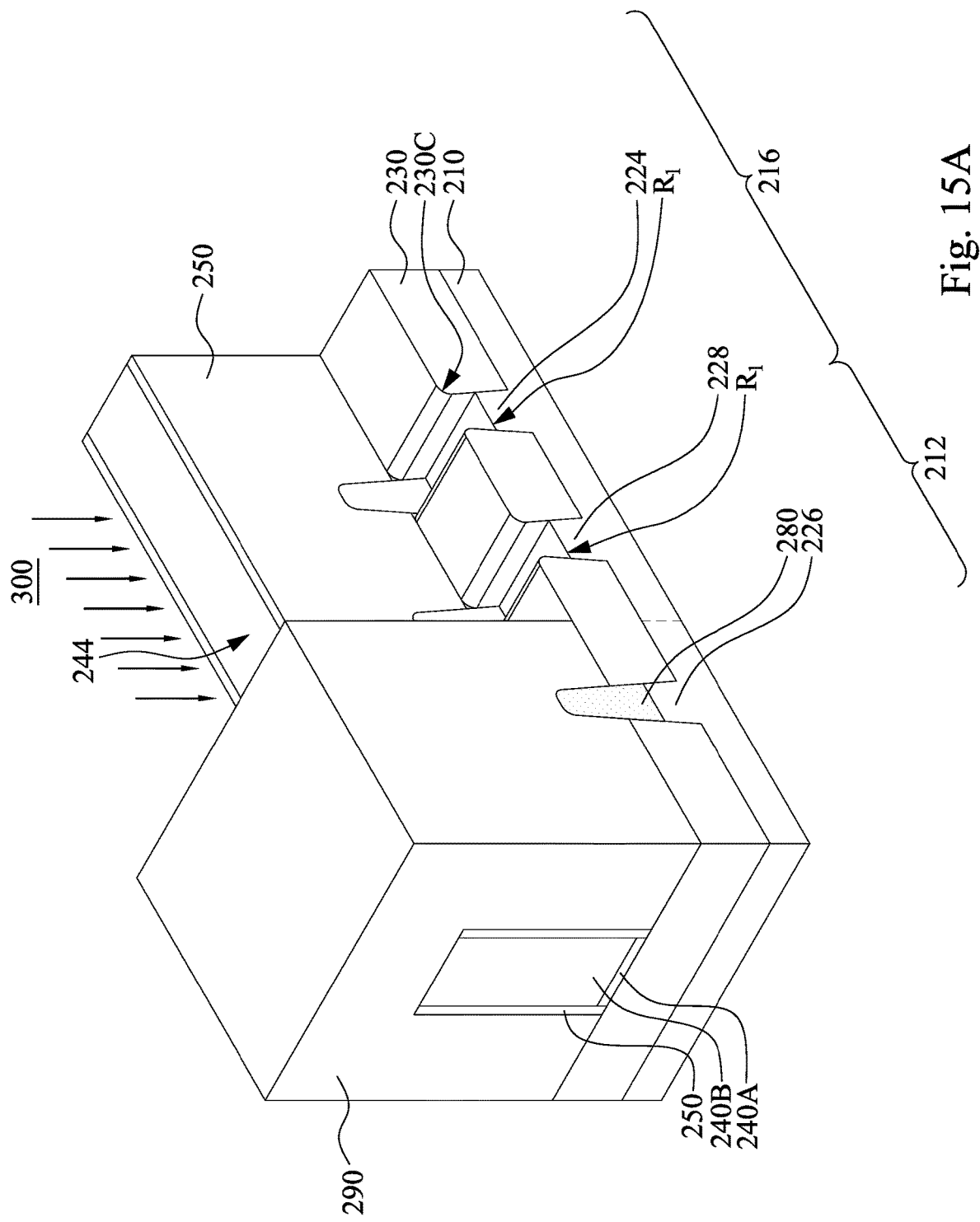
Figure 15B:
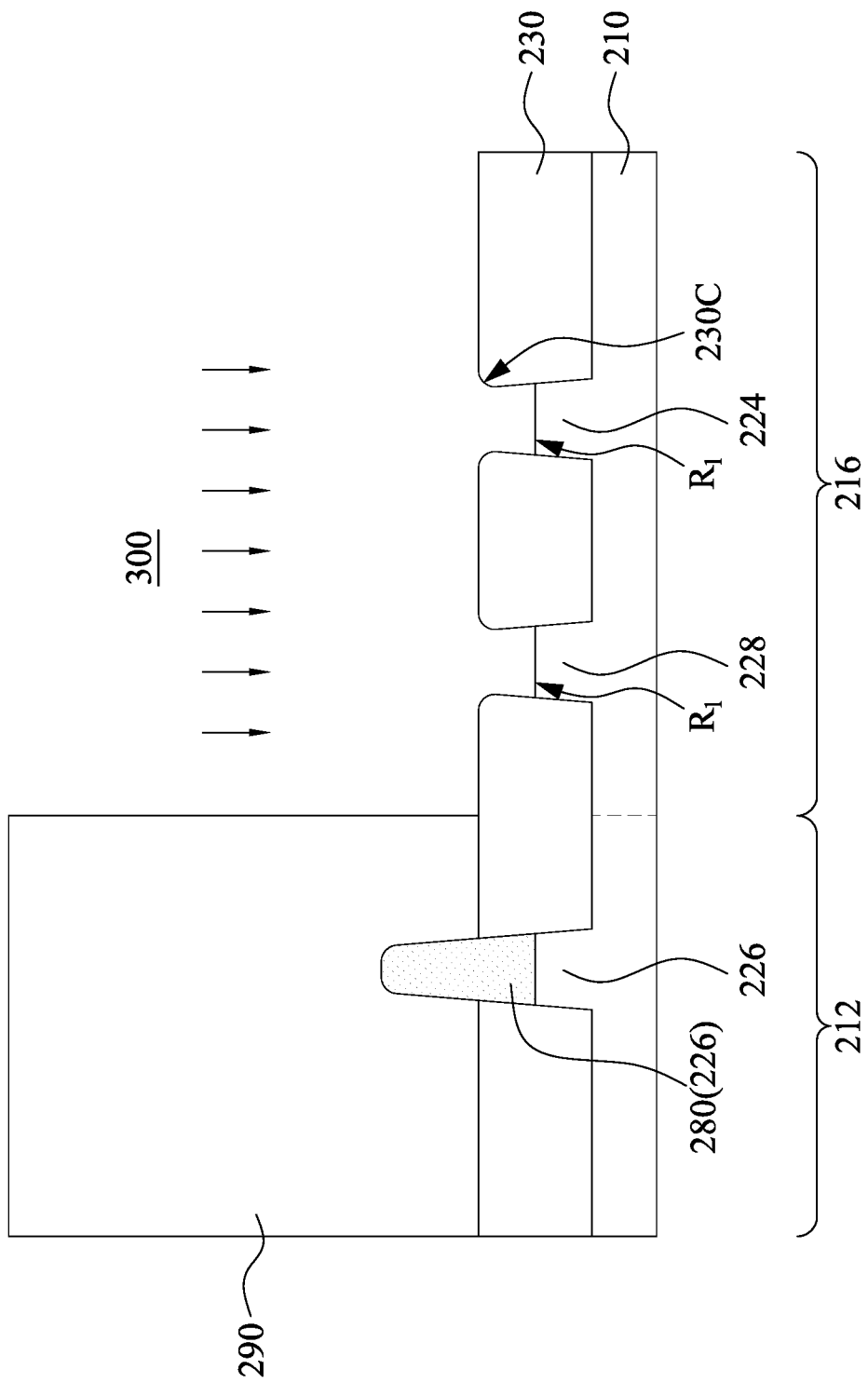
Figure 15D:
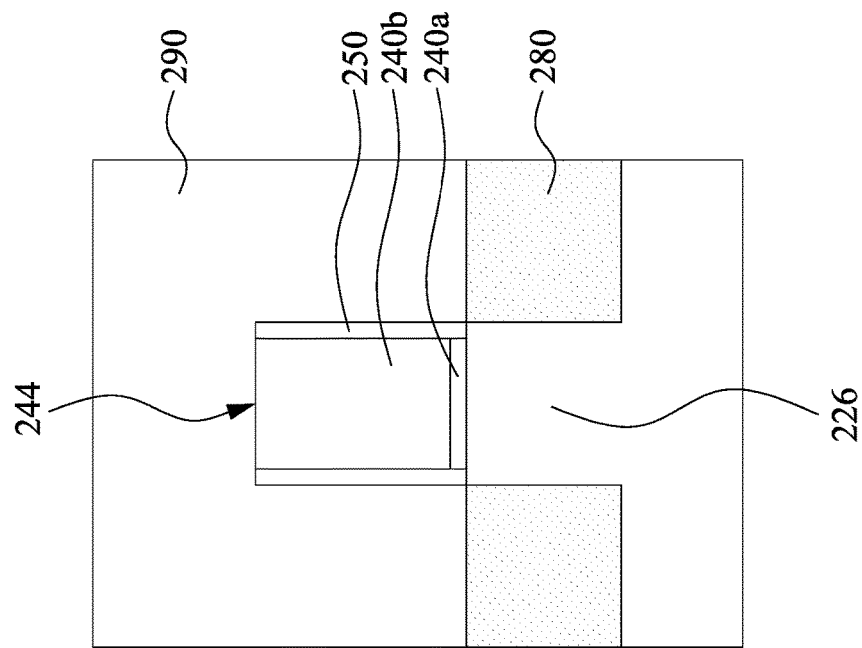
Figure 15C:
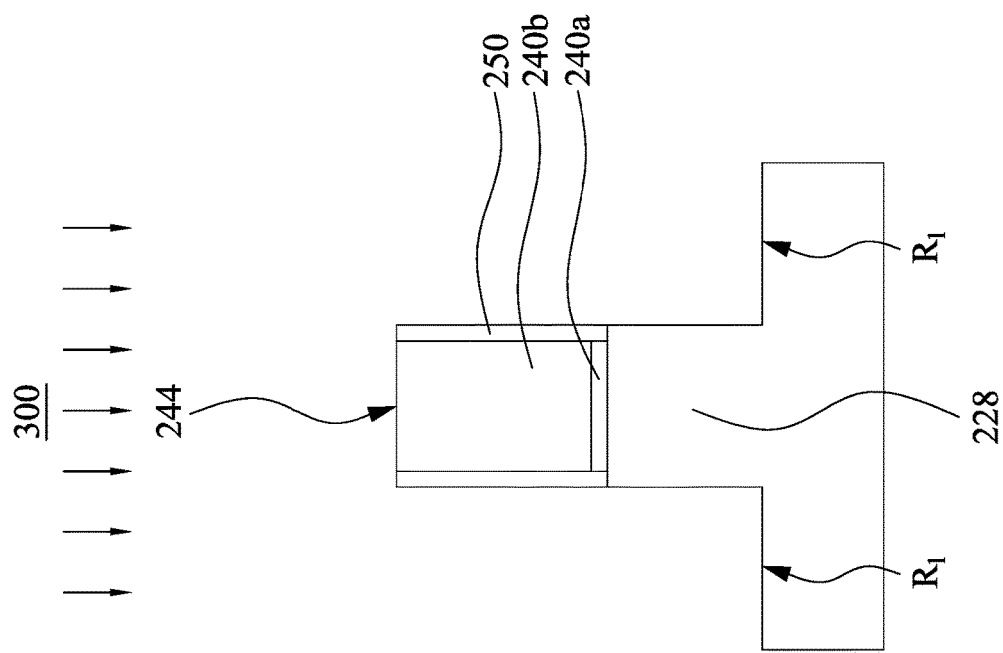
Figure 16A:
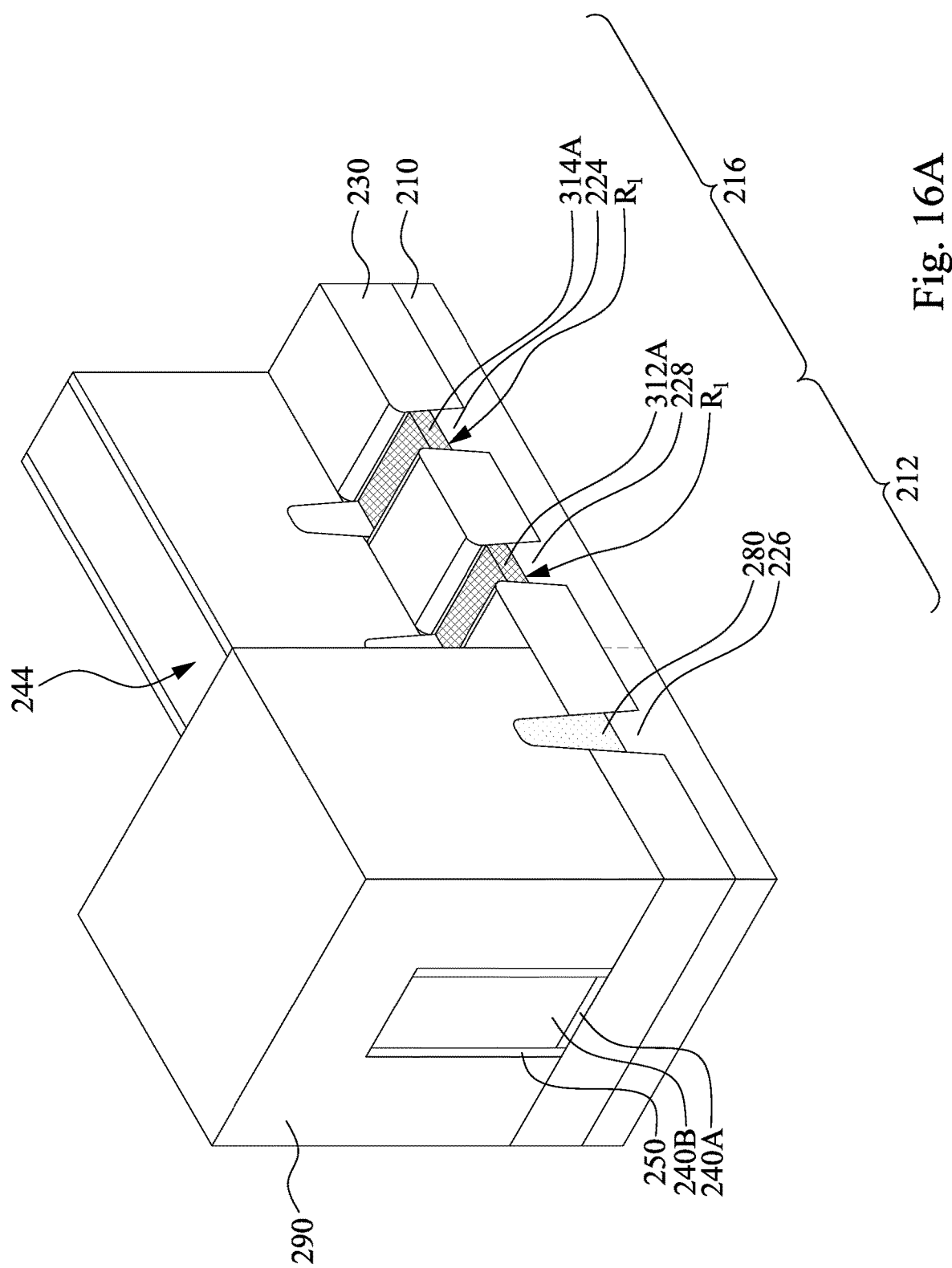
Figure 16B:
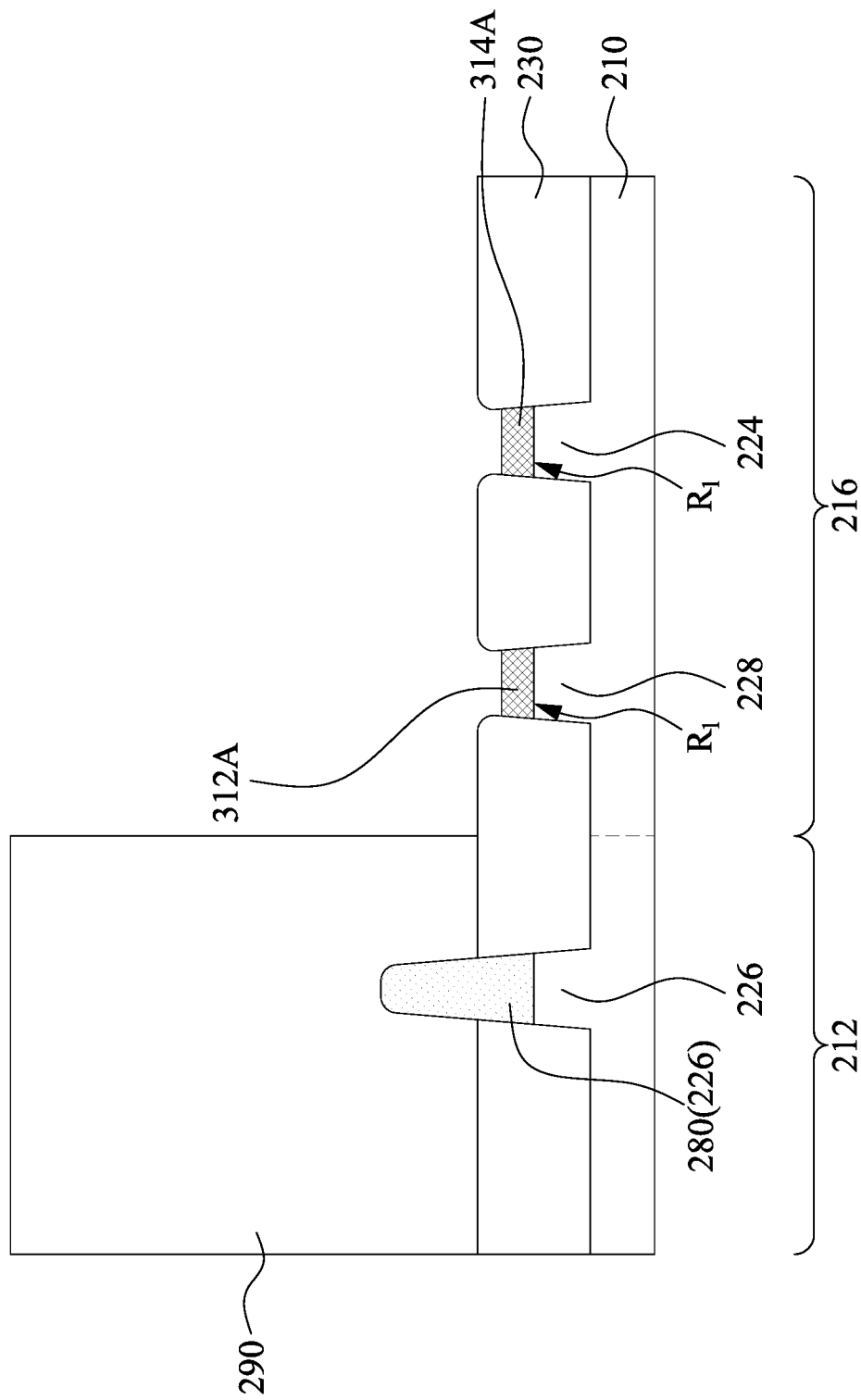
Figure 16D:
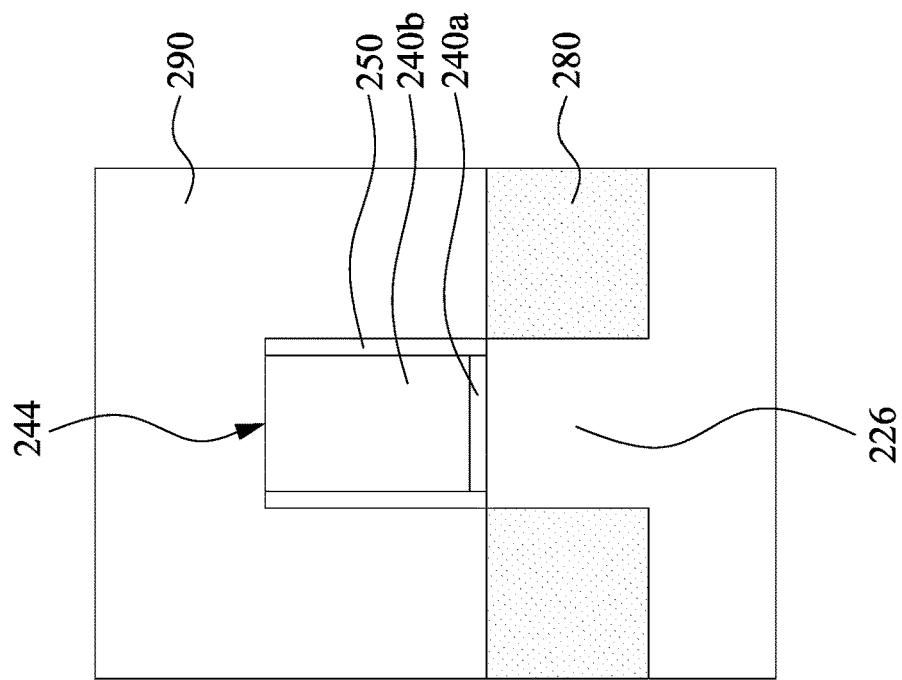
Figure 16C:
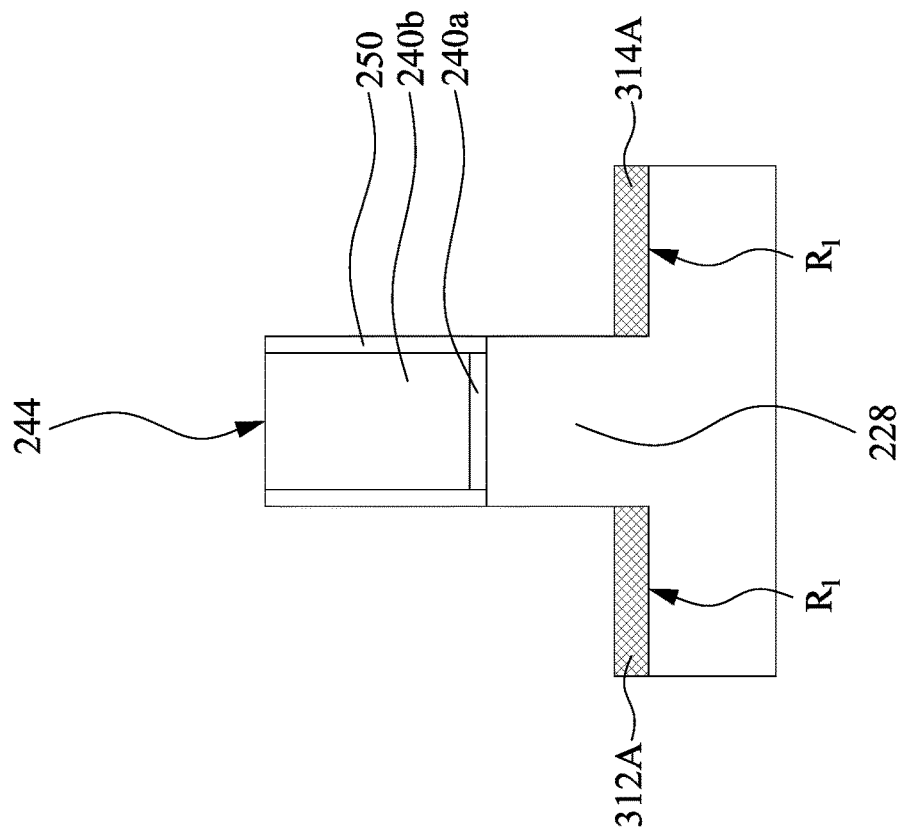
Figure 17A:
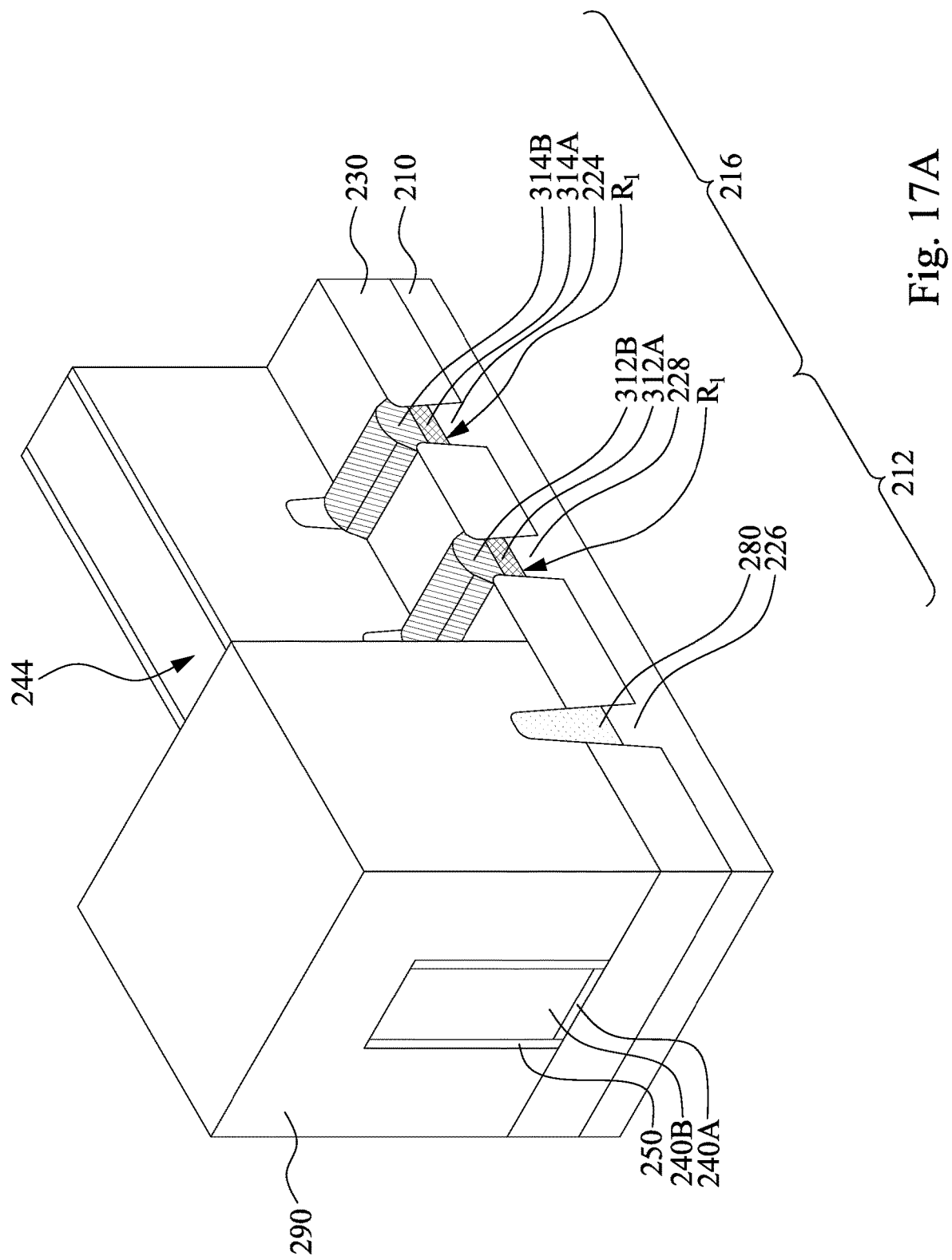
Figure 17B:
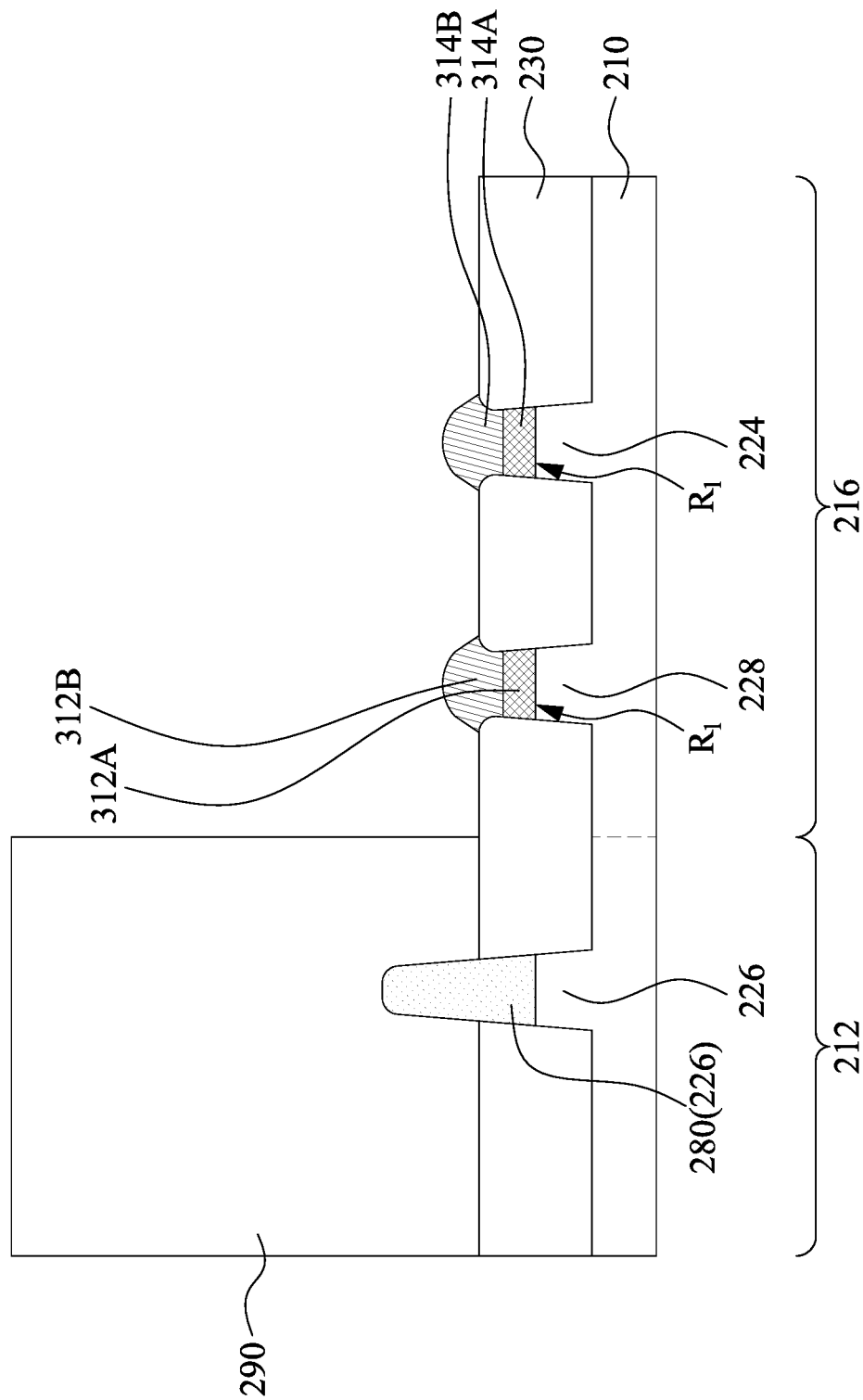
Figure 17D:
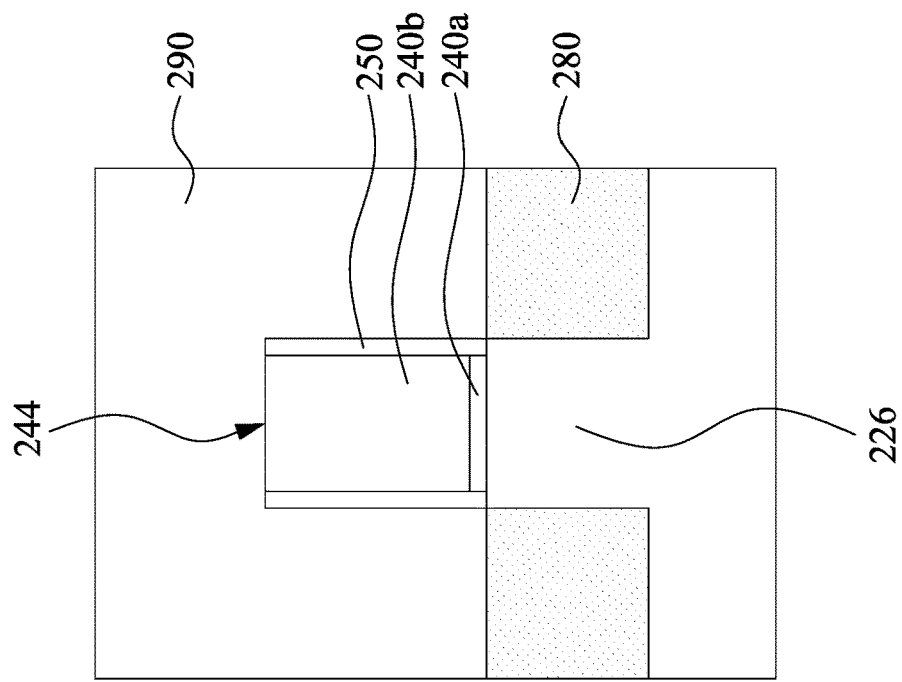
Figure 17C:
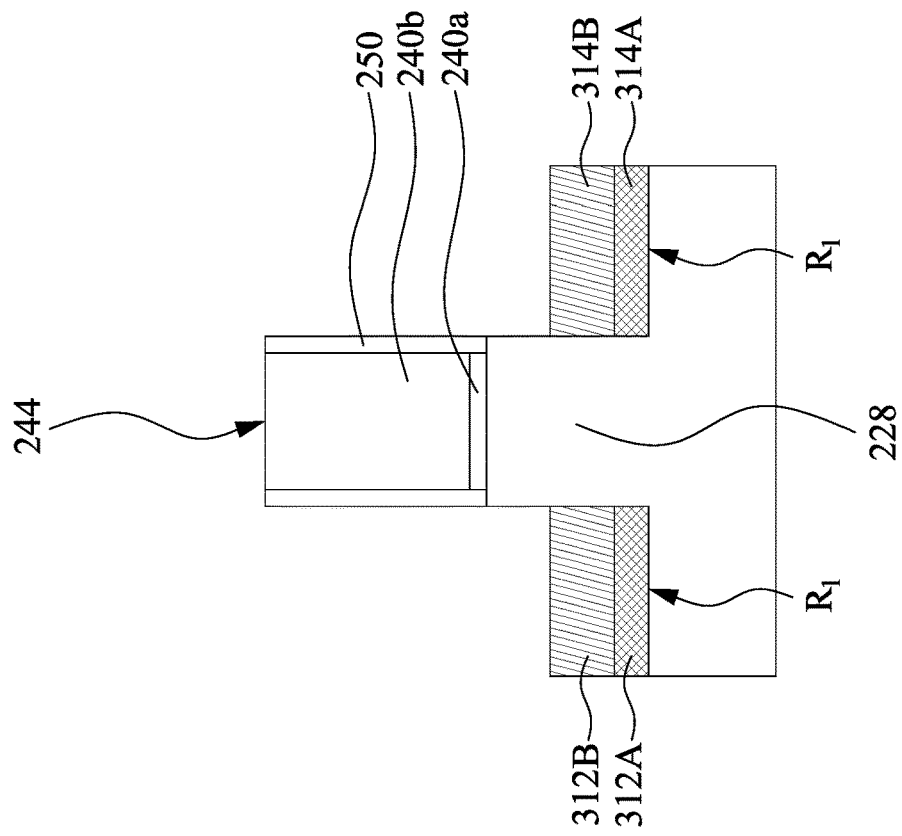

Reference is made to FIGS. 14A, 14B, 14C and 14D. Portions of the semiconductor fins 224 and 228 not covered by the gate stacks 244 and the gate spacers 250 are respectively partially removed (or partially recessed) to form recesses R1. The remaining portions of the semiconductor fins 224 and 228 are embedded in the isolation structures 230. In FIG. 14C, the portion of the semiconductor fin 228 (and/or 224) the gate stacks 244 and the gate spacers 250 protected by the can act as channel regions of transistors. Formation of the recesses R1 may include a dry etching process, a wet etching process, or combination dry and wet etching processes. This etching process may include reactive ion etch (RIE) using the gate stacks 244 and the gate spacers 250 as masks, or by any other suitable removal process.

Reference is made to FIGS. 15A, 15B, 15C and 15D. A pre-cleaning process 300 may be performed to clean the recesses R1. For example, the pre-cleaning process 300 may be performed by using a hydrofluoric-based (HF-based) gas or a SiCoNi-based gas. The pre-clean may remove undesirable silicon oxide that is formed as a result of the nature oxidation of the exposed surfaces in recesses R1. In some embodiments, a high-temperature baking is performed after the pre-clean. In alternative embodiments, the baking step is skipped. In some embodiments, the pre-cleaning process 300 may also etch portions of the isolation structures 230. For example, corners of the isolation structures 230 not covered by the gate stack 244 and the gate spacers 250 are etched to form rounded corners 230C, which in turn will enlarge the recesses R1. Stated another way, the pre-cleaning process 300 etches the isolation structures 230 and thus enlarge the recesses R1.

Reference is made to FIGS. 16A, 16B, 16C and 16D. A plurality of epitaxy layers 312A and 314A are respectively formed in the recesses R1 and respectively on the semiconductor fins 228 and 224. In some embodiments, a semiconductor material, such as silicon germanium (SiGe), is epitaxially grown in recesses R1 through selective epitaxial growth (SEG), forming epitaxy layers 312A and 314A. Hence, throughout the description, epitaxy layers 312A and 314A may also be referred to as SiGe layers 312A and 314A. The process gases may include $H_2$, $N_2$, dichloro-silane (DCS), $SiH_4$, $GeH_4$, and/or the like. The resulting thickness of epitaxy layers 312A and 314A may be between about 200 Å and about 240 Å, such as 220 Å in some embodiments. During the epitaxy, desired p-type impurities may be doped while the growth proceeds. For example, when boron is to be doped, $B_2H_6$ may be included in the process gases. Thus, the epitaxy layers 312A and 314A may also be referred to as p-type epitaxy layers 312A and 314A. In some embodiments, the concentration of the p-type impurity in the epitaxy layers 312A and 314A may be in a range from about $2\times10^{17}$ $cm^{-3}$ to about $6\times10^{19}$ $cm^{-3}$.

Reference is made to FIGS. 17A, 17B, 17C and 17D. A plurality of epitaxy layers 312B and 314B are formed respectively in the recesses R1 and respectively over the epitaxy layers 312A and 314A. In some embodiments, the epitaxy layers 312B and 314B are grown through an epitaxy. In some embodiments, epitaxy layers 312B and 314B are SiGe layers, which have a germanium atomic percentage higher than the germanium atomic percentage in epitaxy layers 312A and 314A. The process conditions for forming epitaxy layers 312B and 314B may be similar to the process conditions for forming epitaxy layers 312A and 314A, but the gas precursor used in forming the layers 312B and 314B has higher germanium-containing gas concentration than that used in forming the layers 312A and 314A. For example, the ratio of germanium-containing gas to silicon-containing gas in the epitaxy process of the layers 312B and 314B is higher than that of the layers 312A and 314A. The resulting thickness of epitaxy layers 312B and 314B may be between about 450 Å and about 550 Å, such as 500 Å in some embodiments. During the epitaxy, desired p-type impurities may be in-situ doped while the growth proceeds. For example, when boron is to be doped, $B_2H_6$ may be included in the process gases. Thus, the epitaxy layers 312B and 314B may also be referred to as p-type epitaxy layers 312B and 314B. In some embodiments, the concentration of the p-type impurity in the epitaxy layers 312B and 314B may be in a range from about $7 \times 10^{19}$ cm$^{-3}$ to about $1 \times 10^{20}$ cm$^{-3}$. In some embodiments, the epitaxy layers 312B and 314B have higher dopant concentration respectively than the epitaxy layers 312A and 314A.

Reference is made to FIGS. 18A, 18B, 18C, 18D, and 18E. A plurality of epitaxy layers 312C and 314C are formed respectively on the epitaxy layers 312B and 314B. In some embodiments, the epitaxy layers 312C and 314C are formed through epitaxy. The epitaxy layers 312C and 314C may have a composition (including the elements contained therein and the percentages of the elements) different from the composition of epitaxy layers 312B and 314B. The epitaxy layers 312C and 314C may be pure silicon layers with no germanium comprised therein, or substantially pure silicon layers with, for example, less than 2 percent, or one percent, germanium. In some other embodiments, the epitaxy layers 312C and 314C may also be SiGe layers, with the germanium concentration in the epitaxy layers 312C and 314C lower than the germanium concentration in the epitaxy layers 312B and 314B. In some embodiments, the epitaxy layers 312C and 314C do not undergo an in-situ doping process. That is, either an n-type impurity or a p-type impurity is not involved in the epitaxy process of the epitaxy layers 312C and 314C. Stated differently, the layers 312C and 314C are epitaxially grown in an environment that is free from n-type and p-type impurities. Thus, in some embodiments, the epitaxy layers 312C and 314C is free from n-type and p-type dopants or with relative lower composition of n-type and p-type dopants compared to underlying epitaxy layers 312A, 312B, 314A and 314B. The resulting thickness of epitaxy layers 312C and 314C may be between about 18 Å and about 22 Å, such as 20 Å in some embodiments.

Figure 18A:
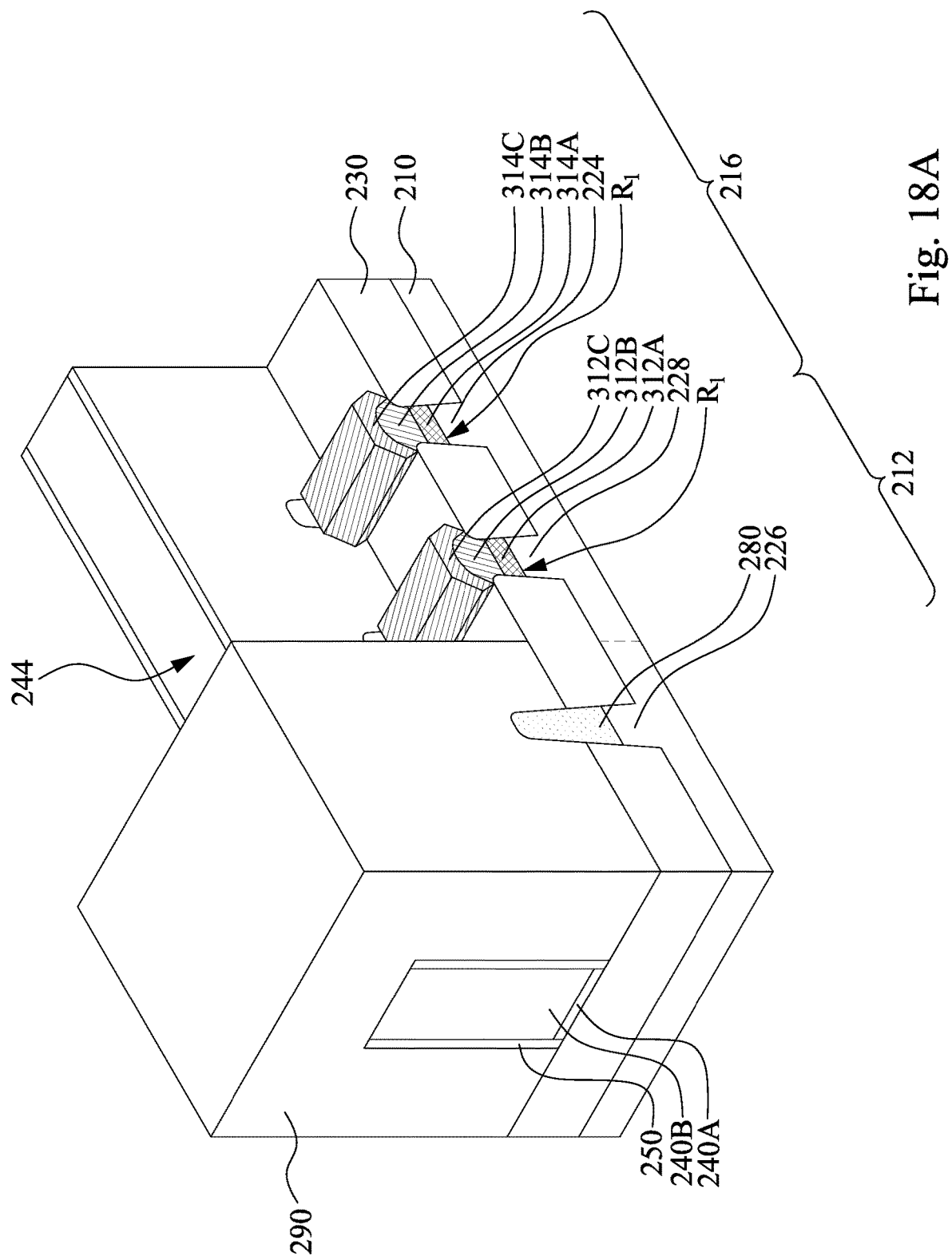
Figure 18B:
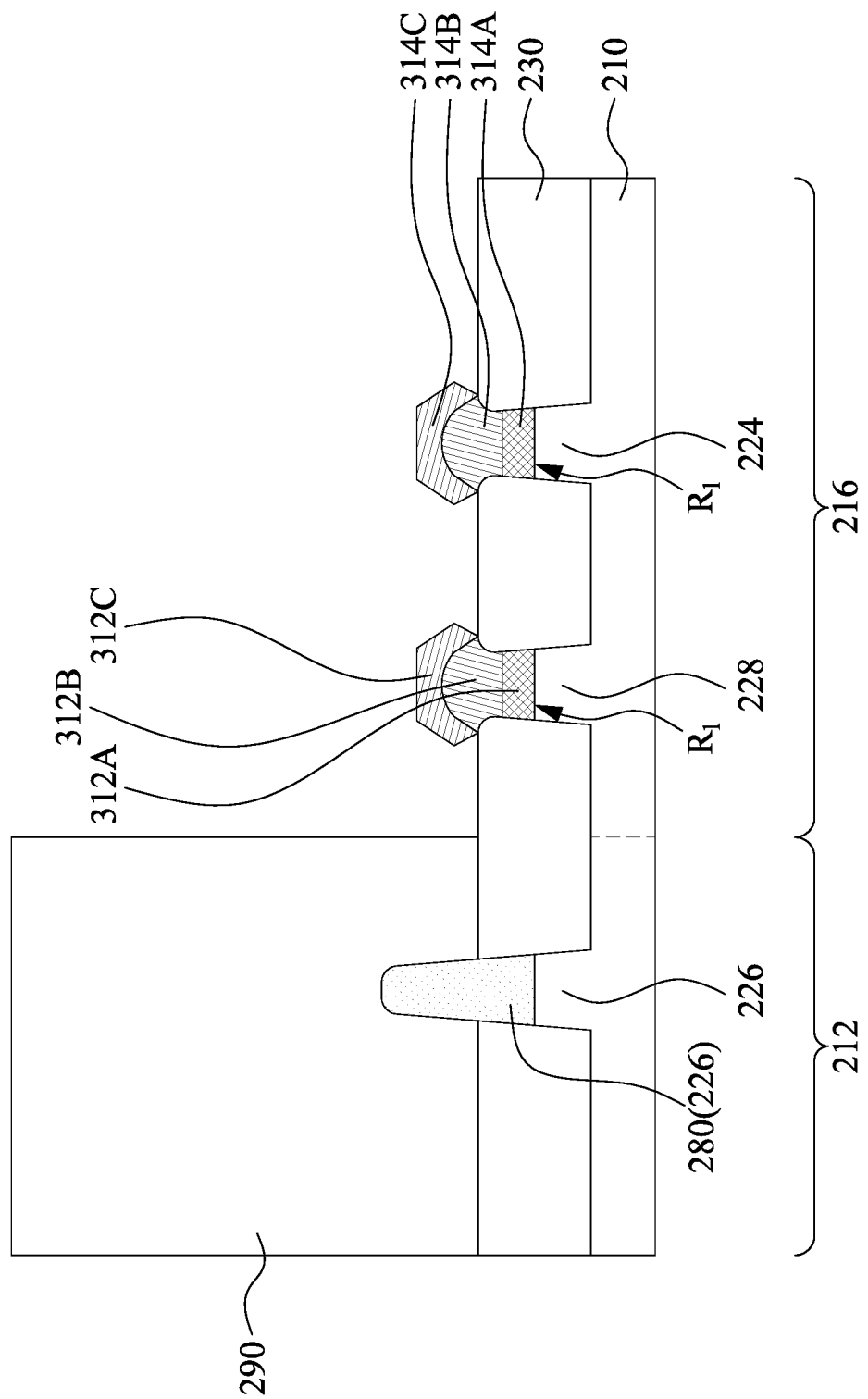
Figure 18D:
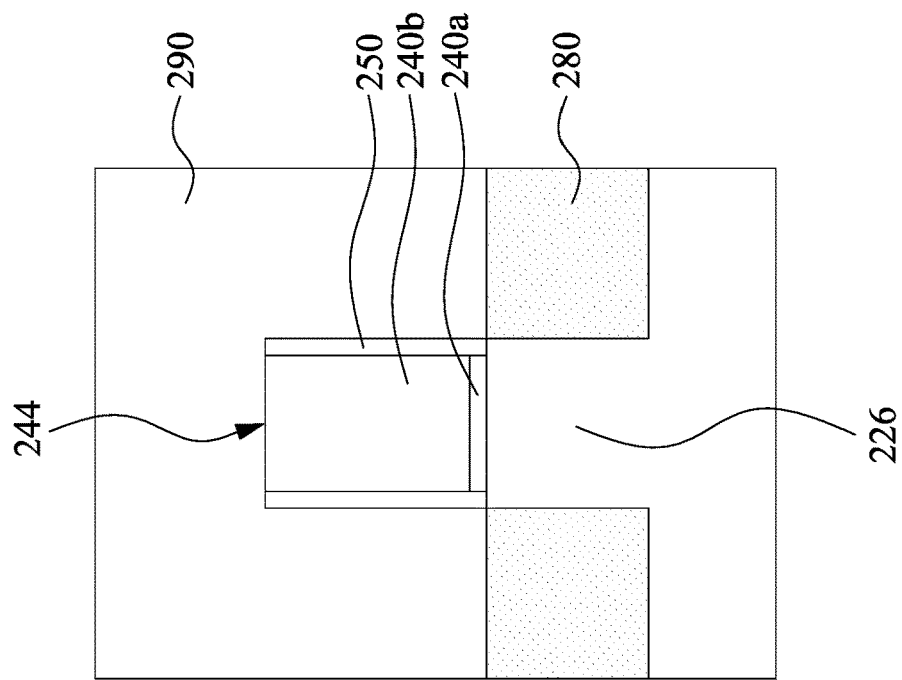
Figure 18C:
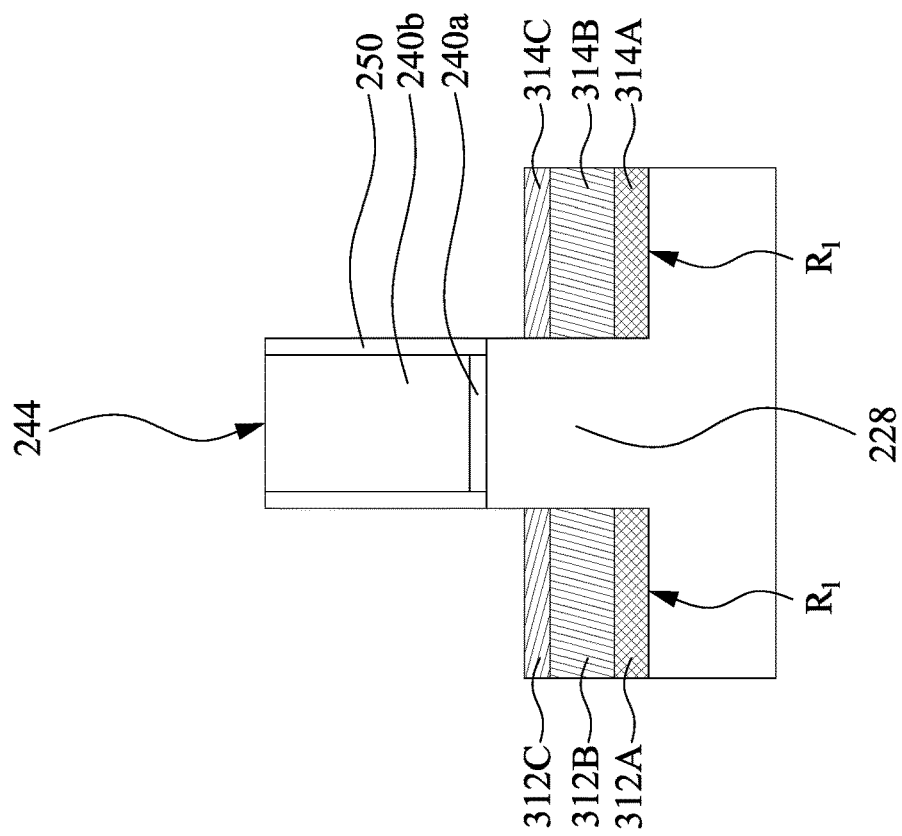
Figure 18E:
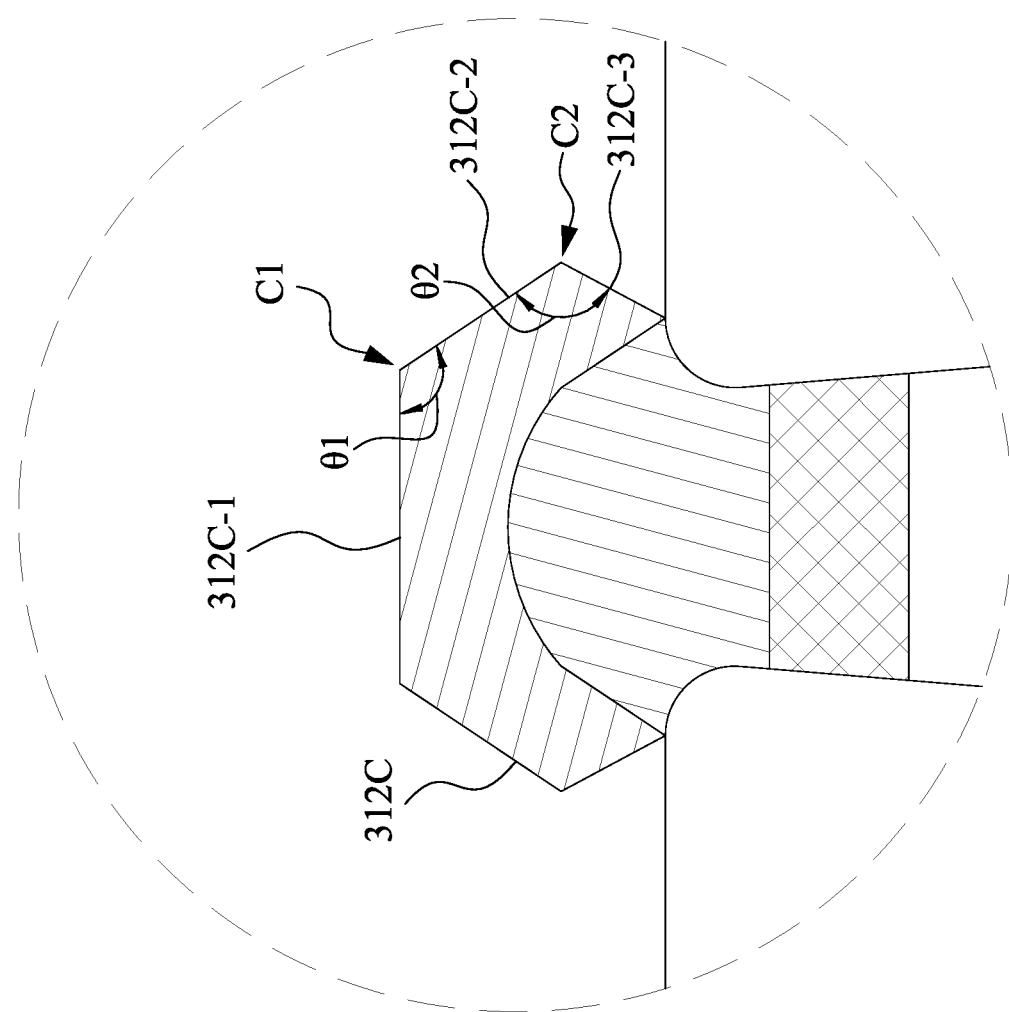
Figure 19A:
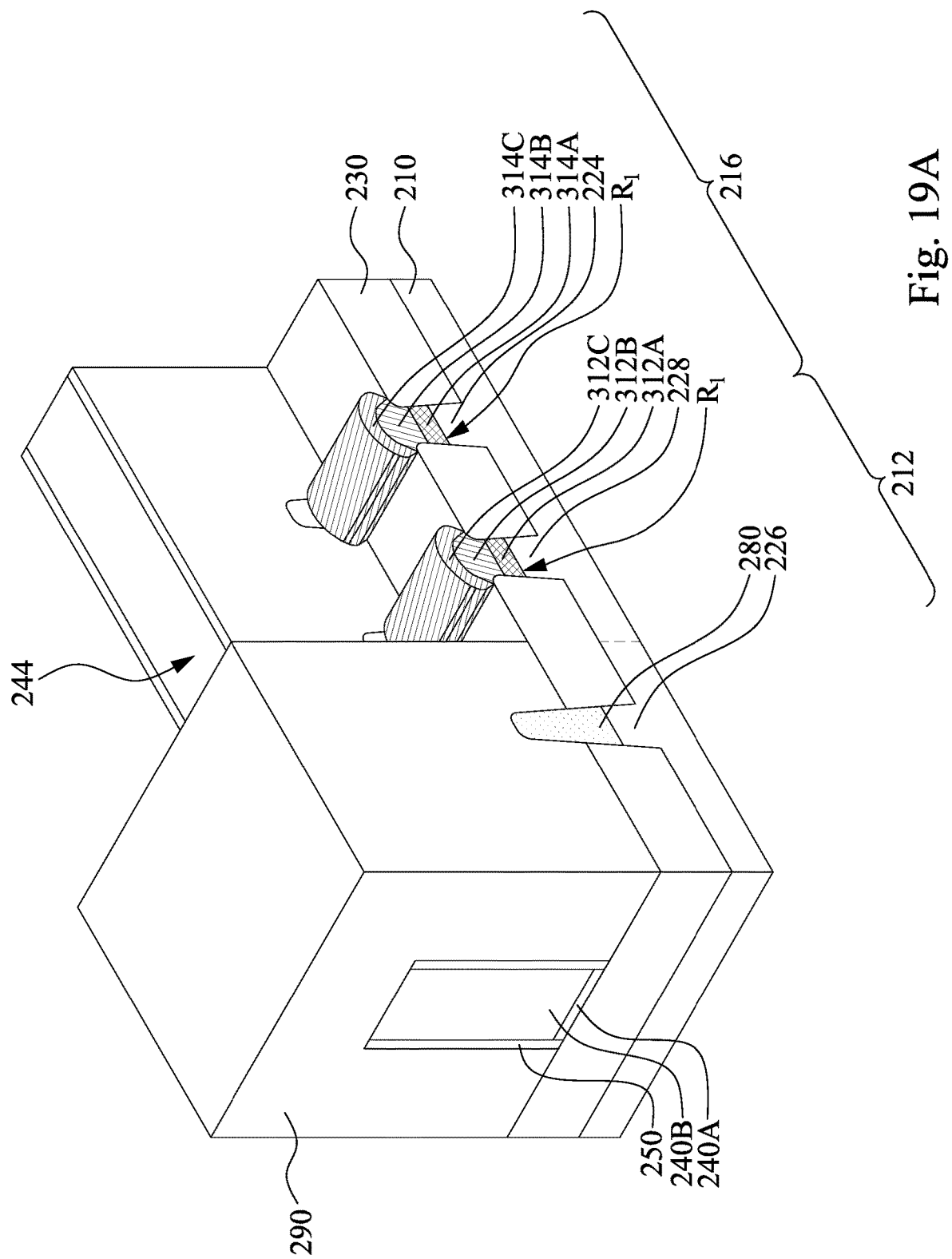
Figure 19B:
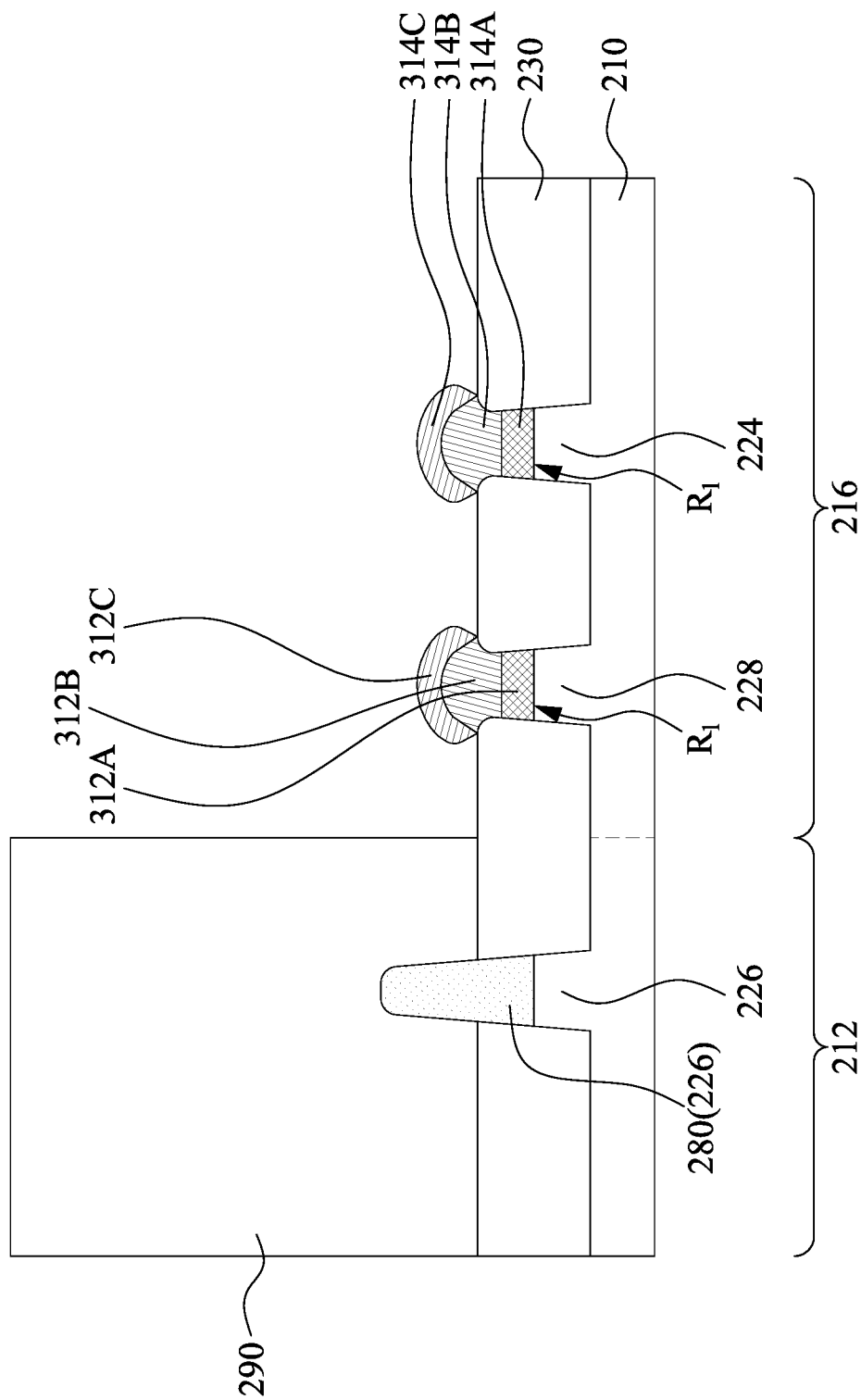
Figure 19D:
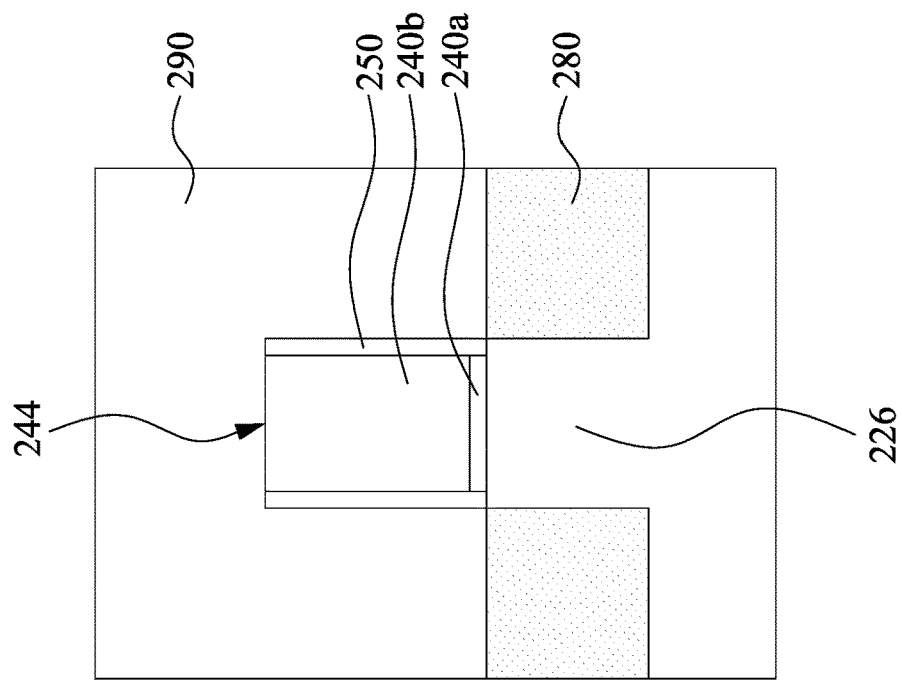
Figure 19C:
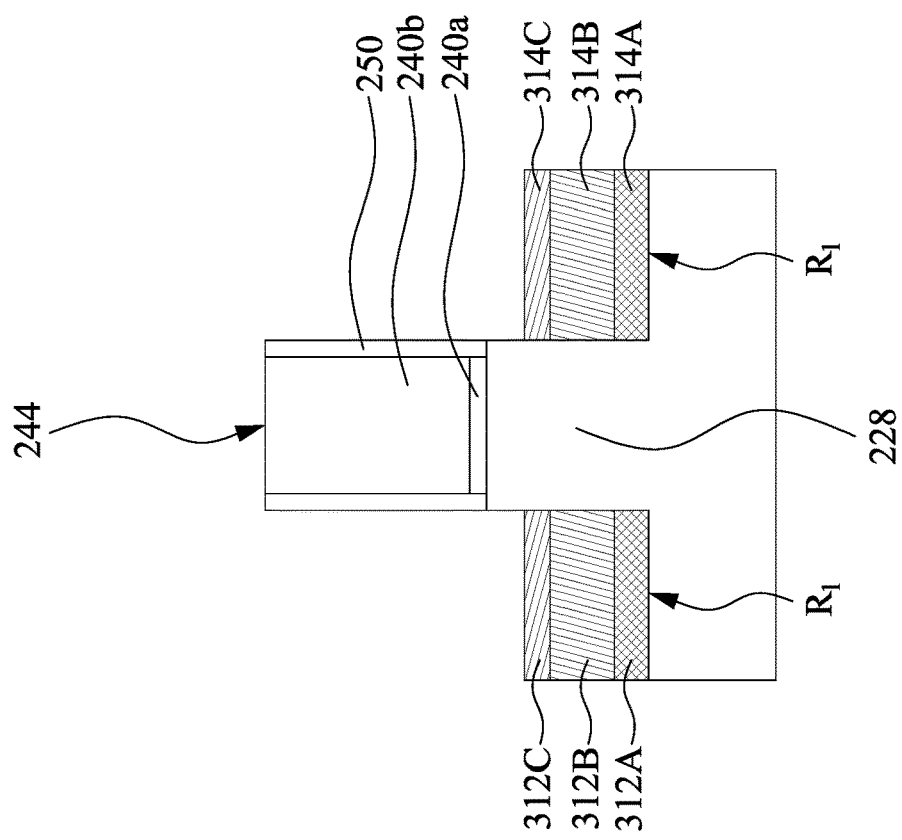
Figure 19E:
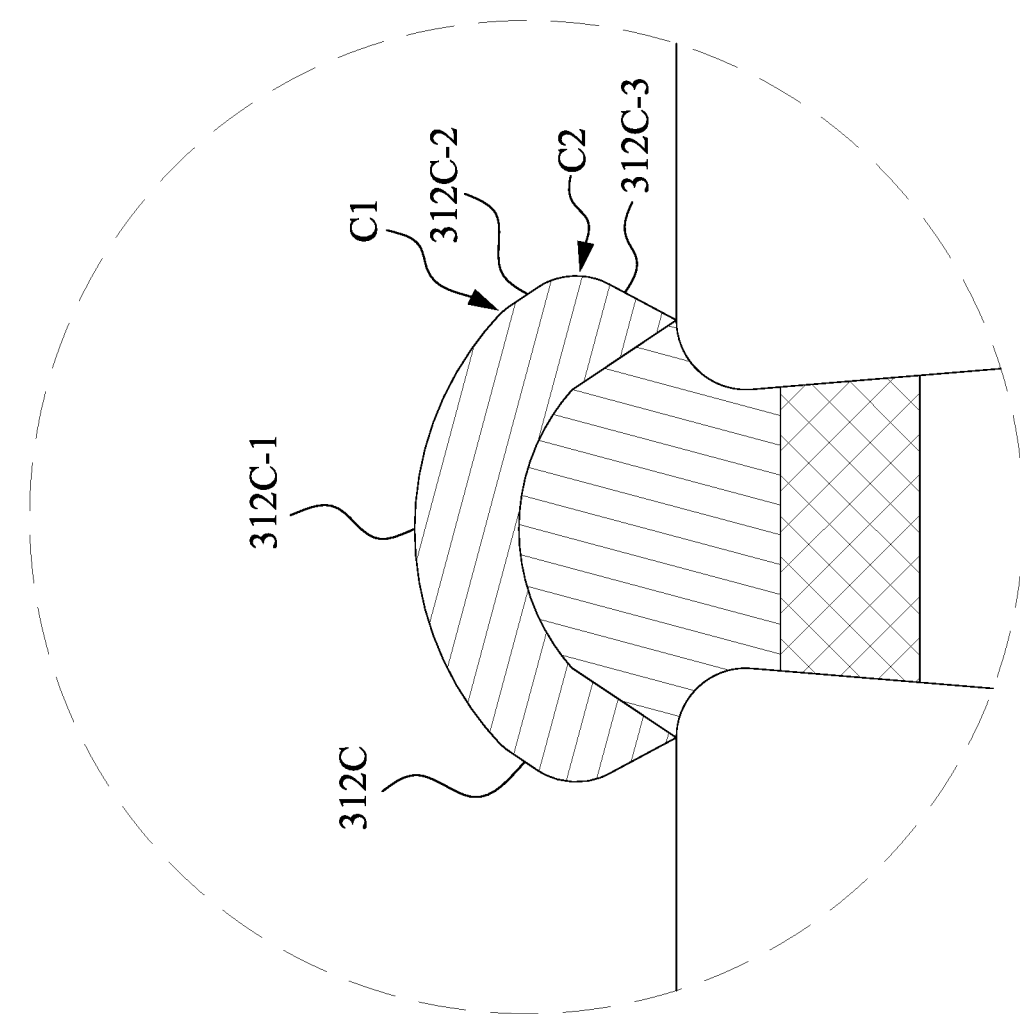

Referring to FIG. 18E, FIG. 18E is an enlarged view of the epitaxy layer 312C. In some embodiments, the crystalline growth of the epitaxy layer 312C results in a top surface 312C-1, a first facet 312C-2, and a second facet 312C-3. The top surface 312C-1 is connected to the first facet 312C-2 and forms a corner C1 therebetween, and the first facet 312C-2 is connected to the second facet 312C-3 and forms a corner C2 therebetween. The corner C1 has an angle θ1 and the corner C2 has an angle θ2. In some embodiments, the top surface 312C-1 has (001) crystalline orientation. On the other hand, the first facet 312C-2 and the second facet 312C-3 have (111) crystalline orientation. In some embodiments, the angle θ1 of corner C1 is in a range from about 120° to about 130°. In some embodiments, the angle θ2 of corner C2 is in a range from about 100° to about 120°. For example, the angle θ2 may be about 109.4°. It is noted that the facets opposite to the first facets 312C-2 and the second facet 312C-3 have similar property, and thus relevant structural detail will not be repeated hereinafter. The first and second facets 312C-2 and 312C-3 can be collectively referred to as the sidewall of the epitaxy layer 312C. In some embodiments, the epitaxy layer 314C has substantially the same shape as the epitaxy layer 312C described in FIG. 18E, and thus relevant structural detail will not be repeated hereinafter.

Reference is made to FIGS. 19A, 19B, 19C, 19D, and 19E. An etching process is performed to remove portions of the epitaxy layers 312C and 314C. In some embodiments, the epitaxy layers 312C and 314C may be selectively etched to modify the corners of the epitaxy layers 312C and 314C to create rounded corners. For example, referring to FIG. 19E, in an enlarged view of the epitaxy layer 312C, the corners C1 and C2 are rounded by the etching process, which in turn reduces the lateral width of the epitaxy layer 312C. In some embodiments, etching the epitaxy layers 312C and 314C in its initial angular form tends to remove more material at the corners than on the flat portions due to the different ratios of surface area to volume. In some embodiments, the top surface 312C-1 of the epitaxy layer 312C is also rounded during the etching process. The etching process may, in some embodiments, be performed using an hydrochloric acid (HCl) solution at a pressure between about 10 torr and about 15 torr, and at a temperature between about 720° C. and about 750° C.

Reference is made to FIGS. 20A, 20B, 20C, 20D, and 20E. A plurality of epitaxy layers 312D and 314D are formed respectively on the epitaxy layers 312C and 314C. In some embodiments, the epitaxy layers 312D and 314D are formed through epitaxy. The epitaxy layers 312D and 314D may be pure silicon layers with no germanium comprised therein, or substantially pure silicon layers with, for example, less than 2 percent, or one percent, germanium. The epitaxy layers 312D and 314D may also be SiGe layers, with the germanium concentration in the epitaxy layers 312D and 314D lower than the germanium concentration in the epitaxy layers 312B and 314B. During the epitaxy of the epitaxy layers 312D and 314D, a p-type impurity such as boron may be in-situ doped with the proceeding of the epitaxy. Thus, the epitaxy layers 312D and 314D may also be referred to as p-type epitaxy layers 312D and 314D. In some embodiments, the concentration of the p-type impurity in the epitaxy layers 312D and 314D may be in a range from about $1 \times 10^{20}$ cm$^{-3}$ to about $2 \times 10^{21}$ cm$^{-3}$. The resulting thickness of epitaxy layers 312D and 314D may be between about 80 Å and about 100 Å, such as 90 Å in some embodiments. In some embodiments, the epitaxy layers 312D and 314D have higher thicknesses respectively than the epitaxy layers 312C and 314C.

Figure 20A:
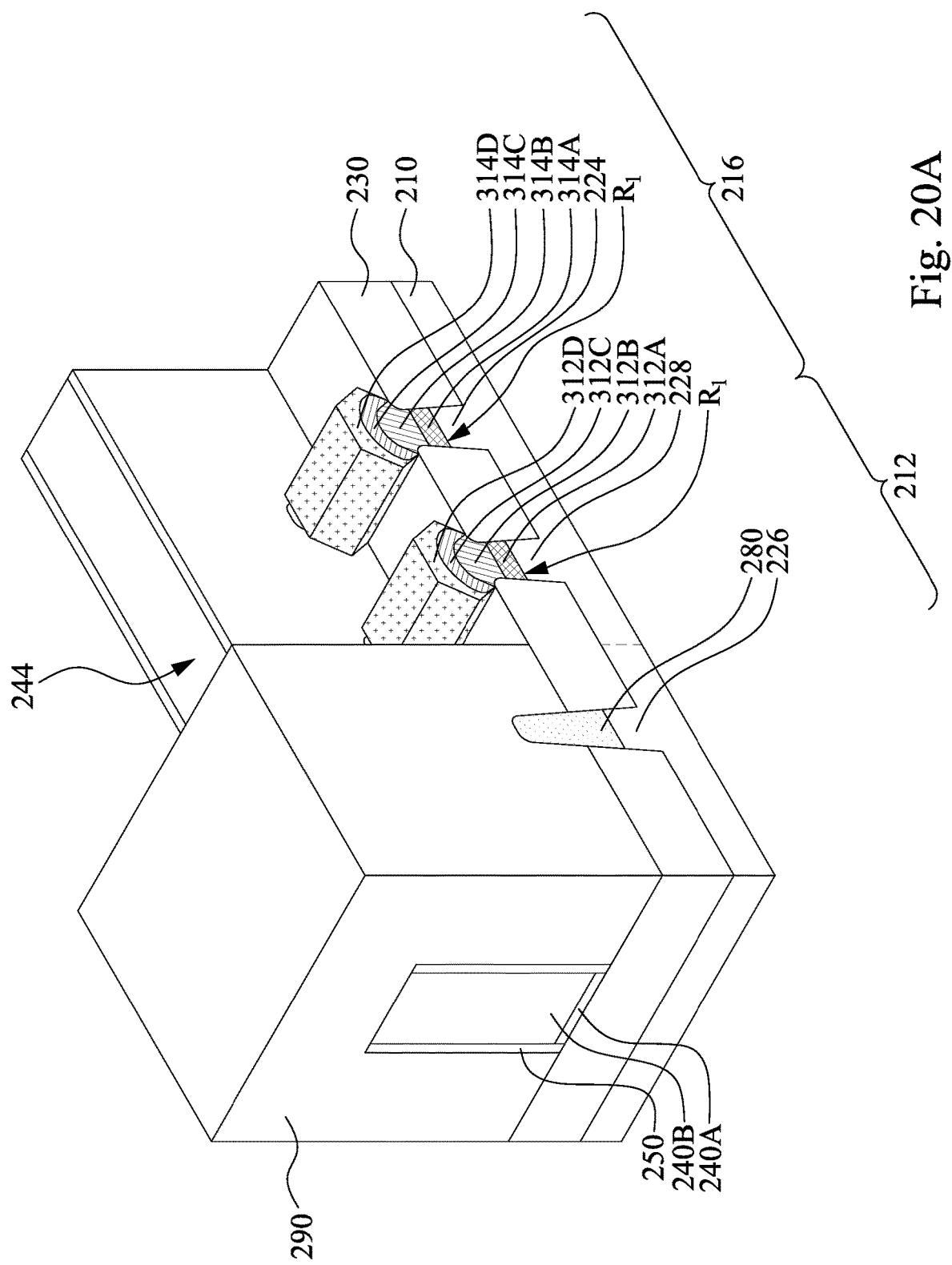
Figure 20B:
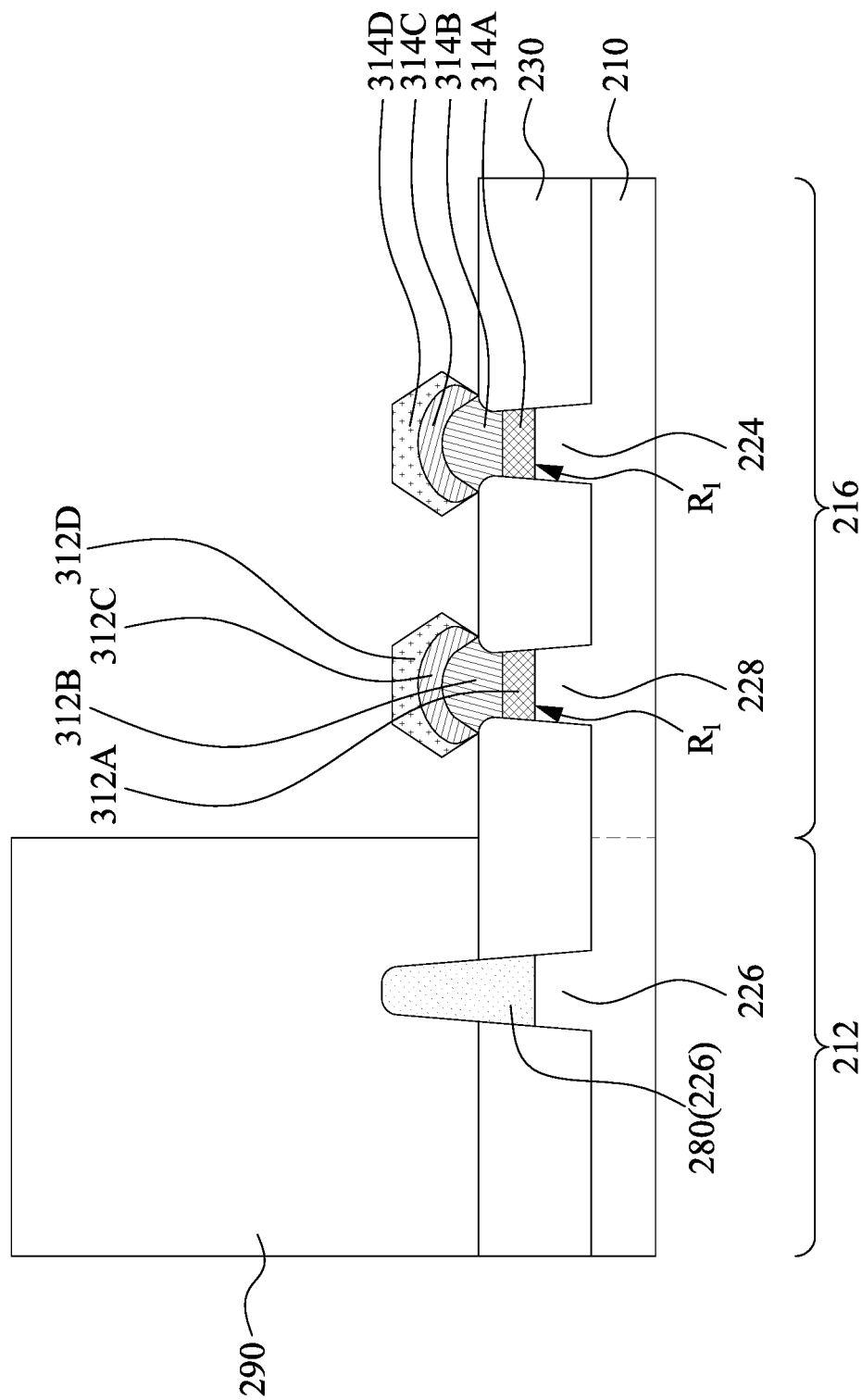
Figure 20D:
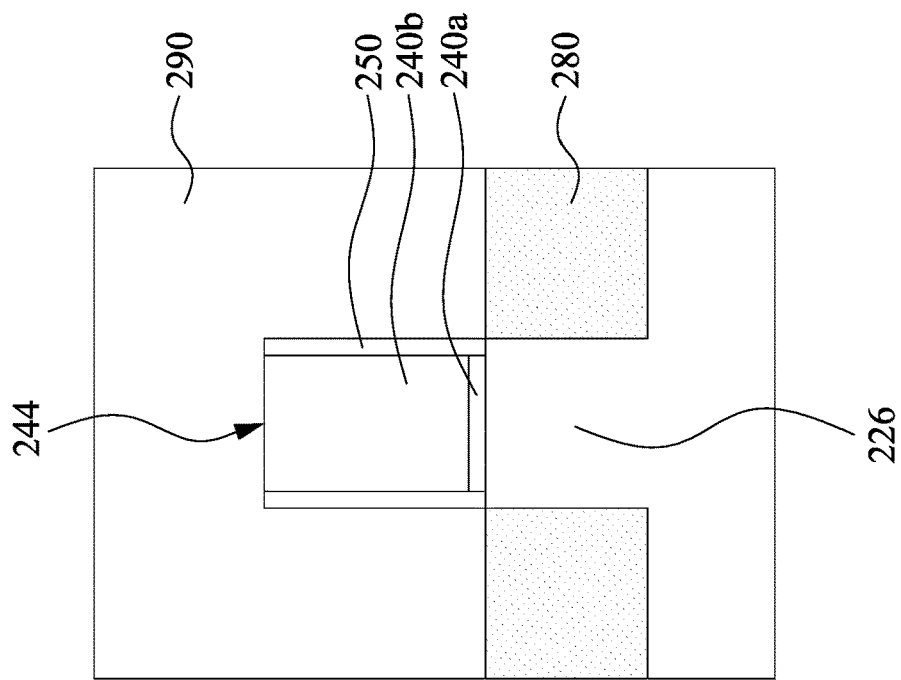
Figure 20C:
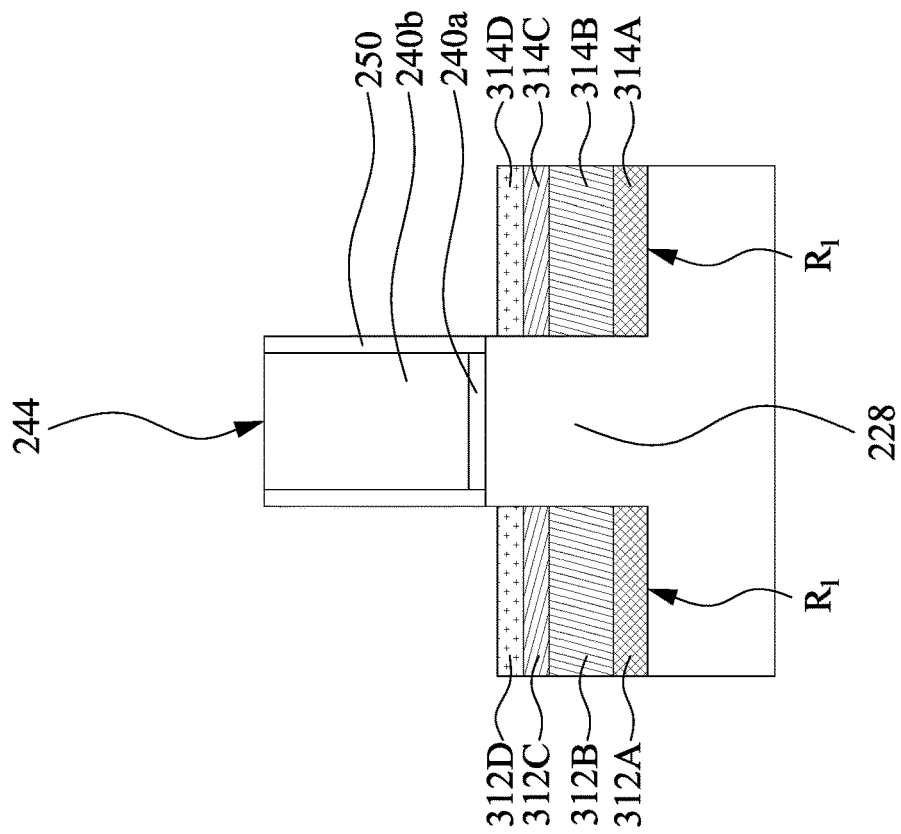
Figure 20E:
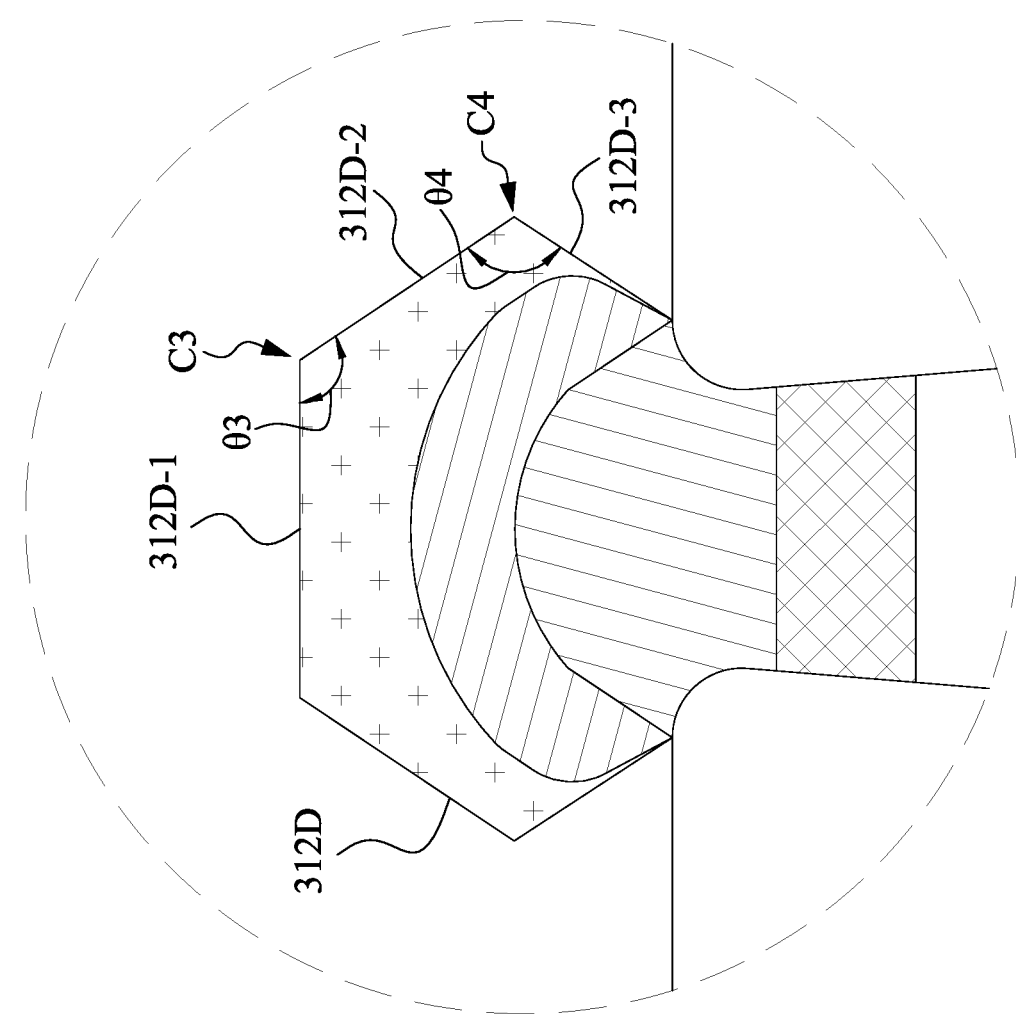
Figure 21A:
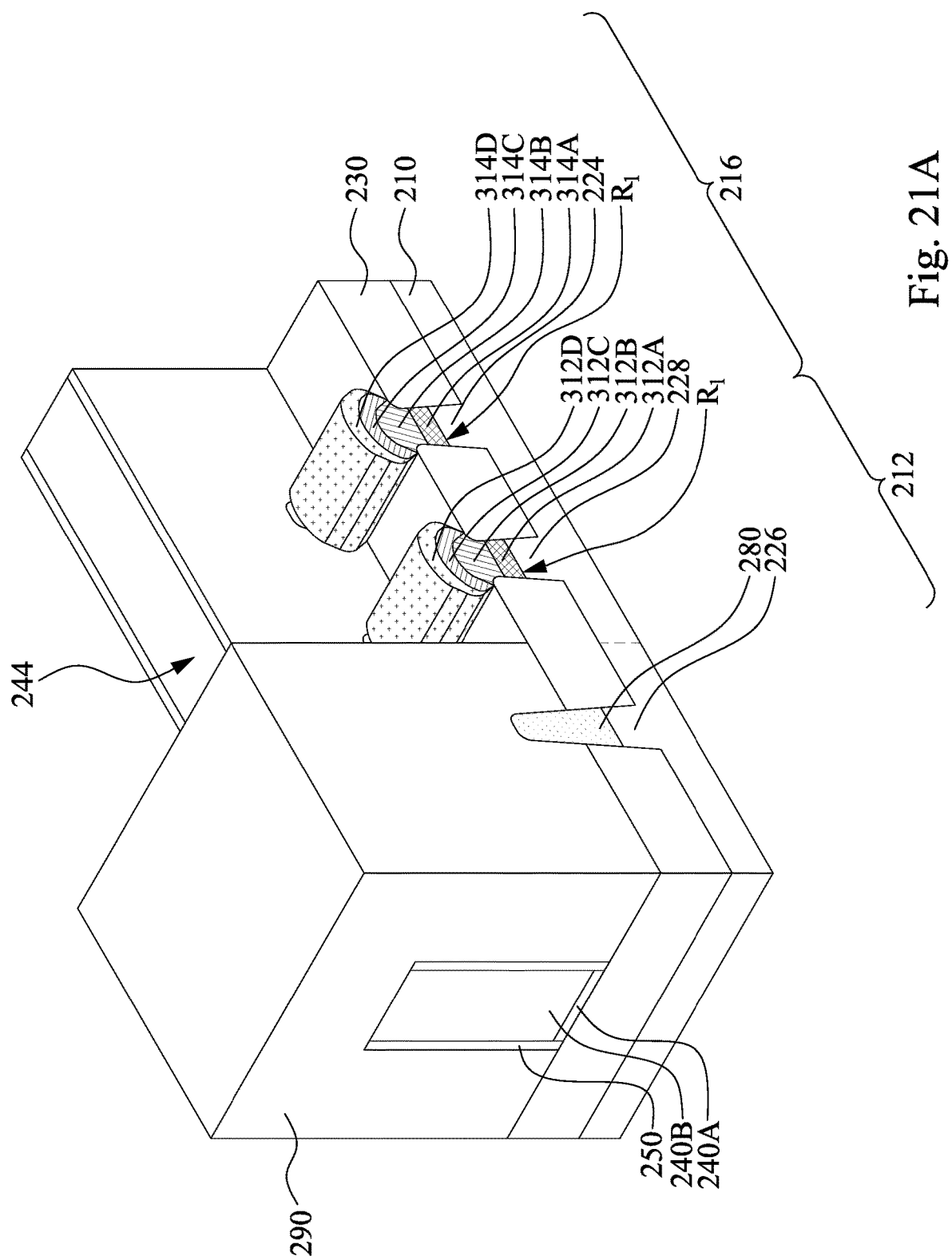
Figure 21B:
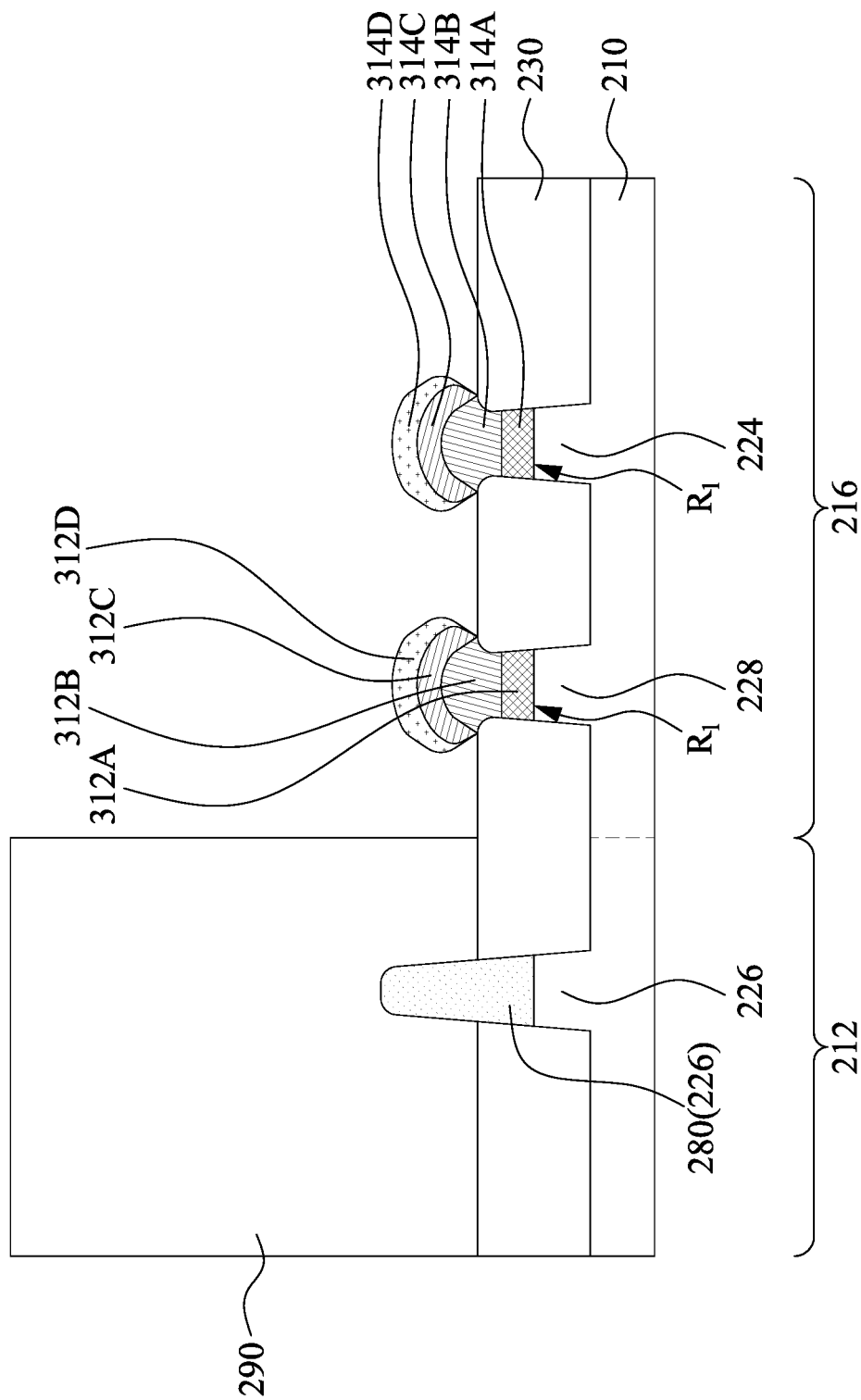
Figure 21D:
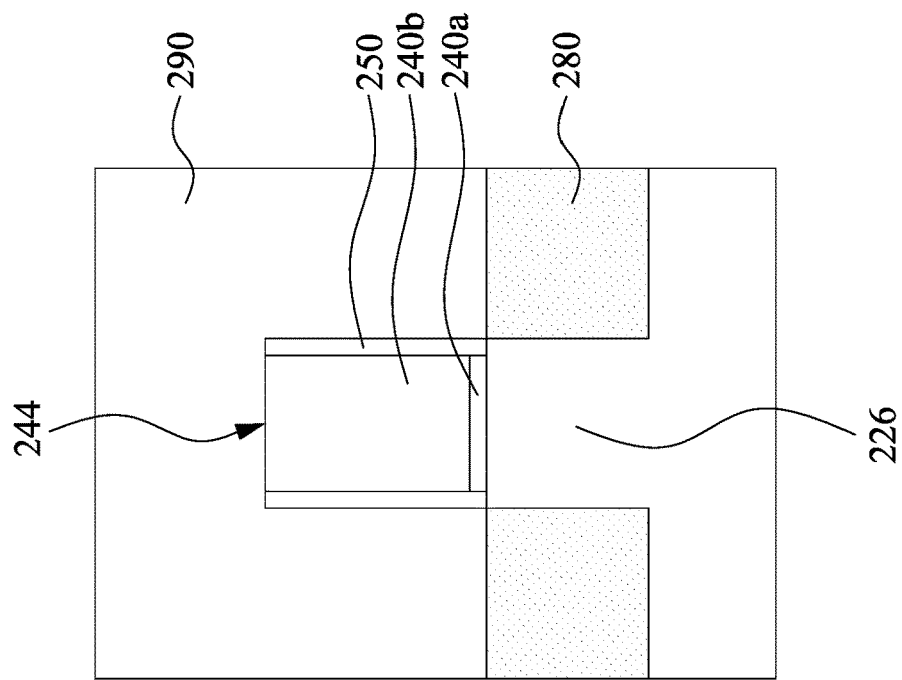
Figure 21C:
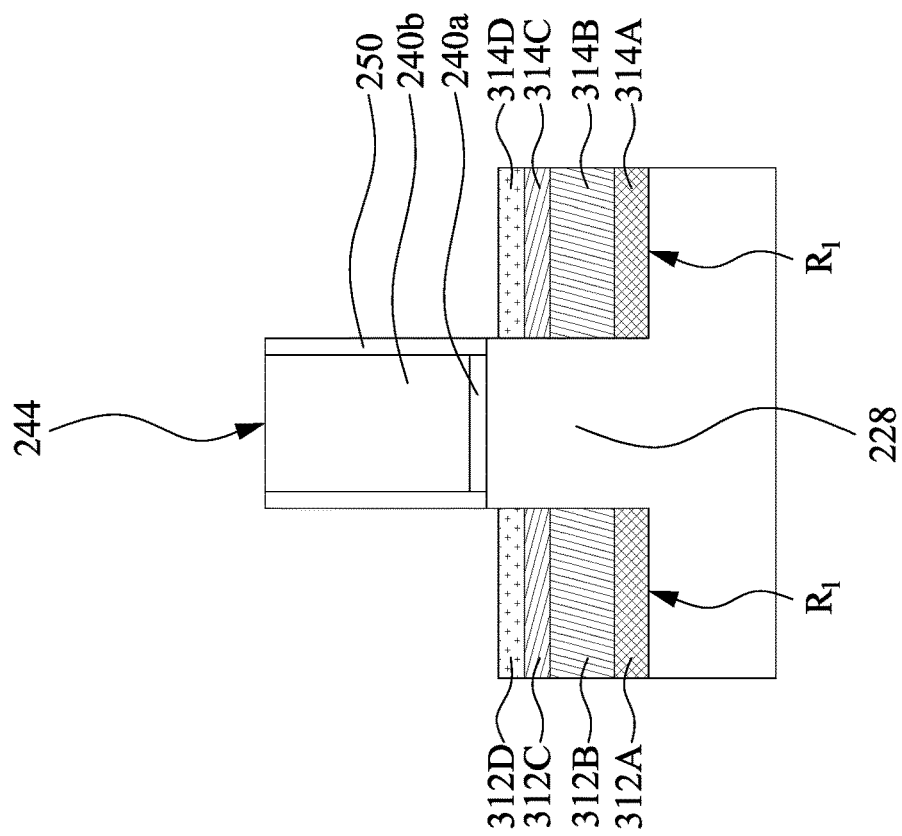
Figure 21E:
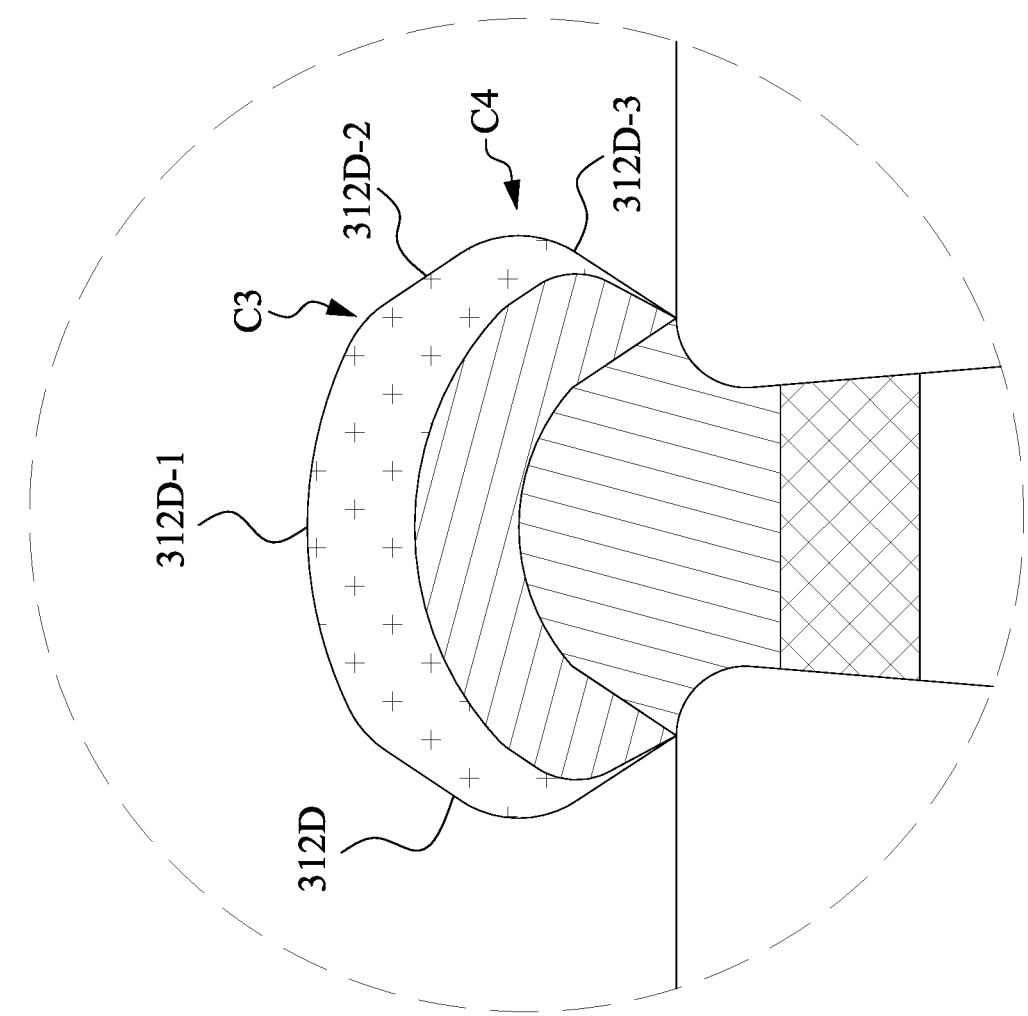

Referring to FIG. 20E, FIG. 20E is an enlarged view of the epitaxy layer 312D. In some embodiments, the crystalline growth of the epitaxy layer 312D results in a top surface 312D-1, a first facet 312D-2, and a second facet 312D-3. The top surface 312D-1 is connected to the first facet 312D-2 and forms a corner C3 therebetween, and the first facet 312D-2 is connected to the second facet 312D-3 and forms a corner C4 therebetween. The corner C3 has an angle θ3 and the corner C4 has an angle θ4. In some embodiments, the top surface 312D-1 has (001) crystalline orientation. On the other hand, the first facet 312D-2 and the second facet 312D-2 have (111) crystalline orientation. In some embodiments, the angle θ3 is in a range from about 120° to about 120°. In some embodiments, the angle θ4 in a range from about 100° to about 120°. For example, the angle θ4 of corner C4 may be about 109.4°. It is noted that the facets opposite to the first facets 312D-2 and the second facet 312D-3 have similar property, and thus relevant structural detail will not be repeated hereinafter. The first and second facets 312D-2 and 312D-3 can be collectively referred to as the sidewall of the epitaxy layer 312D. In some embodiments, the epitaxy layer 314D has substantially the same shape as the epitaxy layer 312D described in FIG. 20E, and thus relevant structural detail will not be repeated hereinafter.

Reference is made to FIGS. 21A, 21B, 21C, 21D, and 21E. An etching process is performed to remove portions of the epitaxy layers 312D and 314D. In some embodiments, the epitaxy layers 312D and 314D may be selectively etched to modify the corners of the epitaxy layers 312D and 314D to create rounded corners. For example, referring to FIG. 21E, in an enlarged view of the epitaxy layer 312D, the corners C3 and C4 are rounded by the etching process, which in turn reduces the lateral width of the epitaxy layer 312D. In some embodiments, etching the epitaxy layers 312D and 314D tends to remove more material at the corners than on the flat portions due to the different ratios of surface area to volume between corners and flat portions. In some embodiments, the top surface 312D-1 of the epitaxy layer 312D is also rounded during the etching process. The etching process may, in some embodiments, be performed using an hydrochloric acid (HCl) solution at a pressure between about 10 torr and about 15 torr, and at a temperature between about 720° C. and about 750° C.

Reference is made to FIGS. 22A, 22B, 22C, 22D, and 22E. A plurality of epitaxy layers 312E and 314E are formed respectively on the epitaxy layers 312D and 314D. In some embodiments, the epitaxy layers 312E and 314E are formed through epitaxy. The epitaxy layers 312E and 314E may be pure silicon layers with no germanium comprised therein, or substantially pure silicon layers with, for example, less than 2 percent, or one percent, germanium. During the epitaxy of the epitaxy layers 312E and 314E, a p-type impurity such as boron may be in-situ doped with the proceeding of the epitaxy. Thus, the epitaxy layers 312E and 314E may also be referred to as p-type epitaxy layers 312E and 314E. In some embodiments, the concentration of the p-type impurity in the epitaxy layers 312E and 314E may be in a range from about $1 \times 10^{21}$ cm$^{-3}$ to about $4 \times 10^{21}$ cm$^{-3}$. The resulting thickness of epitaxy layers 312E and 314E may be between about 80 Å and about 100 Å, such as 90 Å in some embodiments. In some embodiments, the epitaxy layers 312E and 314E have higher dopant concentrations respectively than the epitaxy layers 312D and 314D. In some embodiments, the epitaxy layers 312E and 314E have higher thicknesses respectively than the epitaxy layers 312C and 314C.

In some embodiments, the epitaxy layers 312A to 312B and 314A to 314B are SiGe layers, and the epitaxy layers 312C to 312E and 314E to 314E are pure silicon layers with no germanium comprised therein, or substantially pure silicon layers with, for example, less than 2 percent, or one percent, germanium. Stated another way, the germanium concentrations in the epitaxy layers 312A to 312B and 314A to 314B are greater than the germanium concentrations in the epitaxy layers 312C to 312E and 314E to 314E.

Figure 22A:
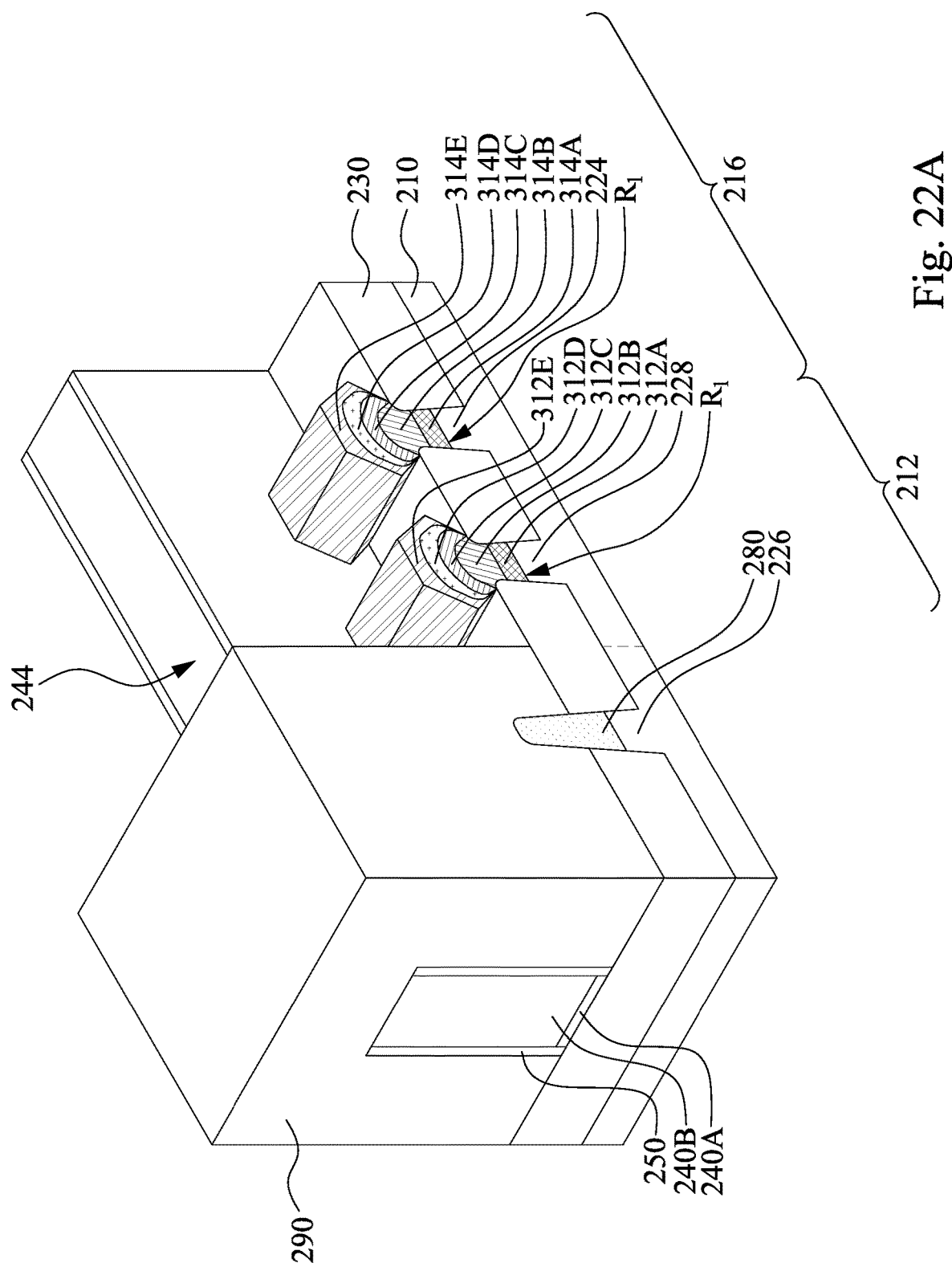
Figure 22B:
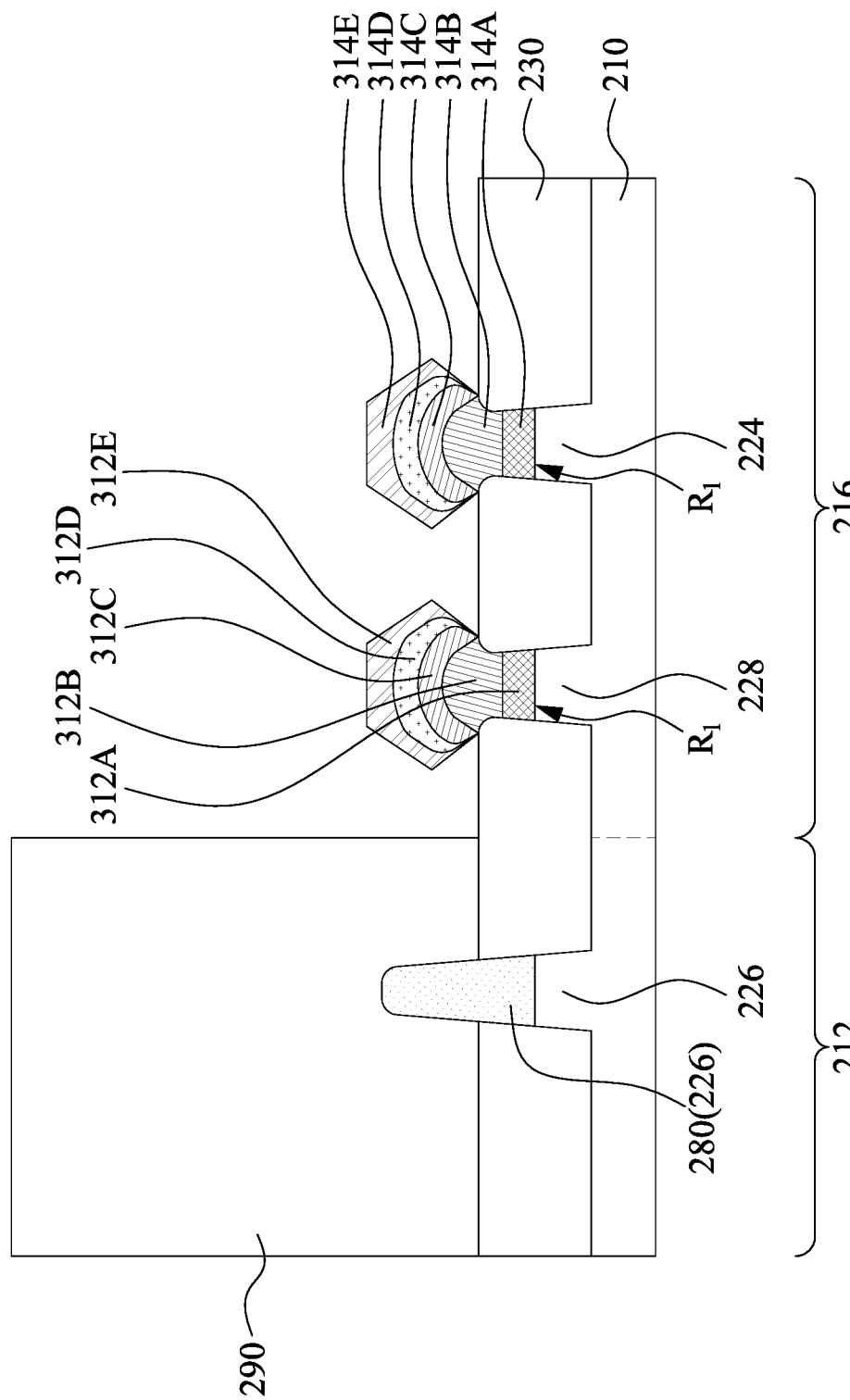
Figure 22D:
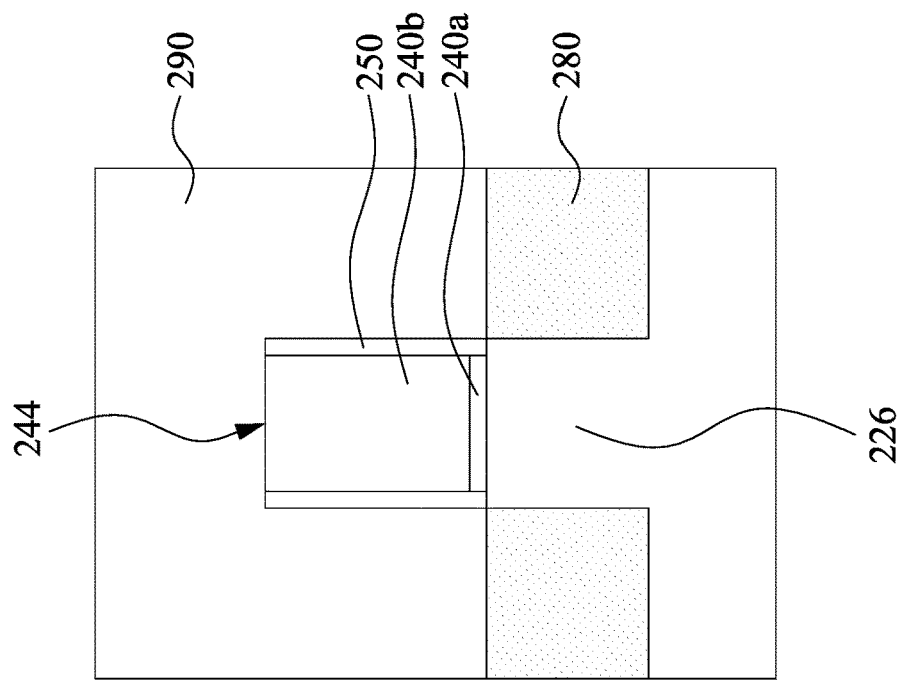
Figure 22C:
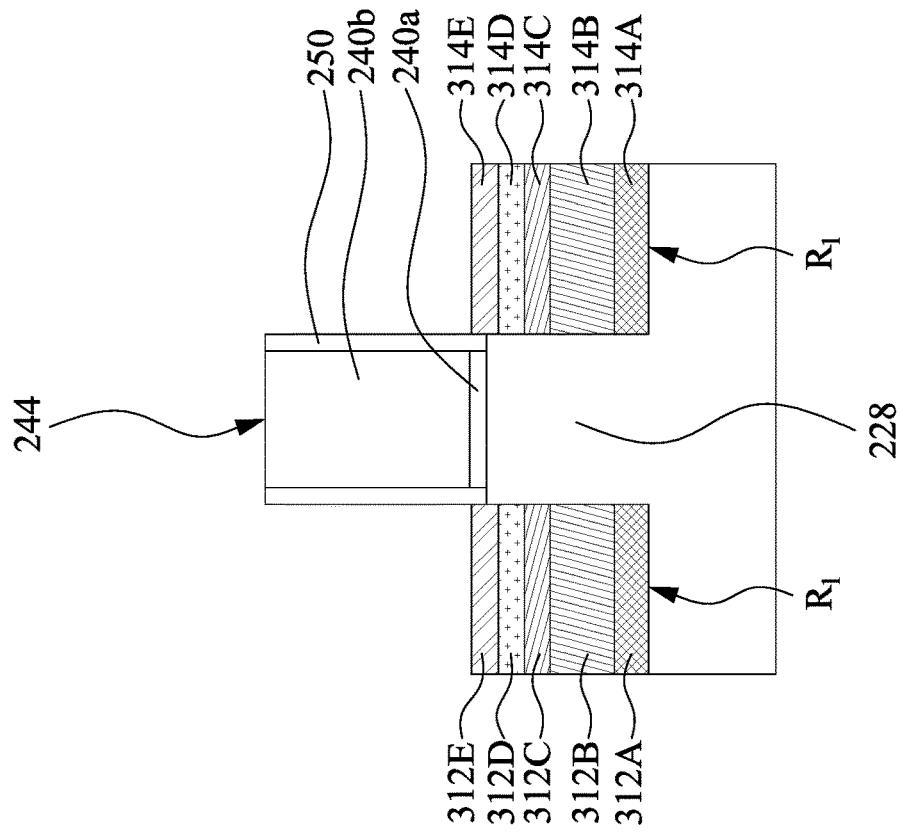
Figure 22E:
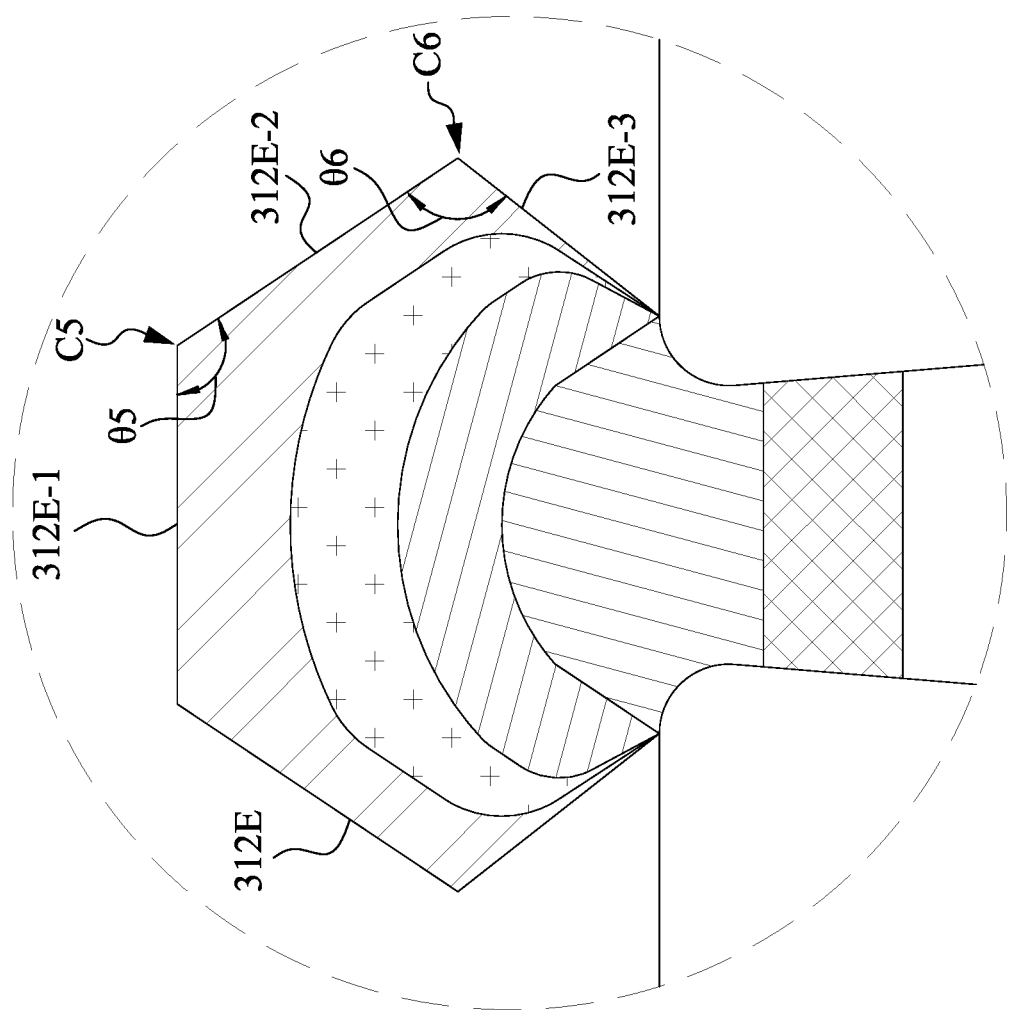
Figure 23A:
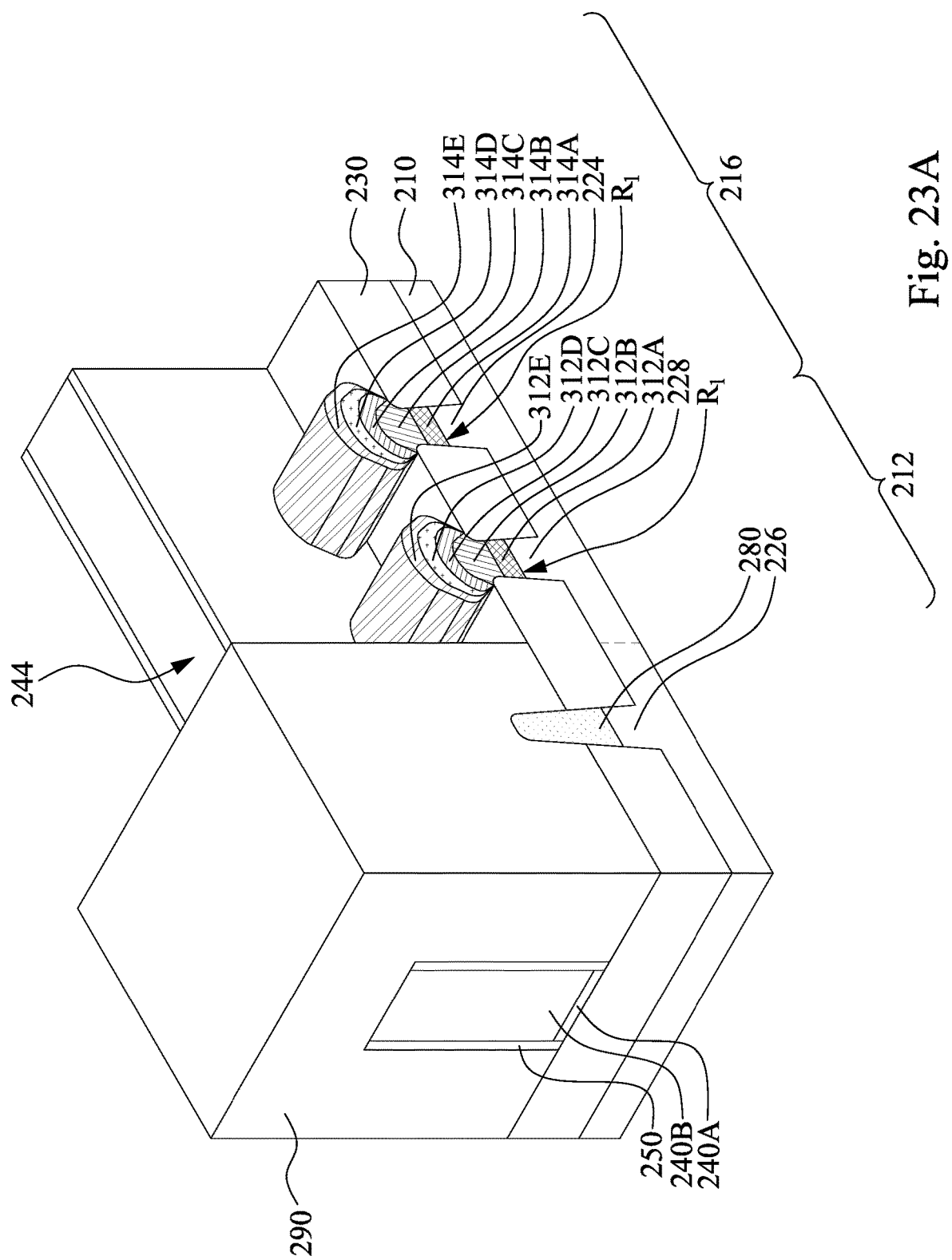
Figure 23B:
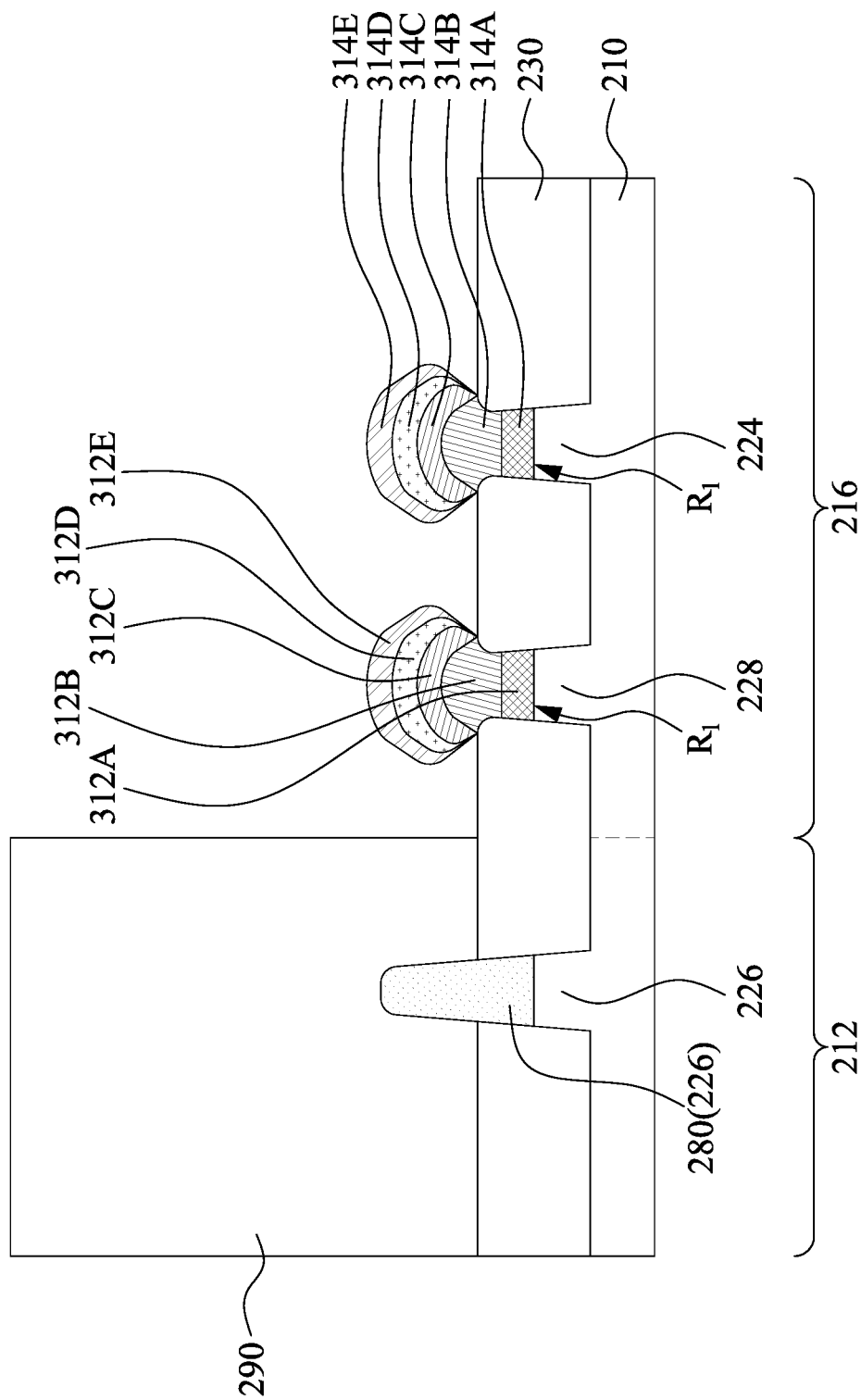
Figure 23D:
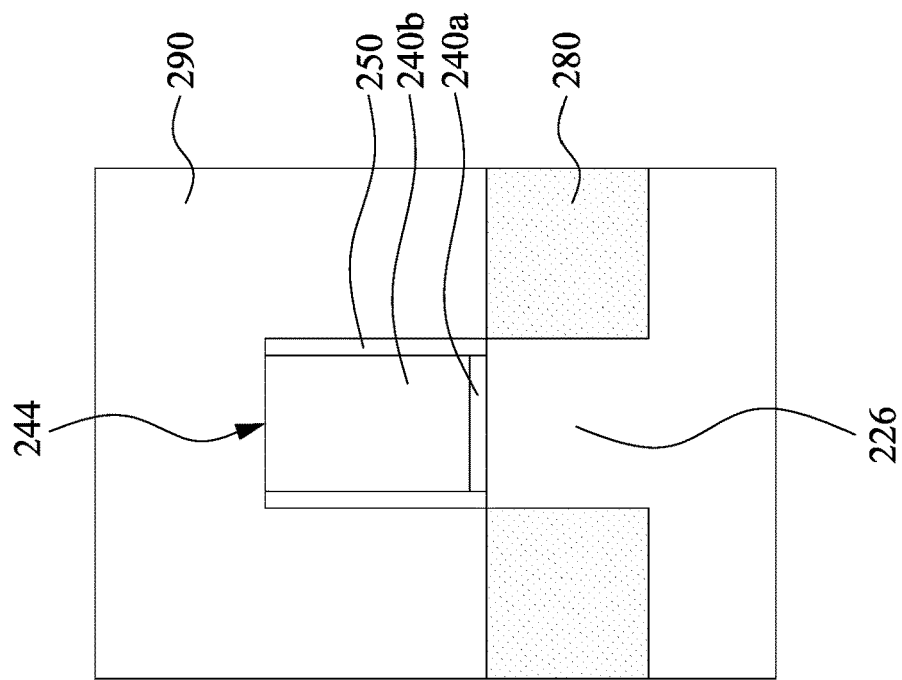
Figure 23C:
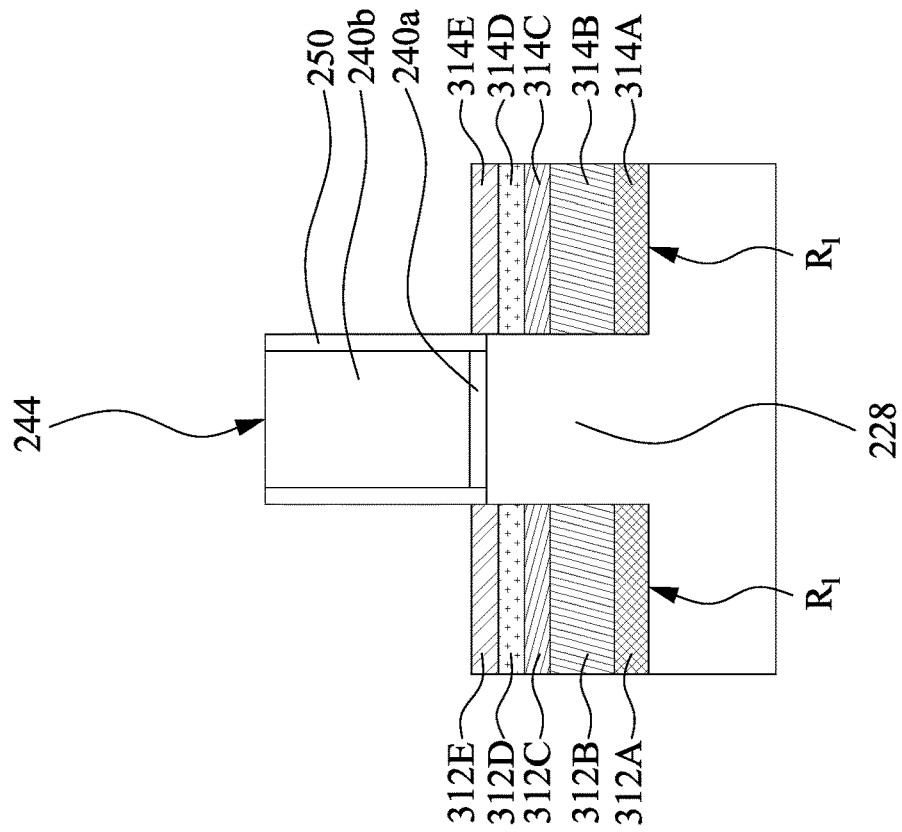
Figure 23E:
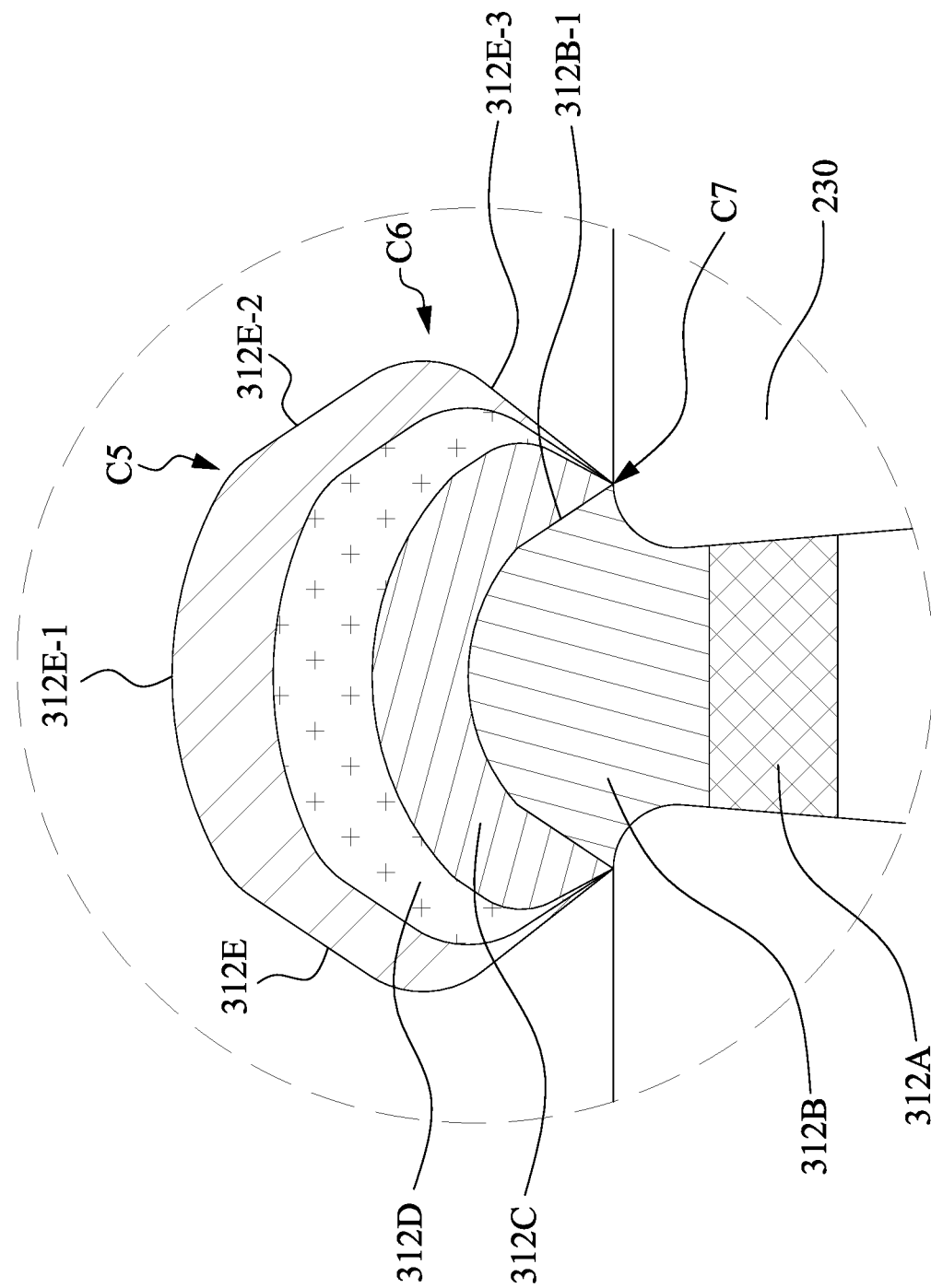
Figure 24A:
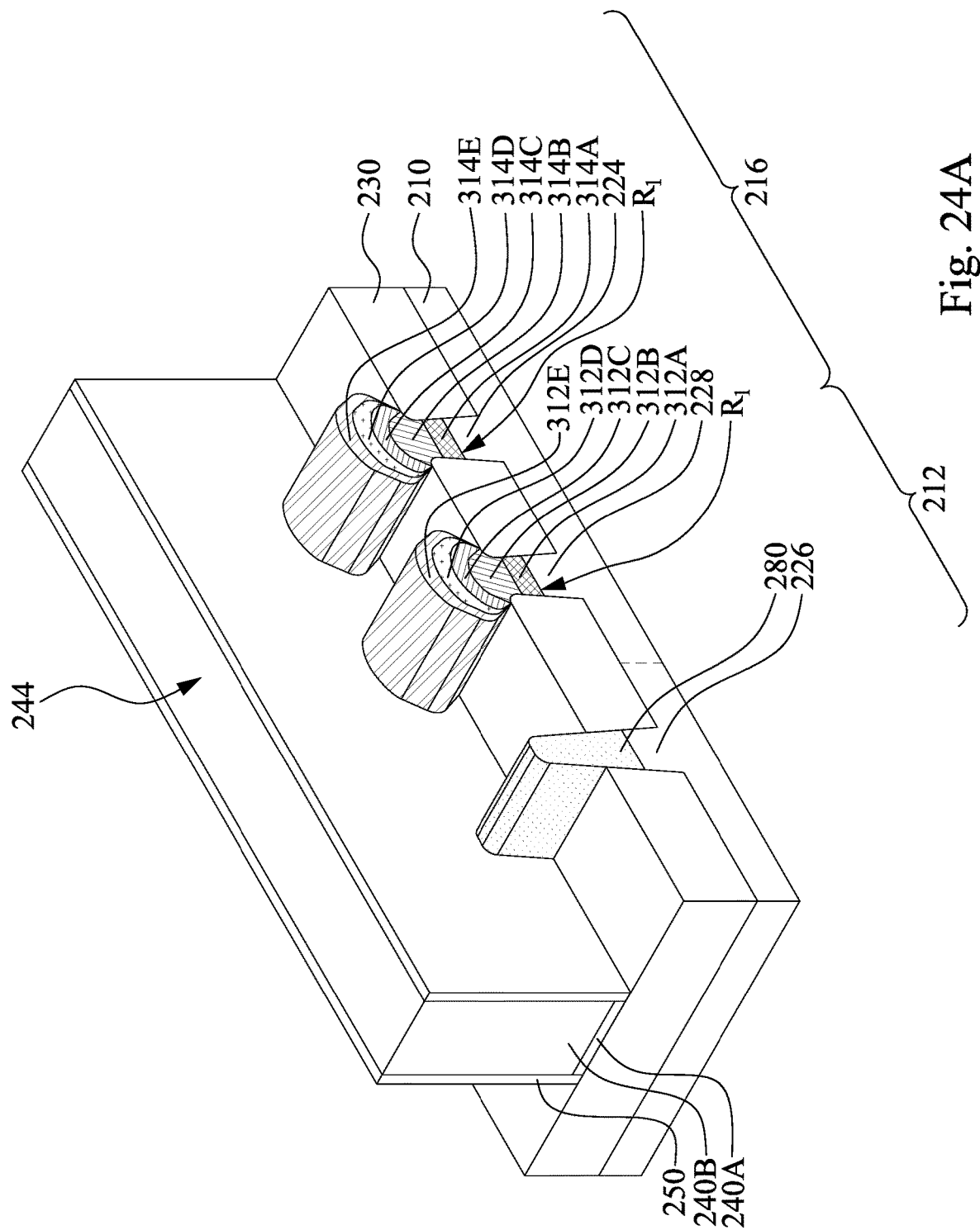
Figure 24B:
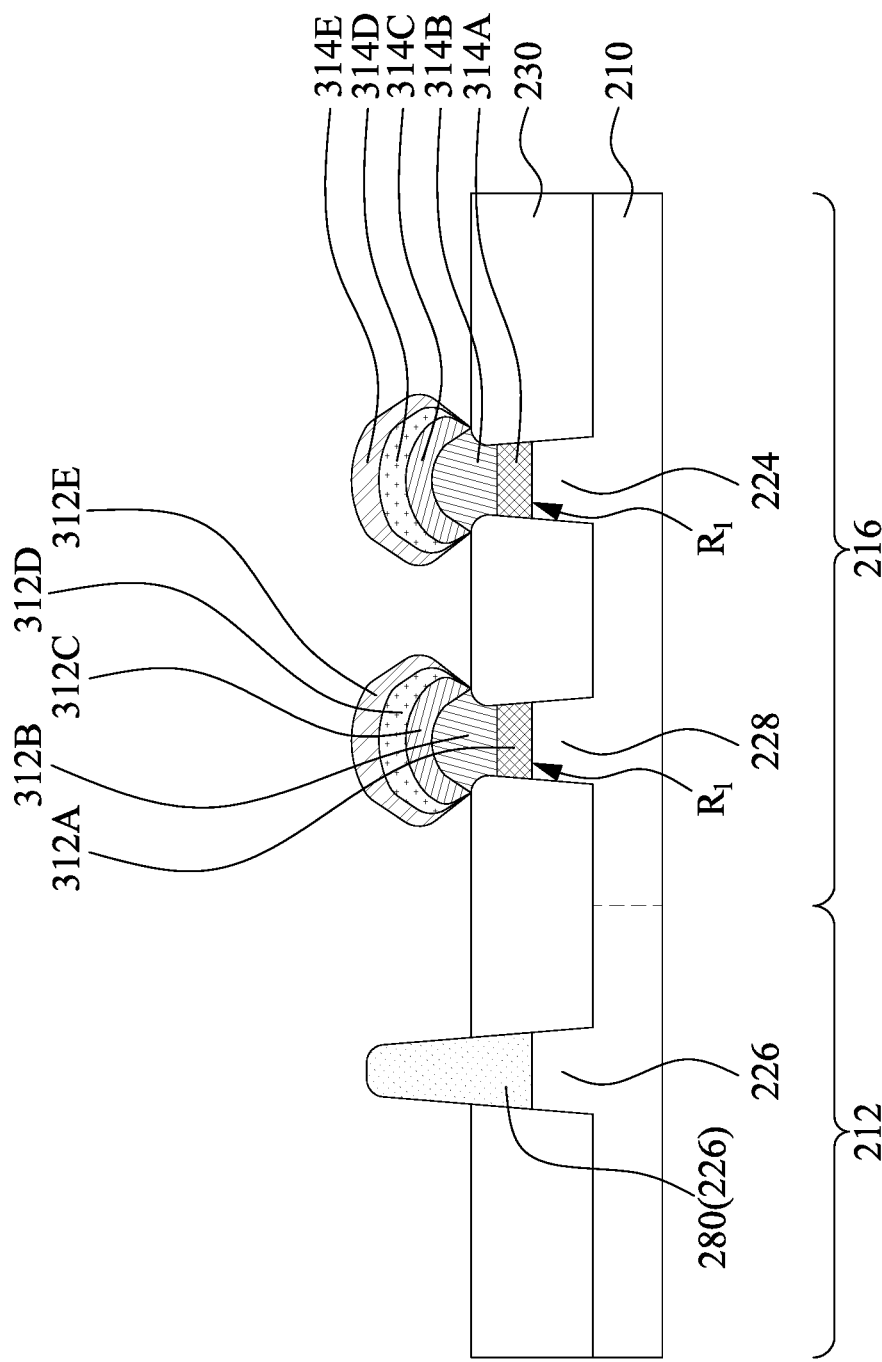
Figure 24D:
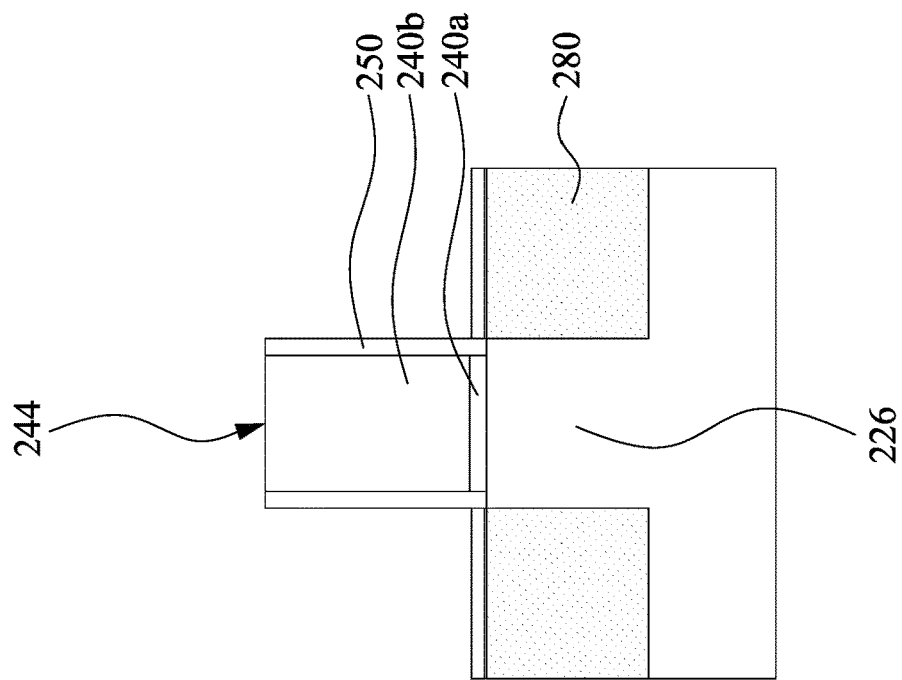
Figure 24C:
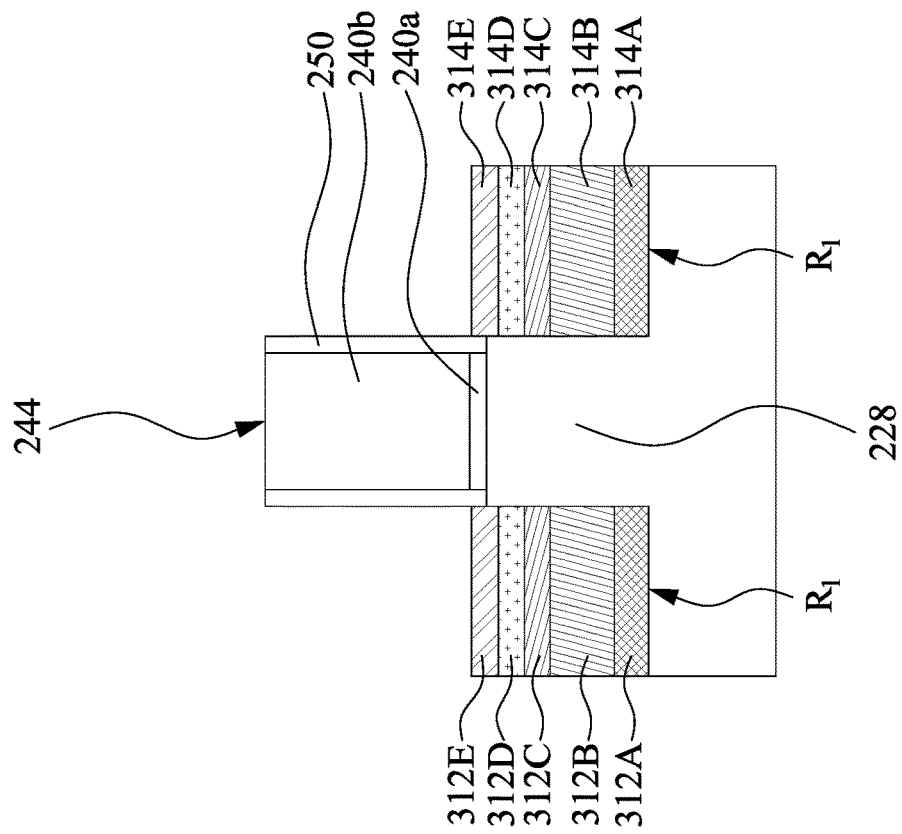
Figure 25A:
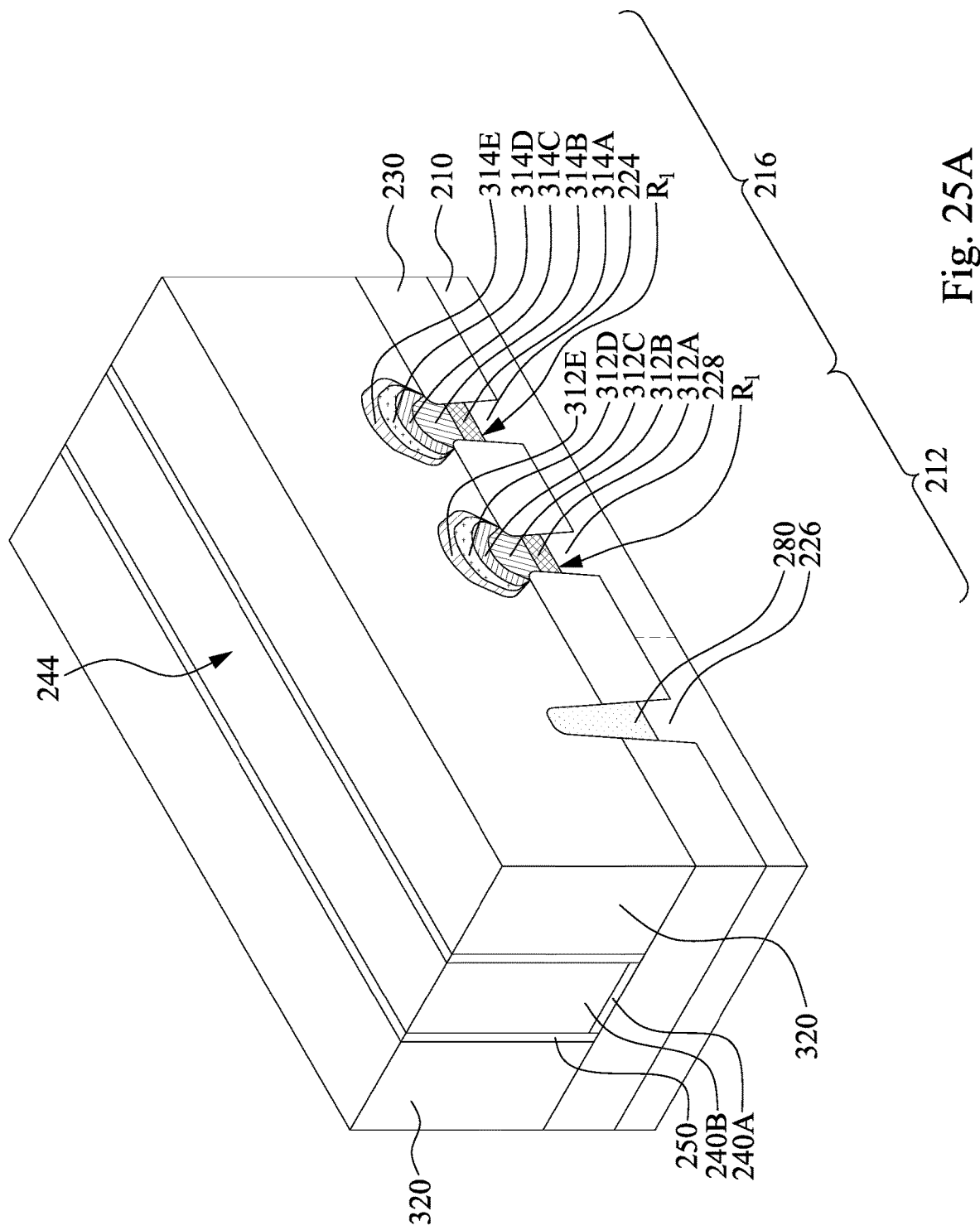
Figure 25B:
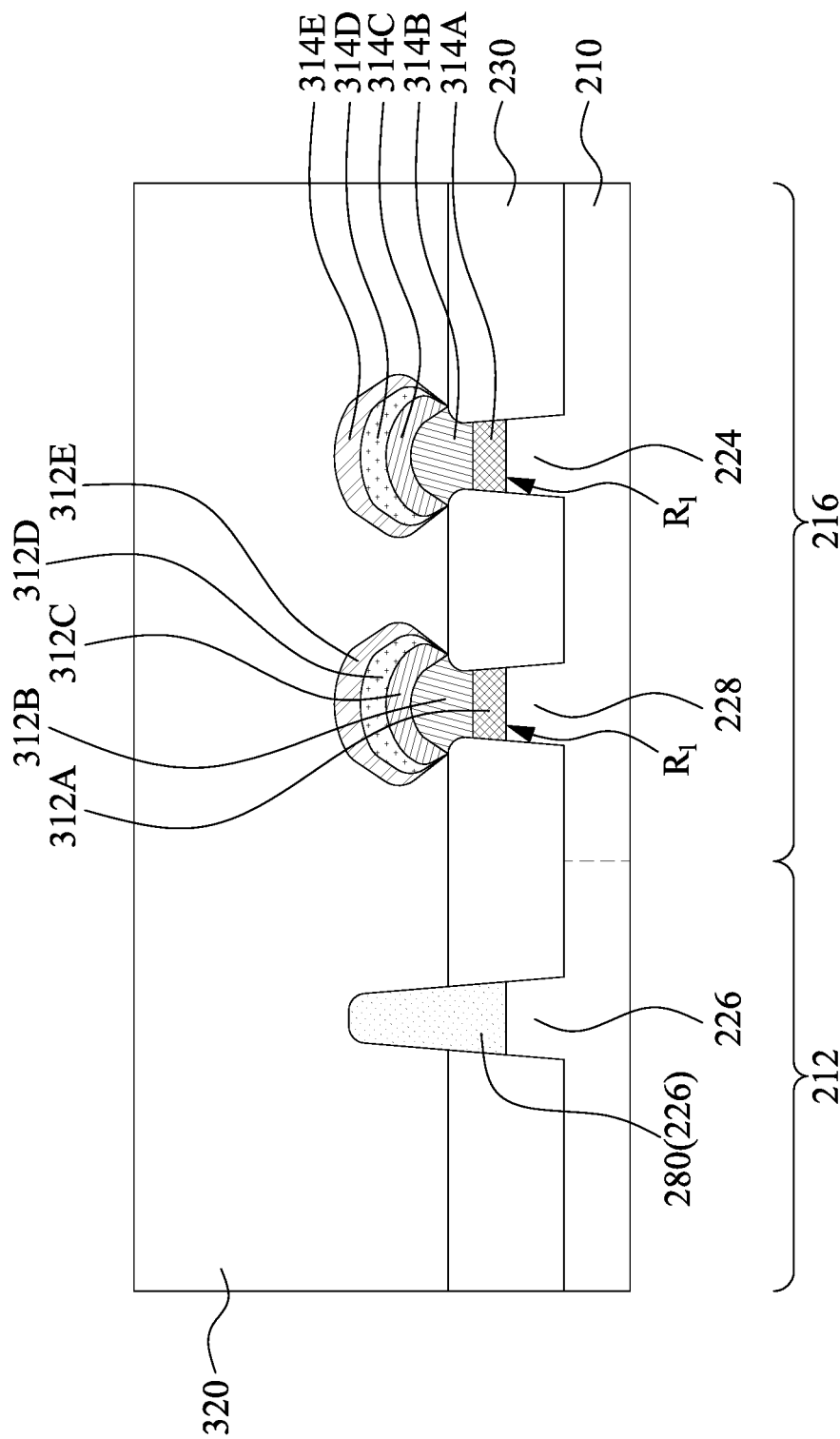
Figure 25D:
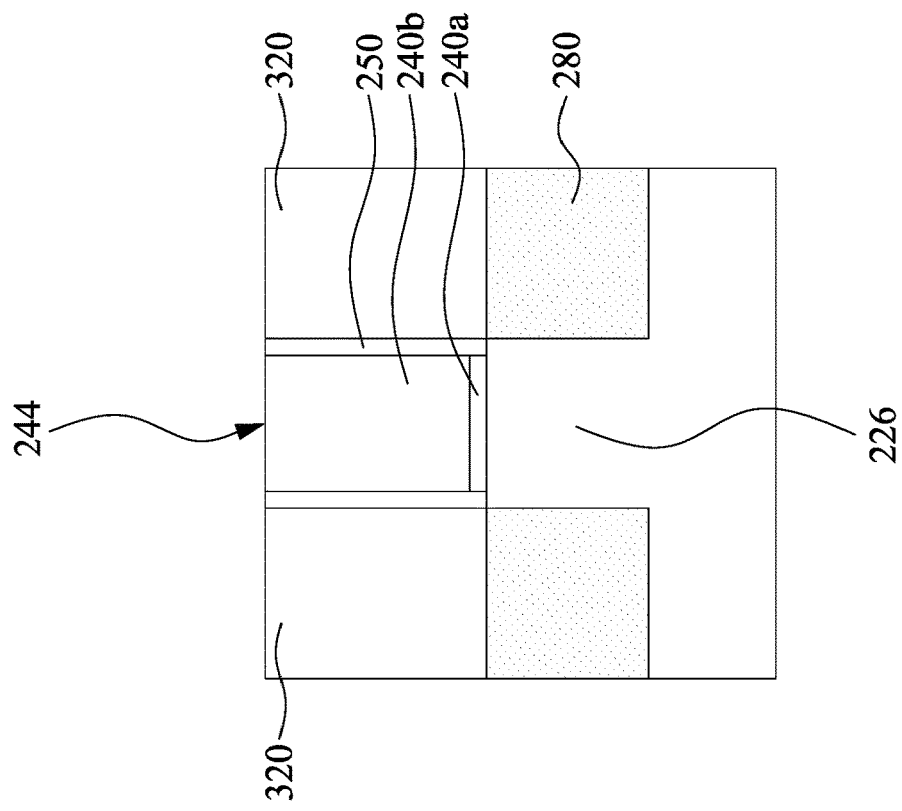
Figure 25C:
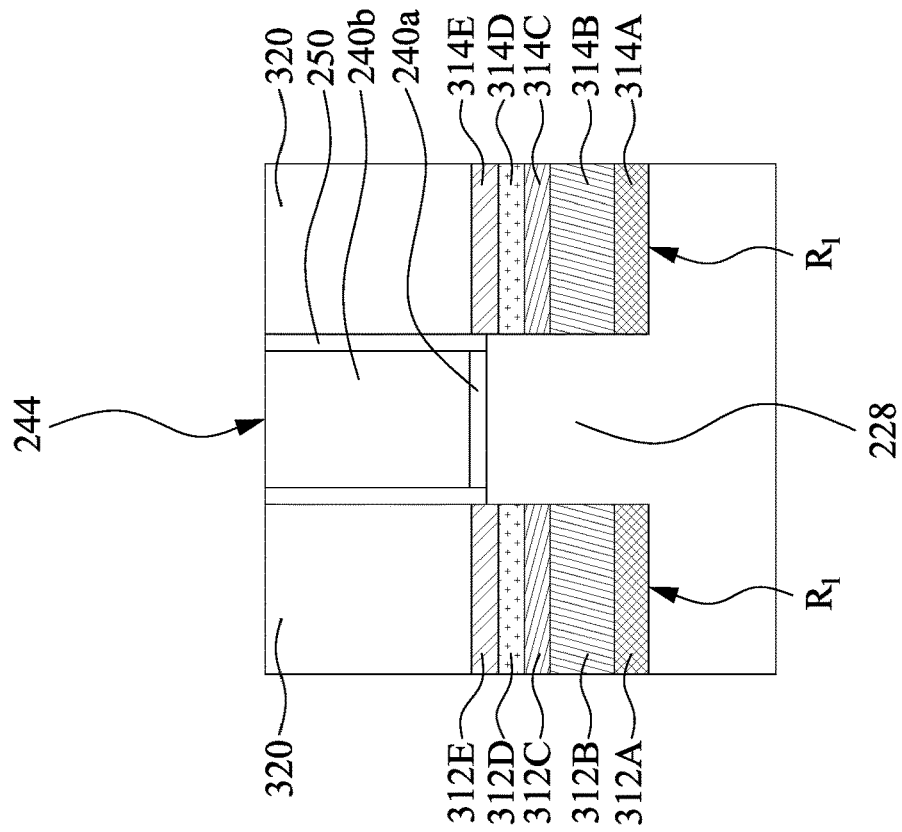
Figure 26A:
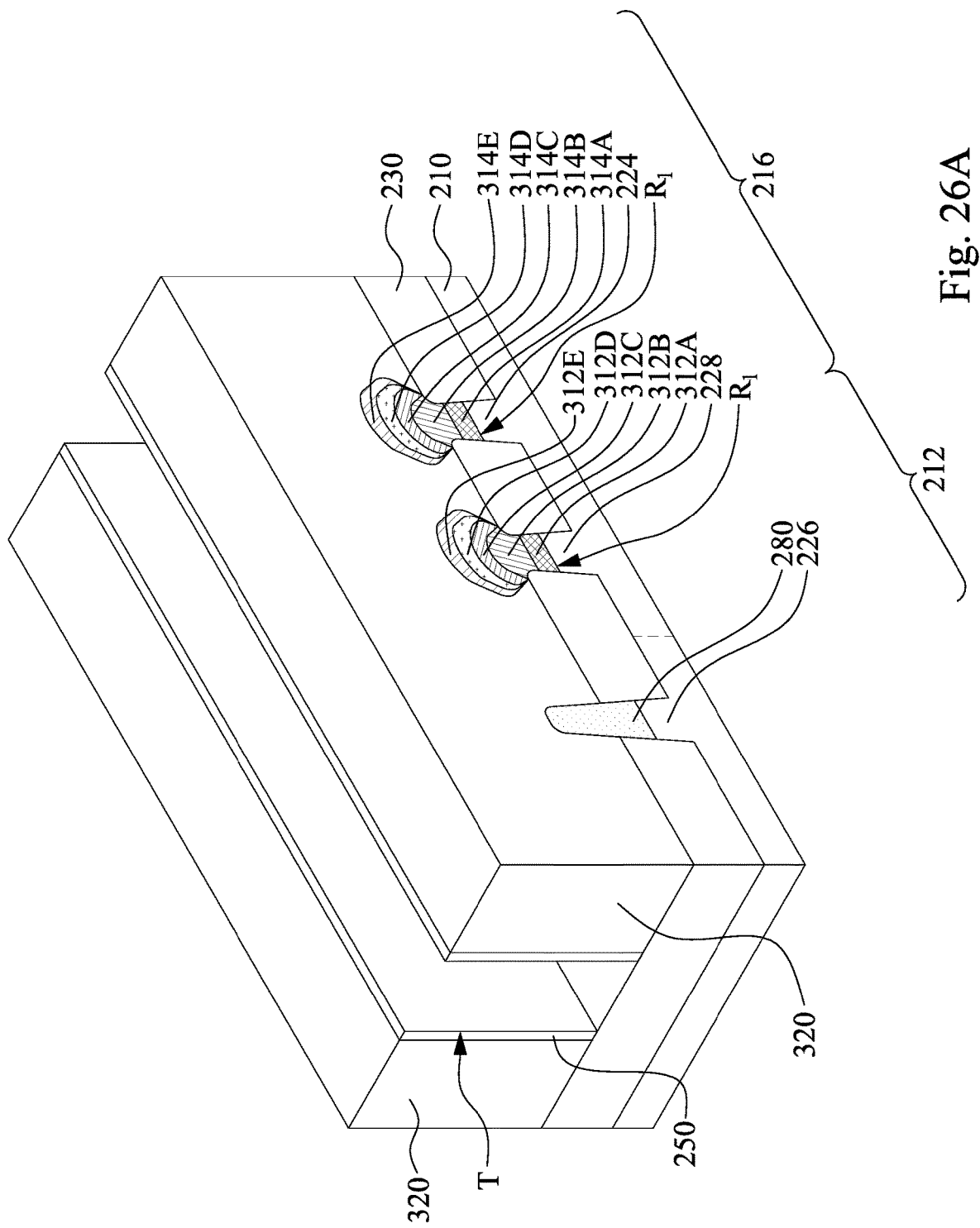
Figure 26B:
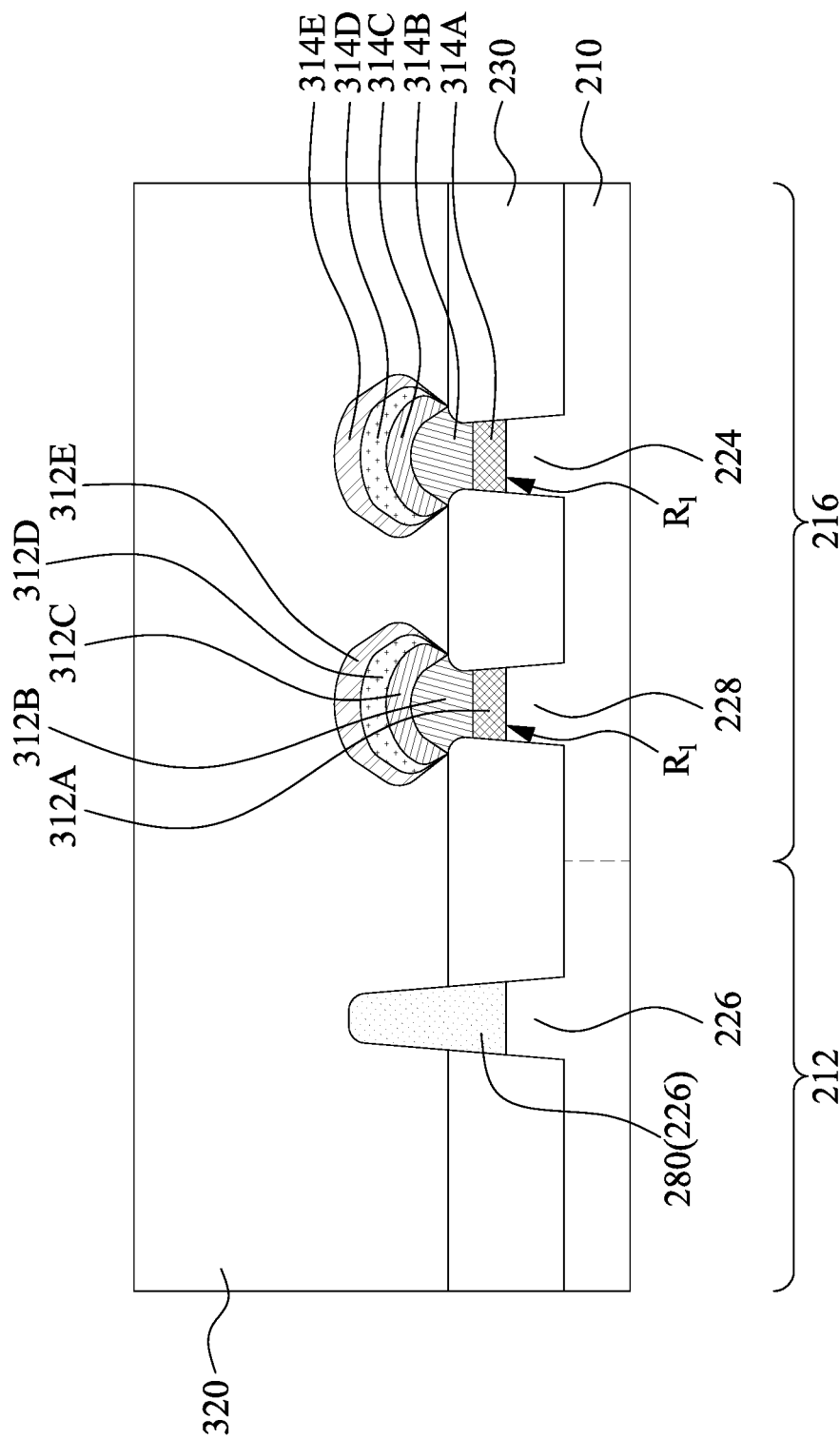
Figure 26D:
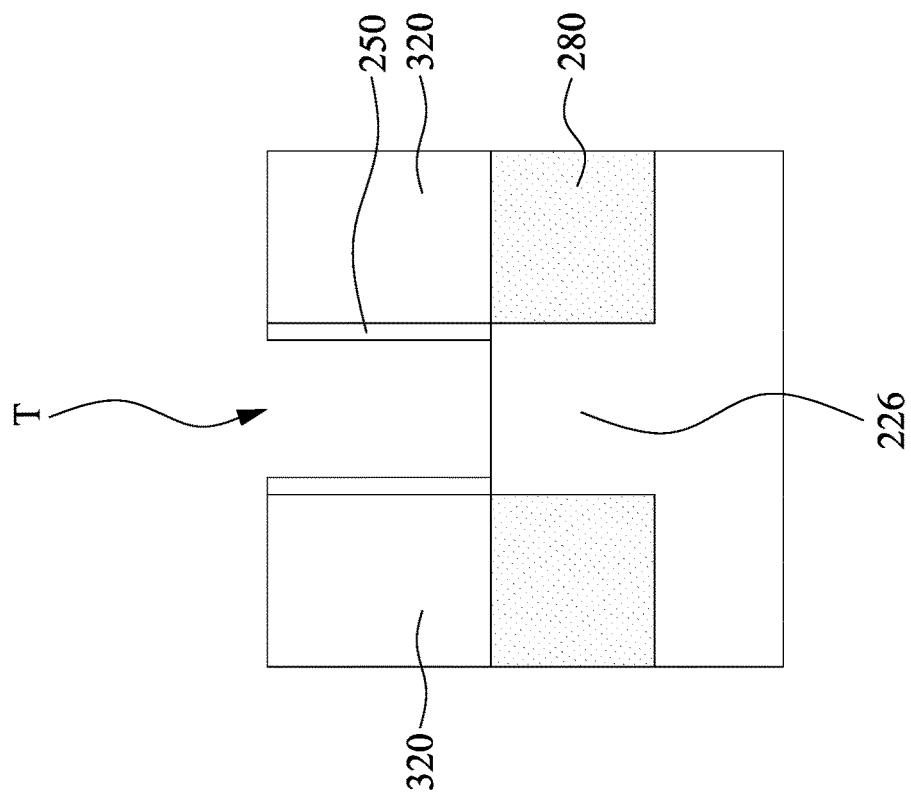
Figure 26C:
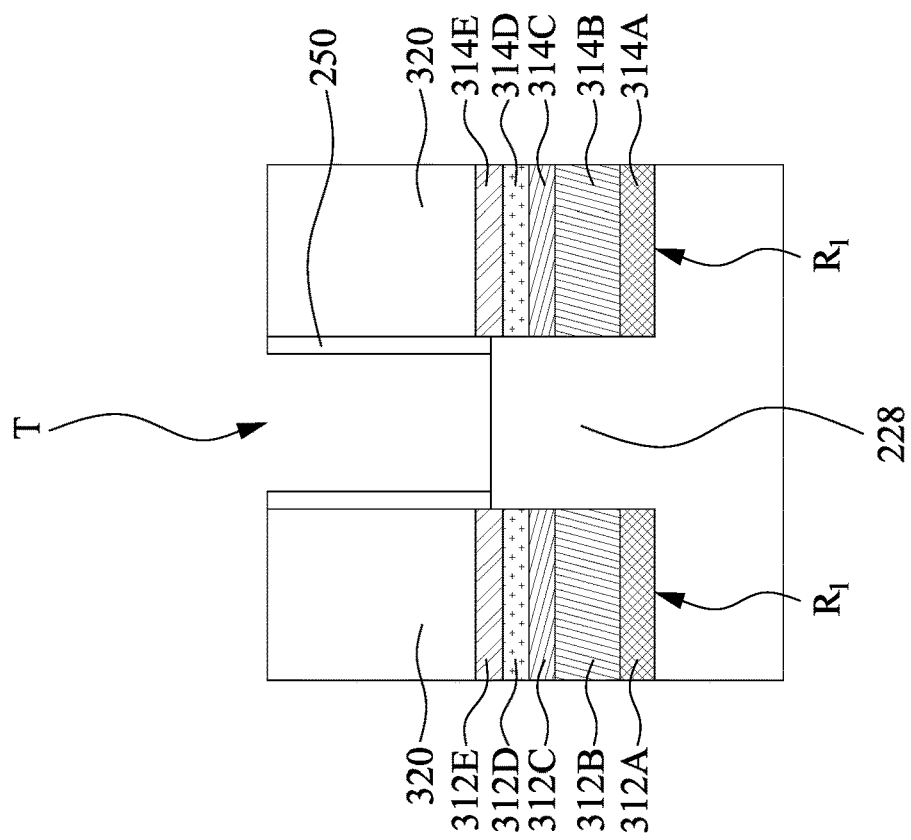
Figure 27A:
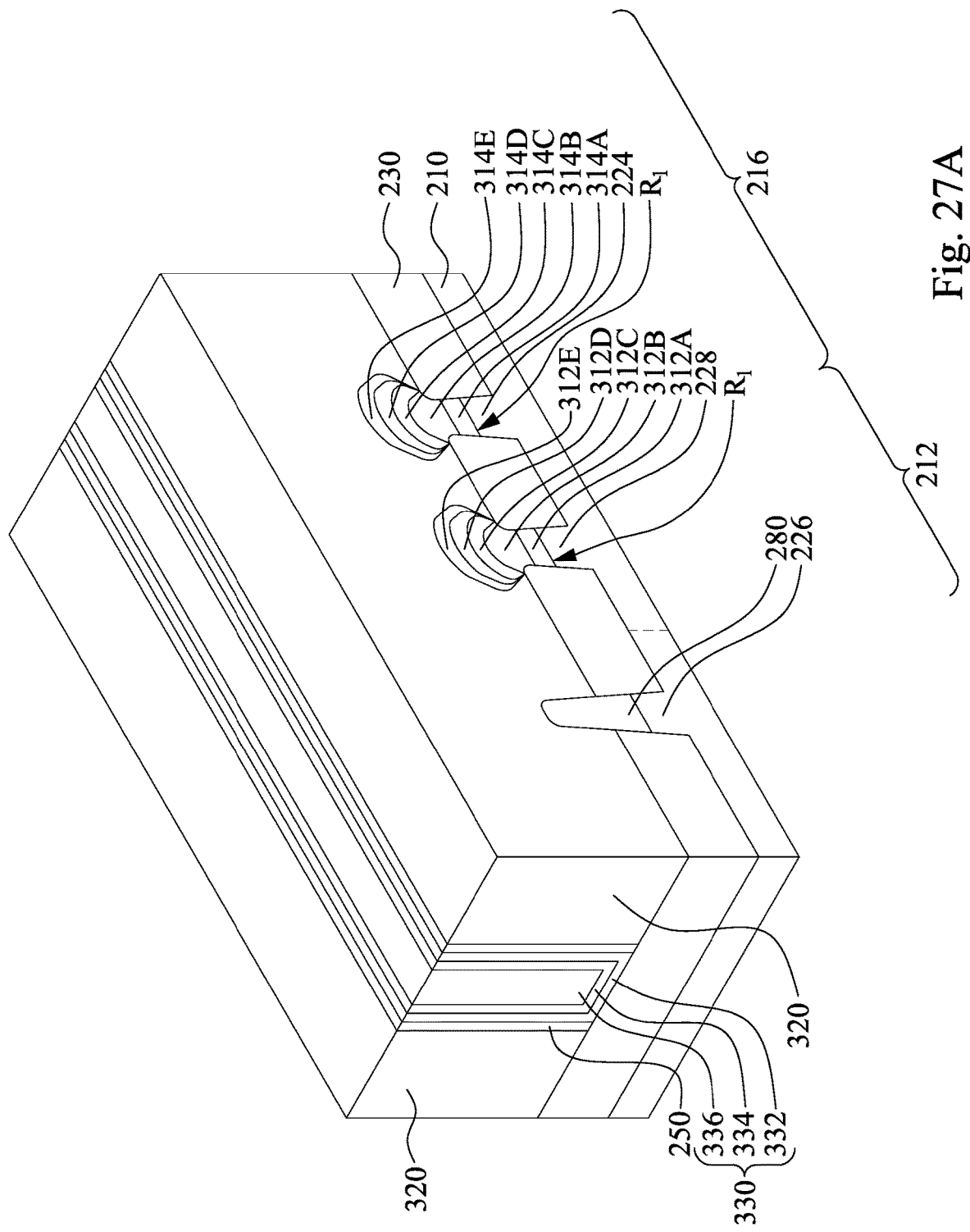
Figure 27B:
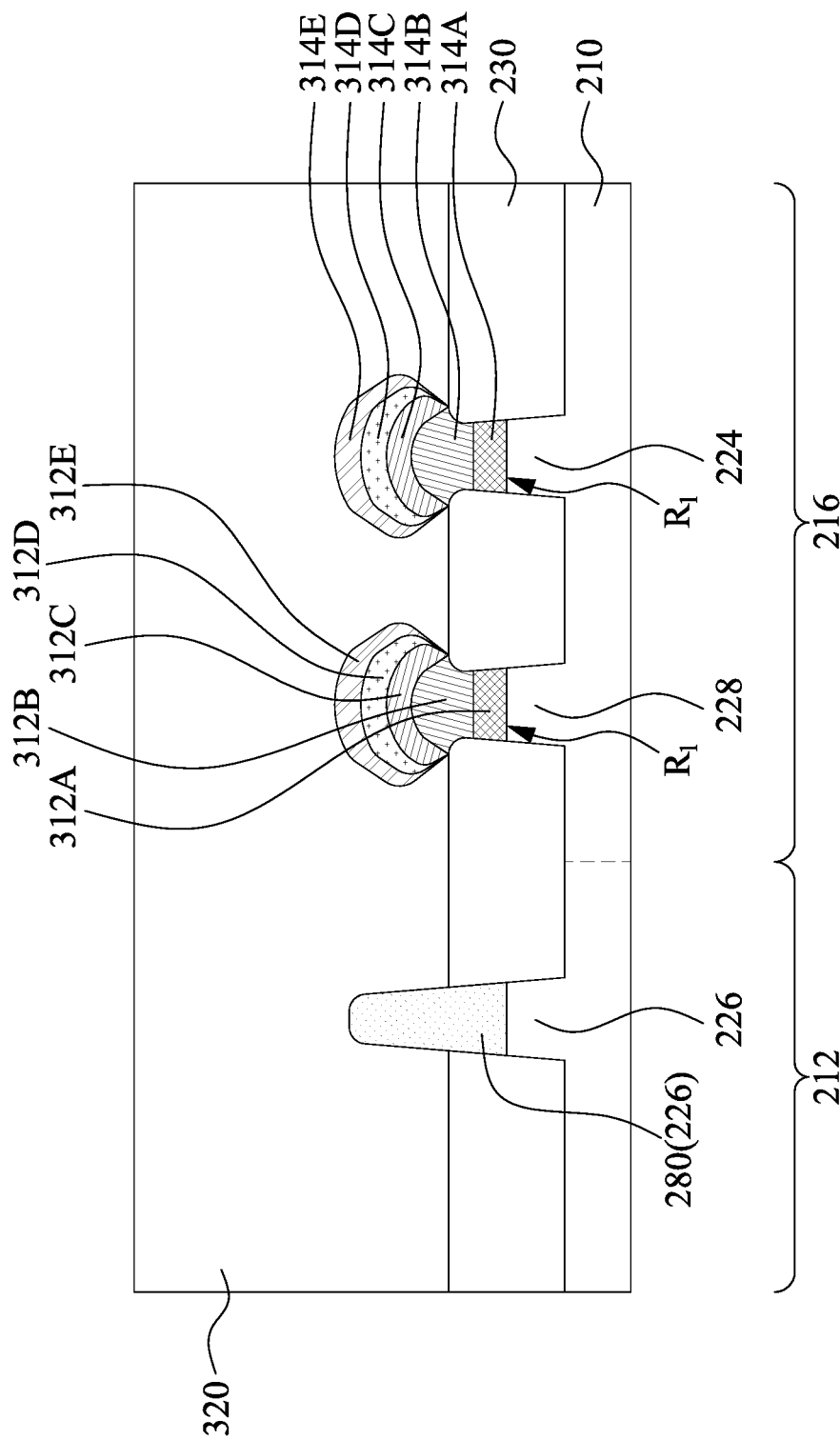
Figure 27D:
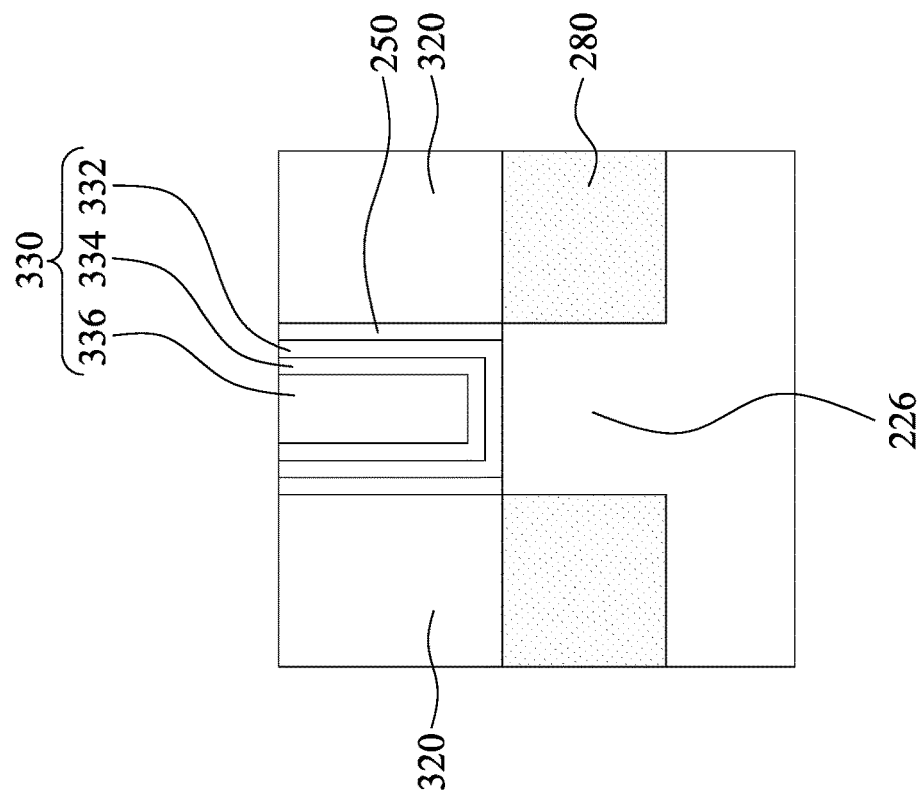
Figure 27C:
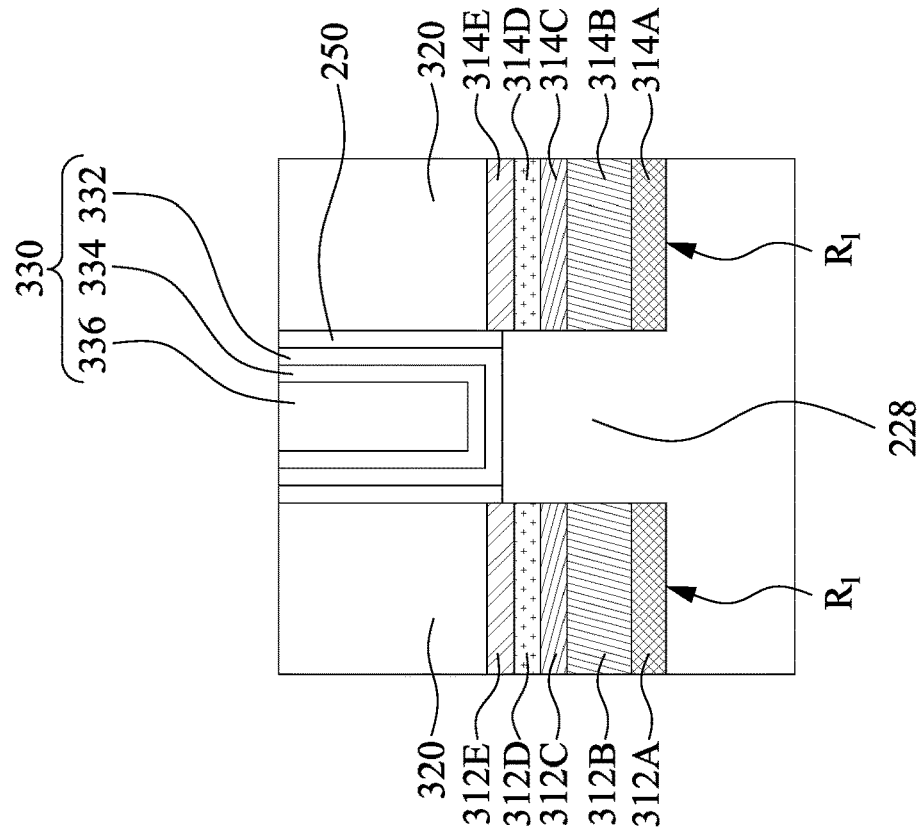

Referring to FIG. 22E, FIG. 22E is an enlarged view of the epitaxy layer 312E. In some embodiments, the crystalline growth of the epitaxy layer 312E results in a top surface 312E-1, a first facet 312E-2, and a second facet 312E-3. The top surface 312E-1 is connected to the first facet 312E-2 and forms a corner C5 therebetween, and the first facet 312E-2 is connected to the second facet 312E-3 and forms a corner C6 therebetween. The corner C5 has an angle θ5 and the corner C6 has an angle θ6. In some embodiments, the top surface 312E-1 has (001) crystalline orientation. On the other hand, the first facet 312E-2 and the second facet 312E-2 have (111) crystalline orientation. In some embodiments, the angle θ5 is in a range from about 120° to about 130°. In some embodiments, the angle θ6 is in a range from about 100° to about 120°. For example, the angle of corner C6 may be about 109.4°. In some embodiments, angle θ5 is greater than angle θ6. It is noted that the facets opposite to the first facets 312E-2 and the second facet 312E-3 have similar property, and thus relevant structural detail will not be repeated hereinafter. The first and second facets 312E-2 and 312E-3 can be collectively referred to as the sidewall of the epitaxy layer 312C. In some embodiments, the epitaxy layer 314E has substantially the same shape as the epitaxy layer 312E described in FIG. 22E, and thus relevant structural detail will not be repeated hereinafter.

Reference is made to FIGS. 23A, 23B, 23C, 23D, and 23E. An etching process is performed to remove portions of the epitaxy layers 312E and 314E. In some embodiments, the epitaxy layers 312E and 314E may be selectively etched to modify the corners of the epitaxy layers 312E and 314E to create rounded corners. For example, referring to FIG. 23E, in an enlarged view of the epitaxy layer 312E, the corners C5 and C6 are rounded, which in turn reduces the lateral width of the epitaxy layer 312E. In some embodiments, etching the epitaxy layers 312E and 314E tends to remove more material at the corners than on the flat portions due to the different ratios of surface area to volume between the corners and the flat portions. In some embodiments, the top surface 312E-1 of the epitaxy layer 312E is also rounded during the etching process. The etching process may, in some embodiments, be performed using an hydrochloric acid (HCl) solution at a pressure between about 10 torr and about 15 torr, and at a temperature between about 720° C. and about 750° C.

As described in FIGS. 18A to 23E, an etching process is performed after forming an epitaxy layer (e.g., epitaxy layers 312C to 312E in FIGS. 18E to 23E) to round the corners thereof, so as to reduce the lateral width thereof to prevent the epitaxy layer from touching adjacent epitaxy layer. In some embodiments, the epitaxy layer 312E has a rounded top surface 312E-1, in which the rounded top surface 312E-1 is vertically over a rounded top surface 312B-1 of the epitaxy layer 312B. In some embodiments, the epitaxy layers 312A and 312B do not undergo an etching process. Thus, in FIG. 23E, the interface between the epitaxy layers 312B and the isolation structure 230 and the surface of the epitaxy layers 312B exposed from the isolation structure 230 form a corner C7, while the corner C7 is shaper than the corners C5 and C6 of the epitaxy layers 312B (and/or corners C1 and C2 in FIG. 19E and corners C3 and C4 in FIG. 21E).

After the epitaxy layers 312E and 314E are etched. The epitaxy layers 312A to 312E can be collectively referred to as an epitaxy structure, and the epitaxy layers 314A to 314E can be collectively referred to as an epitaxy structure, respectively. In some embodiments, the epitaxy structures may act as source/drain structures in the device. According to the processes described in FIGS. 18A to 23E, the crystals of the epitaxy layers 312C to 312E (and/or the epitaxy layers 314C to 314E) tend to grow with a constant aspect ratio, with the ratio of the height to the width remaining constant. Thus, as the epitaxy layers 312C to 312E (and/or the epitaxy layers 314C to 314E) grow, the widths thereof will widen as they grow. As mentioned before, the semiconductor fins 224 and 228 are formed in a dense region of an SRAM device, which makes an epitaxy structure prone to touch an adjacent epitaxy structure. Also, since the semiconductor fins 224 and 228 undergo a top corner rounding process that results in enlarging top surfaces of the semiconductor fins 224 and 228, and the enlarged top surfaces of the semiconductor fins 224 and 228 will make the epitaxy layers tend to grow wider. Accordingly, growing the epitaxy layers in stages, with the side corners thereof rounded by etching at each stage, prevents adjacent epitaxy layers (e.g., the epitaxy layers respectively on the semiconductor fins 228 and 224) from contacting or even merging with each other.

Reference is made to FIGS. 24A, 24B, 24C and 24D. The patterned mask 290 is removed from the substrate 210 to expose the p-well region 212. In greater detail, after the patterned mask 290 is removed, the doped region 280 of the semiconductor fin 226 is exposed. In some embodiments where the patterned mask 290 is photoresist, the patterned mask 290 may be removed by ashing or striping.

Reference is made to FIGS. 25A, 25B, 25C and 25D. A dielectric layer 320 is formed over the substrate 210. The dielectric layer 320 may be in contact with the source/drain structure of the device, such as the doped region 280, the epitaxy layers 312E and 314E. Afterwards, a CMP process may be optionally performed to remove excessive materials of the dielectric layer 320 to expose the gate stack 244. The CMP process may planarize a top surface of the dielectric layer 320 with top surfaces of the gate stack 244 and gate spacers 250 in some embodiments. In some embodiments, the dielectric layer 320 may include a contact etch stop layer (CESL) and an interlayer dielectric (ILD) layer over the CESL. The CESL may be a dielectric layer including silicon nitride, silicon oxynitride or other suitable materials. In some embodiments, the ILD layer may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The dielectric layer 320 may be formed using, for example, CVD, ALD, spin-on-glass (SOG) or other suitable techniques.

Reference is made to FIGS. 26A, 26B, 26C and 26D. The gate stack 244 is removed, such that a gate trench T is formed between a pair of the gate spacers 250. In some embodiments, the gate stack 244 may be removed by suitable process, such as dry etch, wet etch, or combination thereof.

Reference is made to FIGS. 27A, 27B, 27C and 27D. A gate stack 330 is formed in the gate trench T. That is, in some embodiments using a gate-last process, the gate stack 244 is replaced by the final gate stack 330 at a subsequent step. In some embodiments, the gate stack 244 may be replaced at a later step by a high-k dielectric layer and a metal gate electrode. A plurality of layers included in the gate stacks 330 may be sequentially deposited in the gate trench T. Then, a CMP process is performed to remove excessive materials to form the gate stack 330.

In some embodiments, the gate stack 330 includes a gate dielectric layer 332, a work function metal layer 334, and a gate electrode 336, which can be formed by suitable process.

The gate dielectric layer 332 may include other high-K dielectrics, such as $TiO_2$, $HfZrO$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material.

The work function metal layer 334 may be an n-type or p-type work function layers. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. In some embodiments, the gate electrode 336 may include tungsten (W). In some other embodiments, the gate electrode includes aluminum (Al), copper (Cu) or other suitable conductive material.

According to the aforementioned embodiments, it can be seen that the present disclosure offers advantages in fabricating semiconductor devices. It is understood, however, that other embodiments may offer additional advantages, and not all advantages are necessarily disclosed herein, and that no particular advantage is required for all embodiments. One advantage is that an etching process is performed to round top surfaces of semiconductor fins, so as to boost device performance. Moreover, since the epitaxy layers on the semiconductor fins, which are formed in a dense region of an SRAM device, undergo etching processes to round the corners thereof, the lateral widths of the epitaxy layers may be reduced, which prevents adjacent epitaxy layers from bridging. Therefore, the yield may be improved.

In some embodiments of the present disclosure, a device includes a substrate, a pull-down transistor over the substrate, a pass-gate transistor over the substrate, and a pull-up transistor over the substrate. The pull-up transistor includes a first gate structure and first source/drain epitaxy structures on opposite sides of the first gate structure, in which each of the first source/drain epitaxy structures comprises a first epitaxy layer and a second epitaxy layer over the first epitaxy layer, wherein a germanium concentration of the first epitaxy layer is higher than a germanium concentration of the second epitaxy layer.

In some embodiments of the present disclosure, a device includes a substrate, a pull-down transistor, a pass-gate transistor, a pull-up transistor, and a dielectric layer. The pull-down transistor is over the substrate and includes a first gate structure crossing the first semiconductor fin and first source/drain regions in the first semiconductor fin and on opposite sides of the first gate structure. The pass-gate transistor is over the substrate. The pull-up transistor is over the substrate and includes a second gate structure crossing the second semiconductor fin, in which in a top view, the first gate structure is connected to the first gate structure, and second source/drain epitaxy structures over the second semiconductor fin and on opposite sides of the second gate structure, wherein each of the second source/drain epitaxy structures comprises a rounded surface. The dielectric layer is over the substrate, in which in a cross-sectional view, the dielectric layer is in contact with a top surface of the first semiconductor fin and a top surface of one of the second source/drain epitaxy structures.

In some embodiments of the present disclosure, a method includes forming a pull-down transistor, a pass-gate transistor, and a pull-up transistor over a substrate, wherein forming the pull-up transistor includes forming a first gate structure over a first semiconductor fin over the substrate; etching the first semiconductor fin to form a recess; forming a first epitaxy layer in the recess; forming a second epitaxy layer over the first epitaxy layer; and etching the second epitaxy layer to round a corner of the second epitaxy layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a substrate;
   a pull-down transistor over the substrate;
   a pass-gate transistor over the substrate; and
   a pull-up transistor over the substrate, comprising:
      a first gate structure; and
      first source/drain epitaxy structures on opposite sides of the first gate structure, wherein each of the first source/drain epitaxy structures comprises a first epitaxy layer and a second epitaxy layer over the first epitaxy layer, wherein a germanium concentration of the first epitaxy layer is higher than a germanium concentration of the second epitaxy layer.

2. The device of claim 1, further comprising a third epitaxy layer over the first epitaxy layer, wherein the germanium concentration of the first epitaxy layer is higher than a germanium concentration of the third epitaxy layer.

3. The device of claim 2, wherein the third epitaxy layer and the second epitaxy layer both include a rounded top surface.

4. The device of claim 2, wherein the first epitaxy layer is made of silicon germanium and the third epitaxy layer is made of silicon.

5. The device of claim 1, wherein the each of the first source/drain epitaxy structures comprises a sidewall having (111) crystalline orientation.

6. The device of claim 1, wherein the substrate comprises a semiconductor fin, and wherein the pull-down transistor comprises a second gate structure over the semiconductor fin, and source/drain doped regions in the semiconductor fin and on opposite sides of the second gate structure.

7. The device of claim 6, further comprises a dielectric layer in contact with the first source/drain epitaxy structures and the source/drain doped regions in the semiconductor fin.

8. The device of claim 6, wherein the second gate structure of the pull-down transistor and the first gate structure of the pull-up transistor are connected to each other.

9. A device, comprising:
   a substrate having a first semiconductor fin and a second semiconductor fin;
   a pull-down transistor over the substrate, comprising:
      a first gate structure crossing the first semiconductor fin; and
      first source/drain regions in the first semiconductor fin and on opposite sides of the first gate structure;
   a pass-gate transistor over the substrate;
   a pull-up transistor over the substrate, comprising:
      a second gate structure crossing the second semiconductor fin, wherein in a top view, the first gate structure is connected to the second gate structure; and
      second source/drain epitaxy structures over the second semiconductor fin and on opposite sides of the second gate structure, wherein each of the second source/drain epitaxy structures comprises a rounded surface; and
   a dielectric layer over the substrate, wherein in a cross-sectional view, the dielectric layer is in contact with a top surface of the first semiconductor fin and a top surface of one of the second source/drain epitaxy structures.

10. The device of claim 9, wherein each of the second source/drain epitaxy structures comprises:
    a first epitaxy layer;
    a second epitaxy layer over the first epitaxy layer; and
    a third epitaxy layer over the second epitaxy layer, wherein the first epitaxy layer has a higher germanium (Ge) concentration than the second and third epitaxy layers.

11. The device of claim 10, wherein the second epitaxy layer and the third epitaxy layer both includes a rounded top surface.

12. The device of claim 9, wherein the dielectric layer is separated from a top surface of the second semiconductor fin at least in part by the second source/drain epitaxy structures.

13. The device of claim 9, wherein the second gate structure of the pull-down transistor and the first gate structure of the pull-up transistor are connected to each other.

14. The device of claim 9, wherein the first source/drain regions have n-type impurities, and the second source/drain epitaxy structures have p-type impurities.

15. The device of claim 9, wherein the first semiconductor fin and the second semiconductor fin both include a rounded top surface.

16. A method, comprising:
    forming a pull-down transistor, a pass-gate transistor, and a pull-up transistor over a substrate, wherein forming the pull-up transistor comprises:
       forming a first gate structure over a first semiconductor fin over the substrate;
       etching the first semiconductor fin to form a recess;
       forming a first epitaxy layer in the recess;
       forming a second epitaxy layer over the first epitaxy layer; and
       etching the second epitaxy layer to round a corner of the second epitaxy layer.

17. The method of claim 16, wherein no etching is performed to the first epitaxy layer.

18. The method of claim 16, wherein the second epitaxy layer is formed having a top surface with (001) crystalline orientation and a sidewall with (111) crystalline orientation, and the corner is formed by the top surface and the sidewall.

19. The method of claim 16, wherein a germanium (Ge) concentration of the first epitaxy layer is higher than a germanium (Ge) concentration of the second epitaxy layer.

20. The method of claim 16, further comprising:
    forming a third epitaxy layer over the second epitaxy layer, wherein a germanium (Ge) concentration of the first epitaxy layer is higher than a germanium (Ge) concentration of the third epitaxy layer; and etching the third epitaxy layer to round a corner of the third epitaxy layer.

* * * * *